United States Patent
Woo et al.

(10) Patent No.: US 11,935,879 B2
(45) Date of Patent: Mar. 19, 2024

(54) INTEGRATED PASSIVE DEVICE (IPD) COMPONENTS AND A PACKAGE AND PROCESSES IMPLEMENTING THE SAME

(71) Applicant: CREE, INC, Durham, NC (US)

(72) Inventors: Eng Wah Woo, Perak (MY); Samantha Cheang, Perak Darul Ridzuan (MY); Kok Meng Kam, Perak (MY); Marvin Mabell, Cary, NC (US); Haedong Jang, San Jose, CA (US); Alexander Komposch, Morgan Hill, CA (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 17/342,925

(22) Filed: Jun. 9, 2021

(65) Prior Publication Data
US 2022/0399318 A1 Dec. 15, 2022

(51) Int. Cl.
*H01L 25/16* (2023.01)
*H01L 21/48* (2006.01)
*H01L 23/00* (2006.01)
*H01L 23/047* (2006.01)
*H01L 23/66* (2006.01)

(52) U.S. Cl.
CPC ........ *H01L 25/165* (2013.01); *H01L 21/4817* (2013.01); *H01L 23/047* (2013.01); *H01L 23/66* (2013.01); *H01L 24/32* (2013.01); *H01L 24/48* (2013.01); *H01L 24/73* (2013.01); *H01L 2223/6672* (2013.01); *H01L 2224/32245* (2013.01); *H01L 2224/48137* (2013.01); *H01L 2224/48175* (2013.01); *H01L 2224/73265* (2013.01); *H01L 2924/1033* (2013.01); *H01L 2924/1205* (2013.01); *H01L 2924/1207* (2013.01); *H01L 2924/13064* (2013.01);
(Continued)

(58) Field of Classification Search
CPC ... H01L 23/66; H01L 23/047; H01L 21/4817; H01L 24/32; H01L 24/73; H01L 25/165; H01L 2223/6672; H01L 2224/32245; H01L 2224/48137; H01L 2224/48175; H01L 2224/73265; H01L 2924/1033; H01L 2924/1205; H01L 2924/13064; H01L 2924/13091
USPC ........................................................ 257/695
See application file for complete search history.

(56) References Cited

U.S. PATENT DOCUMENTS 11,257,740 B2 * 2/2022 Komposch ............. H01L 25/16
2012/0104427 A1 5/2012 Chan et al.
(Continued)

FOREIGN PATENT DOCUMENTS

WO WO 2021/167822 A1 8/2021

OTHER PUBLICATIONS

International Search Report for PCT/US2021/017393 as prepared by the ISA/US; dated Apr. 23, 2021; 7 pages.
(Continued)

*Primary Examiner* — Jasmine J Clark
(74) *Attorney, Agent, or Firm* — BakerHostetler

(57) ABSTRACT

A transistor package that includes a metal submount; a transistor die mounted on said metal submount; a surface mount IPD component that includes a dielectric substrate; and the dielectric substrate mounted on said metal submount. Additionally, the dielectric substrate includes one of the following: an irregular shape, a non-square shape, and a nonrectangular shape.

56 Claims, 38 Drawing Sheets

(52) U.S. Cl.
CPC .............. *H01L 2924/13091* (2013.01); *H01L 2924/1421* (2013.01)

(56) References Cited

U.S. PATENT DOCUMENTS

| | | |
|---|---|---|
| 2013/0284507 A1 | 10/2013 | Hattori et al. |
| 2013/0341656 A1 | 12/2013 | Chan et al. |
| 2014/0332941 A1 | 11/2014 | Viswanathan et al. |
| 2015/0249021 A1 | 9/2015 | Sanchez et al. |
| 2017/0117239 A1 | 4/2017 | Lembeye et al. |
| 2017/0271258 A1 | 9/2017 | Wood et al. |
| 2017/0287820 A1 | 10/2017 | Ahlers et al. |
| 2017/0373645 A1 | 12/2017 | Jang et al. |
| 2018/0096922 A1* | 4/2018 | Chen ................. H01L 23/49541 |
| 2018/0114741 A1* | 4/2018 | Gagné ..................... H01L 23/66 |
| 2018/0175802 A1 | 6/2018 | Wu et al. |
| 2019/0326233 A1* | 10/2019 | Uscola .................... H01L 24/49 |
| 2020/0204119 A1 | 6/2020 | Roberts et al. |
| 2021/0265250 A1 | 8/2021 | Marbell et al. |

OTHER PUBLICATIONS

International Patent Application No. PCT/US2022/031541; Int'l Search Report and the Written Opinion; dated Aug. 19, 2022; 13 pages.

\* cited by examiner

INTEGRATED PASSIVE DEVICE (IPD)
COMPONENTS AND A PACKAGE AND
PROCESSES IMPLEMENTING THE SAME

FIELD OF THE DISCLOSURE

The disclosure relates to integrated passive device (IPD) components. The disclosure further relates to a package implementing integrated passive device (IPD) components. The disclosure further relates to a radio frequency (RF) package implementing a radio frequency (RF) device with integrated passive device (IPD) components. The disclosure further relates to a radio frequency (RF) power amplifier transistor package implementing an RF device with integrated passive device (IPD) components. The disclosure further relates to a process of making integrated passive device (IPD) components. The disclosure further relates to a process of making a package implementing integrated passive device (IPD) components. The disclosure further relates to a process of making an RF package implementing an RF device with integrated passive device (IPD) components. The disclosure further relates to a process of making a Radio frequency (RF) power amplifier transistor package implementing integrated passive device (IPD) components.

BACKGROUND OF THE DISCLOSURE

Transistor packages, such as radio frequency (RF) power amplifier transistor packages, implement a plurality of package components including integrated passive device (IPD) components. Typically, the plurality of package components are mounted on substrates, which are arranged and/or mounted within the transistor package.

The transistor package has a limited amount of usable area for arrangement of the substrates holding the plurality of components. Moreover, the transistor package may include various structural features further reducing the usable area for arrangement of the substrates holding the plurality of package components. Additionally, the substrates are typically implemented with a square shape or rectangular shape, which are sized to mount the plurality of package components. This limited amount of usable area together with the structural features and square or rectangular shape substrates inefficiently consumes the usable area within the package limiting the ability to include additional package components, substrates, and/or the like. The inability to include such additional package components and/or substrates in the transistor package prevents implementation of the additional package components, substrates, and/or the like that can be utilized to increase performance, efficiency, functionality, and/or the like of the package.

Accordingly, what is needed is integrated passive device (IPD) components configured to more efficiently utilize usable area of a transistor package, a transistor package that implements integrated passive device (IPD) components configured to more efficiently utilize usable area of a transistor package, and/or the like.

SUMMARY OF THE DISCLOSURE

One general aspect includes an RF transistor package that includes a metal submount; a transistor die mounted on said metal submount; a surface mount IPD component that includes a dielectric substrate; the dielectric substrate mounted on said metal submount; and the dielectric substrate include one of the following: an irregular shape, a non-square shape, and a nonrectangular shape.

One general aspect includes a device that includes a surface mount IPD component that includes a dielectric substrate; at least one surface mount device mounted to said surface mount IPD component; and the dielectric substrate includes one of the following: an irregular shape, a non-square shape, and a nonrectangular shape, where the surface mount IPD component is configured to be mounted to a metal submount of a transistor package.

One general aspect includes a process for implementing an RF transistor package that includes providing a metal submount; mounting a transistor die on said metal submount; configuring a surface mount IPD component with a dielectric substrate; configuring the dielectric substrate with one of the following: an irregular shape, a non-square shape, and a nonrectangular shape; and mounting the dielectric substrate to said metal submount.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
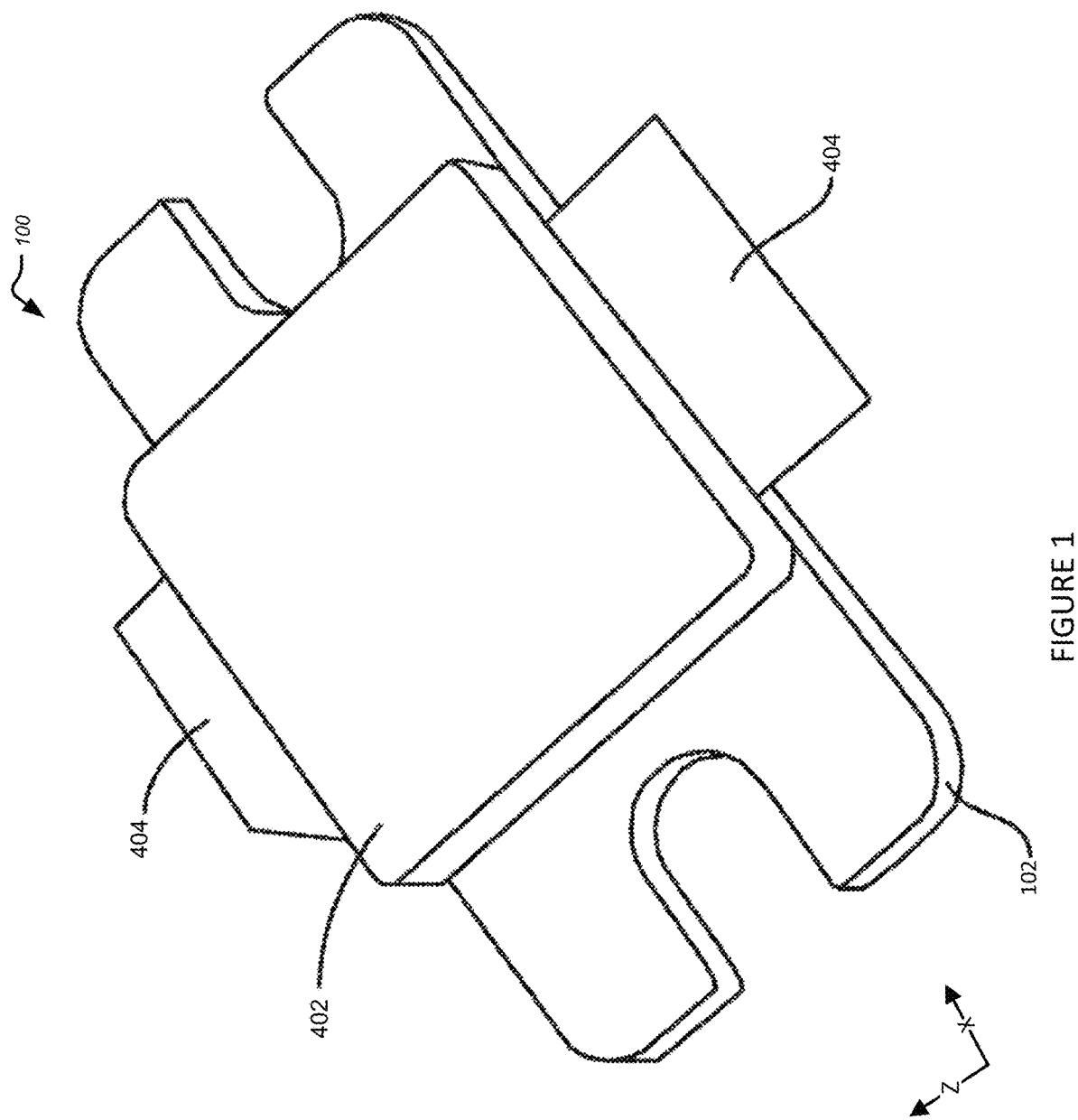
FIG. 1 illustrates a perspective view of a package according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as not to unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different embodiments disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a,"

"an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure describes an integrated passive device (IPD) implemented on a substrate, such as a printed circuit board (PCB) substrate, a ceramic substrate, and/or the like and a method of assembling the IPD. The IPD may have components, such as surface mount device (SMD) components, attached onto it, such as soldered onto it. The IPD may be arranged together with active transistor die, other passive components, and/or the like inside a package, such as a RF device package.

The disclosure describes the integrated passive device (IPD) may be implemented with a shape that may increase efficient use of space. For example, corners of the IPD may be cut out or otherwise removed. In one aspect, corners of the IPD may be cut out with a drill that may form an opening on a PCB strip holding a plurality of the IPD. Accordingly, the IPD may no longer have a typical rectangular or square shape. This enables the IPD to be placed in the package so as to more efficiently utilize space. For example, the IPD may be located in extreme corners of the RF package without overlapping structural features, critical features, and/or the like such as rivets. Without the corner structures, such as drilled-corners described herein, the IPD may have to be much smaller, positioned away from the structural features, the critical features, and/or the like, and this diminishes their usability and flexibility in the device package.

In addition, the integrated passive device (IPD) having a modified shape may require additional tools and processes for manufacture. For example, the integrated passive device (IPD) having a modified shape may require a modified process for die-attach including a modified dispense pattern, such as a modified epoxy dispense pattern. Additionally, the integrated passive device (IPD) having a modified shape may require a modified pickup tool configured to enable proper assembly of the integrated passive device (IPD) having a modified shape.

The IPD may be attached to a package flange with an appropriate die-attach material. For example, the IPD may be attached to a package flange with a sintering material, such as Ag Sintering material, an adhesive, such as an epoxy adhesive, and/or the like. If the IPD is attached to a package flange with an adhesive, such as an epoxy adhesive, a corresponding adhesive dispense may implement a particular pattern, for example a cross shape, a star shape, and/or the like that can be configured to match with the irregular shape of the IPD, such as a drilled corner shape of the IPD. In aspects, the spokes of the star shape dispense pattern or cross shape dispense pattern may have different lengths to create irregular die-attach patterns matching the irregular IPD component shapes. This disclosed dispense pattern may have a number of benefits including avoiding overlapping critical features in the RF package, contacting critical features in the RF package, and/or the like such as rivets leads.

Additionally, the integrated passive device (IPD) having a modified shape may require a modified pickup tool configured to enable proper assembly of the integrated passive device (IPD) having a modified shape. In particular, the modified pickup tool may be configured and/or designed for the irregular shaped IPDs in order to be able to pick and place the IPD correctly in the package. Both the outline and planarity of the pickup tool may be configured to maintain a sufficient vacuum seal during pickup. Additionally, the pickup tool may be configured to maintain a sufficient vacuum seal during pickup based on any SMD components that may be arranged on a top of the IPD substrate.

The irregular shape or modified shape of the IPD component may be implemented utilizing a number of different approaches, such as any one or more of a drill hole, a combination of drill holes, a combination of drill holes of different sizes, a saw pattern, a dice pattern, and/or the like on the parent PCB strip. In one or more aspects, appropriate sized drill holes, routed openings, and/or the like may first be made on the PCB panel strip, and then the panel may be diced, sawn, and/or the like along a trajectory that cuts through the drill holes to form irregular corners on a boundary of the IPD component. This modified shape IPD may allow the IPD to be placed in the package so as to more efficiently utilize space. For example, the IPD may be located in extreme corners of the device package without overlapping certain critical features.

In aspects, the IPD components may be used for matching networks, pre-matching, bias-decoupling, thermal-grounding, and/or the like in RF power products and/or the like. The IPD components may be placed inside a package, such as an open cavity package or over-mold package, together with transistor die, such as Gallium nitride (GaN) transistor die, and other capacitors, IPDs, and/or the like and connected with wire bonds to each other and to package leads. Metallization on the top and/or bottom of the substrate, together with vias routed through the substrate may enable the creation of bond-pads, inductive strips, inductive coils, capacitive stubs, and/or the like. In addition, surface mount devices (SMDs) components, such as capacitors, resistors, inductors, and/or the like may be attached, for example soldered, on top of the IPD components.

FIG. 1 illustrates a perspective view of a package according to the disclosure.

Figure 2:
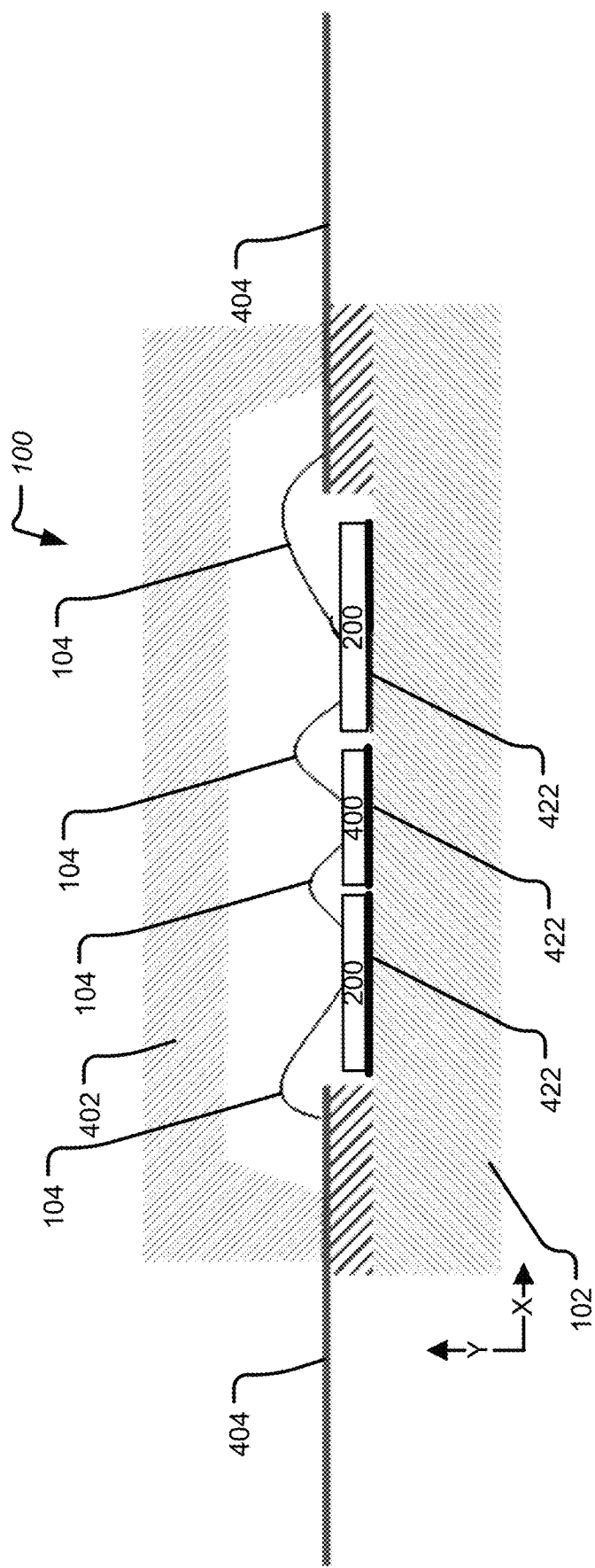
FIG. 2 illustrates a cross-sectional view of the package according to the disclosure.

FIG. 2 illustrates a cross-sectional view of the package according to the disclosure.

In particular, FIG. 1 and FIG. 2 show an exemplary implementation of a package 100 that may include any one or more other features, components, arrangements, and/or the like as described herein. In particular, FIG. 1 and FIG. 2 show the package 100 that may be implemented as a RF package, a RF amplifier package, a RF power amplifier package, a RF power transistor package, a RF power amplifier transistor package, and/or the like as described herein. The package 100 may include one or more semiconductor devices 400 and at least one IPD component 200. In aspects, the package 100 may include a plurality of the at least one IPD component 200; in aspects the package 100 may include a single implementation of the at least one IPD component 200; and in aspects the package 100 may include a plurality of parallel implementations of the at least one IPD component 200 and/or the one or more semiconductor devices 400. In one aspect, the package 100 may implement multiple-input and multiple-output (MIMO) technology. In one aspect, the package 100 may implement Communications Infrastructure (CIFR) technology.

The at least one IPD component 200 may be implemented as a RF device as described herein. The at least one IPD component 200 may implement matching networks, harmonic termination circuitry, integrated passive devices (IPD), capacitors, resistors, inductors, and/or the like.

The one or more semiconductor devices 400 may include a wide band-gap semiconductor device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration and/or the like.

The package 100 may be implemented to include an open cavity configuration suitable for use with the at least one IPD component 200 of the disclosure. In particular, the open cavity configuration may utilize an open cavity package design. In some aspects, the open cavity configuration may include a lid or other enclosure for protecting interconnects, circuit components, the at least one IPD component 200, the one or more semiconductor devices 400, and/or the like. The package 100 may include a ceramic body 402 and one or more metal contacts 404. In other aspects, the package 100 may include a plurality of the one or more metal contacts 404; and in aspects the package 100 may include a plurality of parallel implementations of the one or more metal contacts 404, parallel implementations of the at least one IPD component 200, and/or parallel implementations of the one or more semiconductor devices 400.

Inside the package 100, the one or more semiconductor devices 400 may be attached to a support 102 via a die attach material 422. One or more interconnects 104 may couple the one or more semiconductor devices 400 to a first one of the one or more metal contacts 404, a second one of the one or more metal contacts 404, the at least one IPD component 200, and/or the like. Additionally, inside the package 100, the at least one IPD component 200 may be arranged on the support 102 via the die attach material 422 with the one or more interconnects 104 shown in an exemplary configuration that may connect between the package 100, the at least one IPD component 200, and/or the one or more semiconductor devices 400. The support 102 may dissipate the heat generated by the one or more semiconductor devices 400 and the at least one IPD component 200, while simultaneously isolating and protecting the one or more semiconductor devices 400 and the at least one IPD component 200 from the outside environment.

The support 102 may be implemented as a metal submount and may be implemented as a support, a surface, a package support, a package surface, a package support surface, a flange, a metal flange, a heat sink, a common source support, a common source surface, a common source package support, a common source package surface, a common source package support surface, a common source flange, a common source heat sink, a leadframe, a metal leadframe and/or the like. The support 102 may include an insulating material, a dielectric material, and/or the like.

Additionally, the one or more semiconductor devices 400 may include one or more transistor dies that may include one or more laterally-diffused metal-oxide semiconductor (LDMOS) transistors, GaN based transistors, Metal Semiconductor Field-Effect transistors (MESFET), Metal Oxide Field Effect Transistors (MOSFET), Junction Field Effect Transistors (JFET), Bipolar Junction Transistors (BJT), Insulated Gate Bipolar Transistors (IGBT), high-electron-mobility transistors (HEMT), Wide Band Gap (WBG) transistors, and/or the like.

Figure 3:
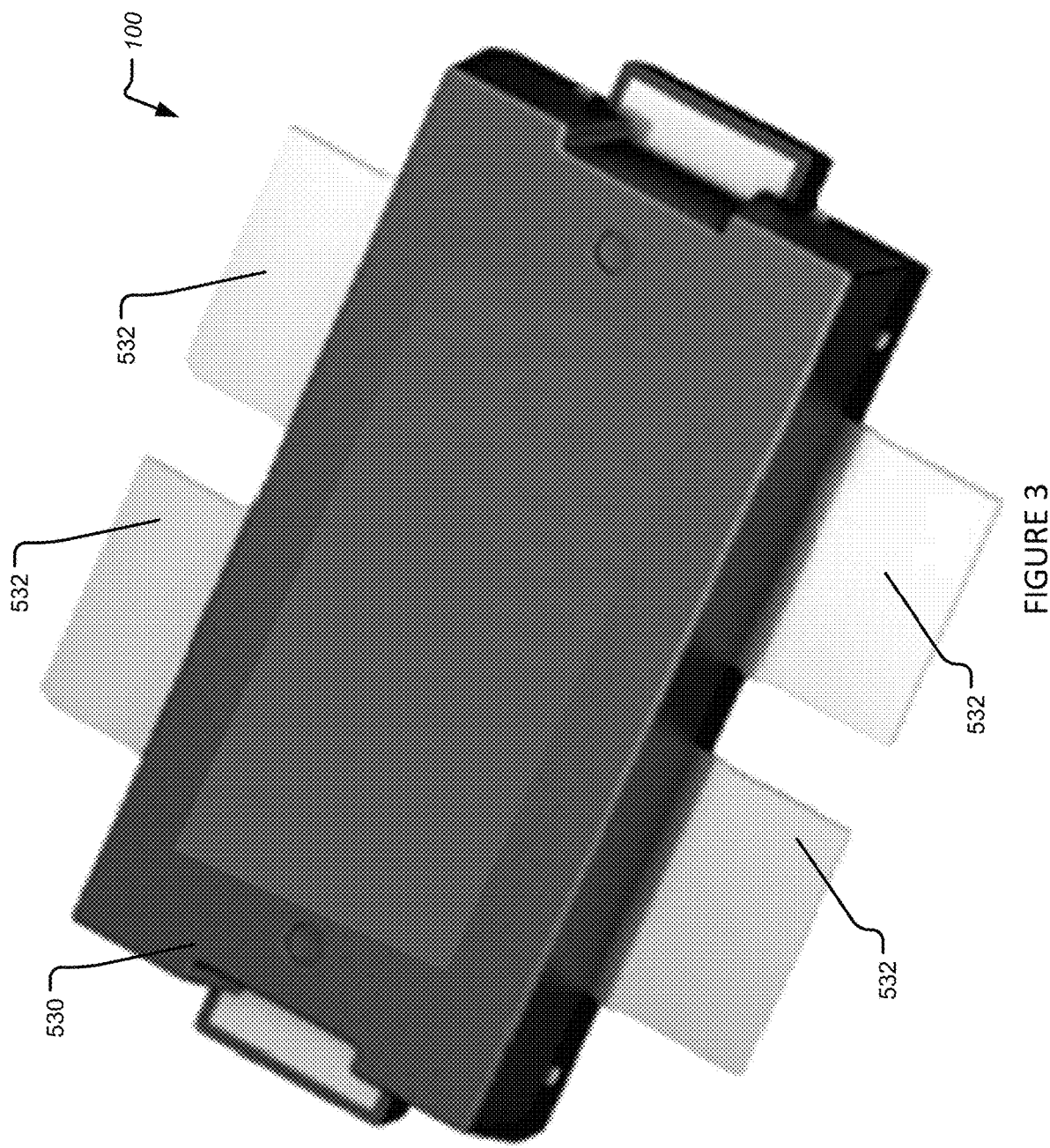
FIG. 3 illustrates a perspective view of a package according to the disclosure.

FIG. 3 illustrates a perspective view of a package according to the disclosure.

Figure 4:
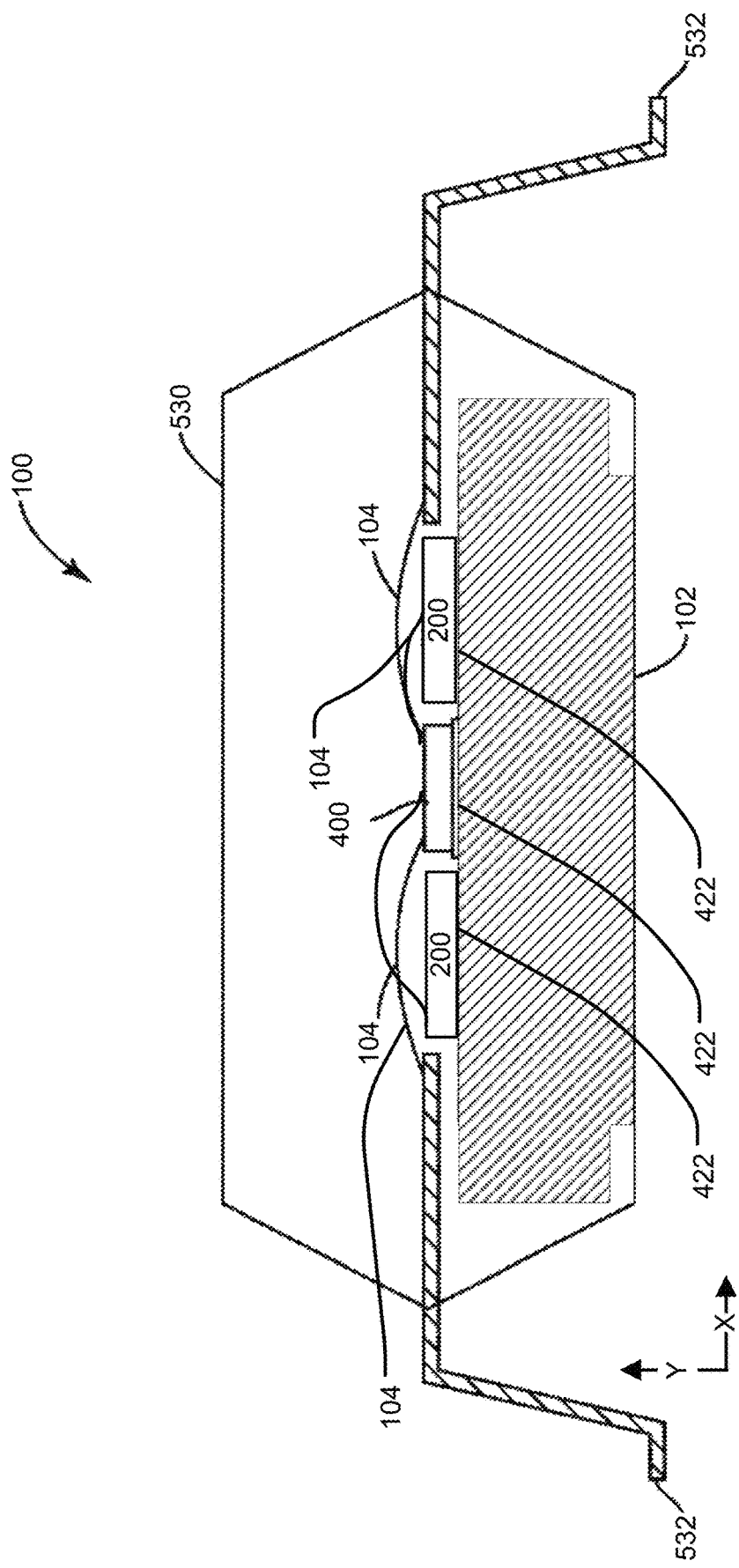
FIG. 4 illustrates a cross-sectional view of the package according to FIG. 3.

FIG. 4 illustrates a cross-sectional view of the package according to FIG. 3.

In particular, FIG. 3 and FIG. 4 show another exemplary implementation of the package 100 that may include any one or more other features, components, arrangements, and the like as described herein. In particular, FIG. 3 and FIG. 4 show the package 100 may be implemented as a RF package, a RF amplifier package, a RF power amplifier package, a RF power transistor package, a RF power amplifier transistor package, and/or the like as described herein. The package 100 may include the one or more semiconductor devices 400, the at least one IPD component 200, and/or the like. In aspects, the package 100 may include a plurality of the at least one IPD component 200; in aspects the package 100 may include a single implementation of the at least one IPD component 200; and in aspects the package 100 may include a plurality of parallel implementations of the at least one IPD component 200 and/or the one or more semiconductor devices 400. In one aspect, the package 100 may implement multiple-input and multiple-output (MIMO) technology. In one aspect, the package 100 may implement Communications Infrastructure (CIFR) technology.

Additionally, inside the package 100, the at least one IPD component 200 may be arranged on the support 102 as described herein with the one or more interconnects 104 shown in an exemplary configuration. The package 100 may include an over-mold 530, one or more input/output pins 532, and the support 102. The over-mold 530 may substantially surround the one or more semiconductor devices 400 and/or the at least one IPD component 200, which are mounted on the support 102 using the die attach material 422. The over-mold 530 may be formed of a plastic or a plastic polymer compound, which may be injection molded around the support 102, the one or more semiconductor devices 400, the at least one IPD component 200, and/or the like, thereby providing protection from the outside environment. The one or more semiconductor devices 400 and/or the at least one IPD component 200 may be coupled to the one or more input/output pins 532 via the one or more interconnects 104.

In one aspect, the over-mold 530 configuration may substantially surround the one or more semiconductor devices 400, the at least one IPD component 200, and/or the like. The over-mold 530 configuration may be formed of a plastic, a mold compound, a plastic compound, a polymer, a polymer compound, a plastic polymer compound, and/or the like. The over-mold 530 configuration may be injection molded, transfer molded, and/or compression molded around the one or more semiconductor devices 400, the at least one IPD component 200, and/or the like, thereby providing protection for the at least one IPD component 200, the one or more semiconductor devices 400, and other components of the package 100 from the outside environment.

Figure 5:
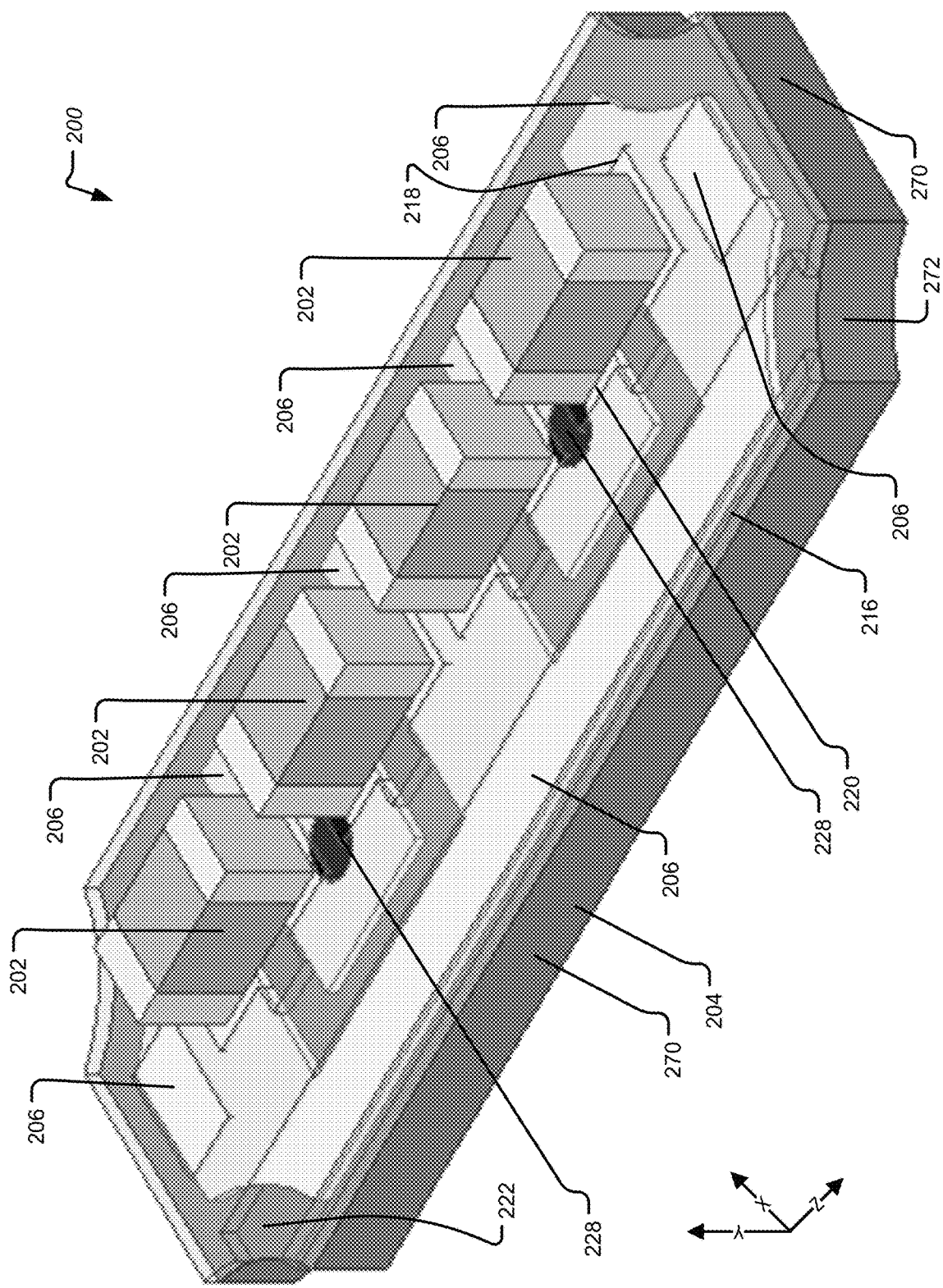
FIG. 5 illustrates a perspective top view of a IPD component according to the disclosure.

FIG. 5 illustrates a perspective top view of a IPD component according to the disclosure.

Figure 6:
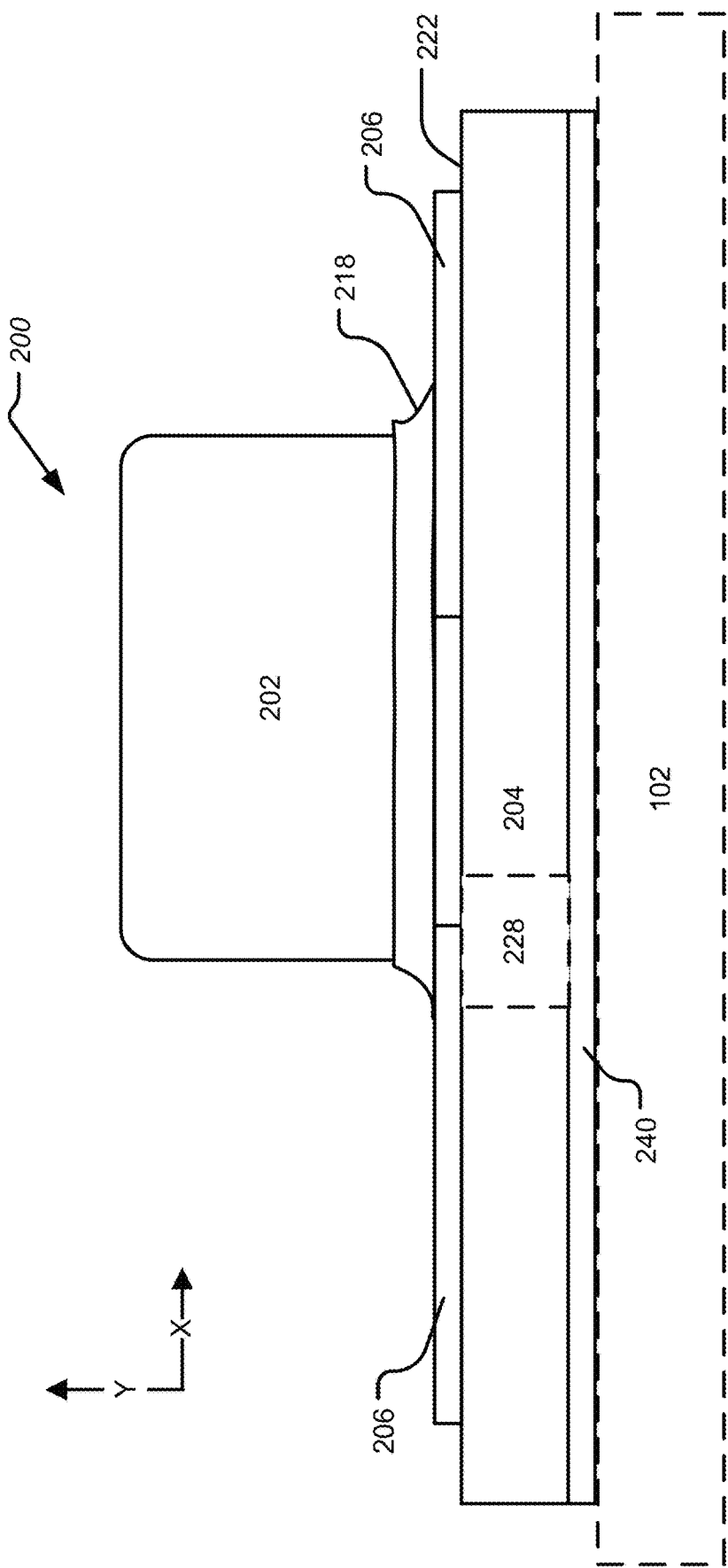
FIG. 6 illustrates a side view of a IPD component according to the FIG. 5.

FIG. 6 illustrates a side view of a IPD component according to the FIG. 5.

Figure 7:
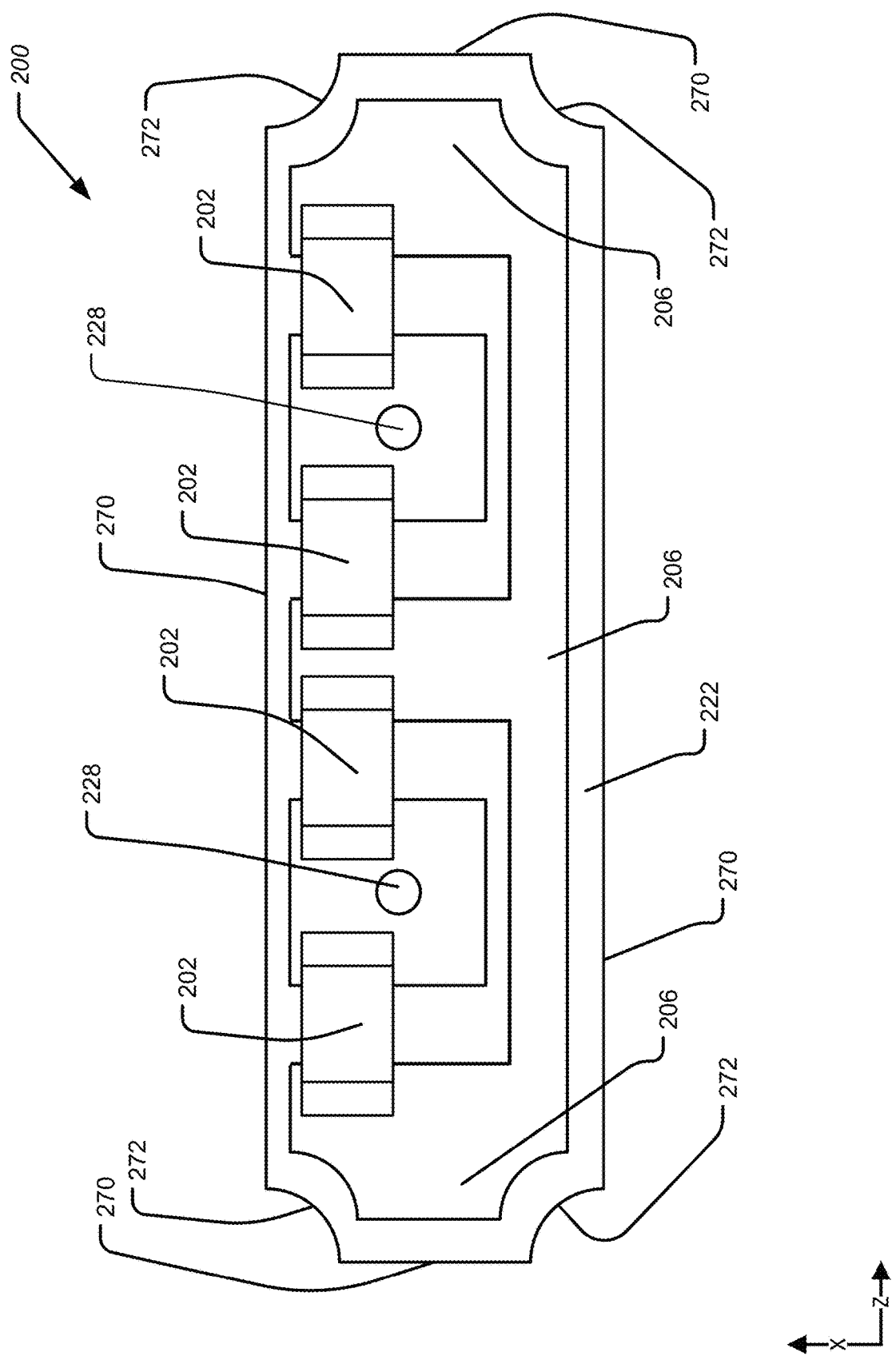
FIG. 7 illustrates a top view of a IPD component according to the FIG. 5.

FIG. 7 illustrates a top view of a IPD component according to the FIG. 5.

In particular, FIG. 5 illustrates the at least one IPD component 200 of the package 100 that may implement at least one device 202. Additionally, the at least one IPD component 200 may include a substrate 204 having an upper surface 222 with a plurality interconnect pads 206. In some aspects, the at least one IPD component 200 may further include a solder barrier 216 arranged on portions of the upper surface 222 and the plurality interconnect pads 206.

With further reference to FIG. 5 and FIG. 7, the at least one IPD component 200 and/or the substrate 204 may have a shape that may be configured to increase efficient use of space within the package 100. In this regard, space within packages, such as the package 100 is limited and/or a usable space within packages, such as the package 100, is limited. Moreover, the package 100 may require various structural features such as fasteners, terminals, housing structures, and/or the like. For example, structural features that are located in and/or on the support 102. As a further example, the structural features may include fasteners implemented as rivets, rivets located on the support 102, and/or the like. These structural features of the package 100 further reduce the usable space.

Additionally, proximity of the at least one IPD component 200 and/or the at least one device 202 to the structural features of the package 100 and/or proximity to other components of the package 100 can have a negative impact on performance of the package 100, the at least one IPD component 200, the at least one device 202 and/or the like, such as RF performance. Moreover, proximity of the at least one IPD component 200 and/or the at least one device 202 to the structural features of the package 100 can have a negative impact on attachment performance, reliability, and/or the like. For example, the structural features may have a negative impact on attachment of the at least one IPD component 200 to the support 102. More specifically, the structural features may have different materials, may make a surface of the support 102 uneven, and/or the like. Accordingly, the structural features may result in the at least one IPD component 200 having poor attachment, poor attachment to the support 102 and/or other surface of the package 100, the at least one IPD component 200 may delaminate from the support 102 or another surface of the package 100, and/or the like. Additionally, proximity of the at least one IPD component 200 to the structural features of the package 100 can have a negative impact on any subsequent overmold of the components resulting in poor protection of the components of the package 100 including the at least one IPD component 200. For example, if the package 100 implements the over-mold 530, proximity of the at least one IPD component 200 to the structural features of the package 100 can have a negative impact on adhesion of the over-mold 530, application of the over-mold 530, and/or the like.

Accordingly, the at least one IPD component 200 and/or the substrate 204 may have a shape that may be configured to increase efficient use of space within the package 100, as well as improve performance, reliability, and/or the like. In particular, the at least one IPD component 200 and/or the substrate 204 may be implemented with an irregular shape, a non-square shape, a nonrectangular shape, and/or the like in a plane parallel the X-Z plane as illustrated, a plane of a surface of the support 102, and/or a plane of the upper surface 222. In geometry, a square is a regular quadrilateral with four equal sides and four equal angles; and a rectangle is a quadrilateral with four sides and four right angles.

In one aspect, a shape of the at least one IPD component 200 and/or the substrate 204 may be defined by sides 270 of the at least one IPD component 200 and/or the substrate 204 and at least one connection surface 272 of the at least one IPD component 200 and/or the substrate 204. The sides 270 and the at least one connection surface 272 may define an outline of the at least one IPD component 200 and/or the substrate 204. The outline of the at least one IPD component 200 and/or the substrate 204 being arranged in a plane parallel the X-Z plane as illustrated, a plane of a surface of the support 102, and/or a plane of the upper surface 222.

In particular, the sides 270 of the at least one IPD component 200 and/or the substrate 204 may be straight, linear, and/or the like as illustrated in FIG. 5 and FIG. 7. Additionally, the at least one connection surface 272 may connect between two of the sides 270. More specifically, in certain aspects, a particular implementation of the sides 270 may include an inflection point that transitions between an implementation of the sides 270 to an implementation of the at least one connection surface 272. In particular aspects, there may be an inflection point between one implementation of the sides 270 and another implementation of the sides 270. In one aspect, the inflection point may define an angle between adjacent ones of the sides 270 and/or the at least one connection surface 272 that is less than 90°.

The at least one connection surface 272 may be formed as a cutout of the at least one IPD component 200 and/or the substrate 204, a cutout area and/or portion of the at least one IPD component 200 and/or the substrate 204, an area where the at least one IPD component 200 and/or the substrate 204 has been modified, cut, sawn, routed, drilled, and/or the like.

In aspects, the at least one connection surface 272 and the sides 270 may be arranged in the plane of the X axis and the Z axis, a plane of a surface of the support 102, and/or a plane of the upper surface 222. In aspects, the at least one connection surface 272 and the sides 270 may be connected and may be arranged in the plane of the X axis and the Z axis, a plane of a surface of the support 102, and/or a plane of the upper surface 222. In aspects, the at least one connection surface 272 and the sides 270 may be arranged in the plane of the X axis and the Z axis, a plane of a surface of the support 102, and/or a plane of the upper surface 222.

Additionally, the at least one connection surface 272 as illustrated in FIG. 5 and FIG. 7 may be a curved shape, a concave shape, a curved shape extending toward a center of the at least one IPD component 200, a concave shape extending toward the center of the at least one IPD component 200, and/or the like as illustrated in FIG. 5 and FIG. 7. In aspects, the at least one connection surface 272 as illustrated in FIG. 7 may define a partial circle in the plane of the X axis and the Z axis. In aspects, the at least one connection surface 272 as illustrated in FIG. 7 may define a quarter circle in the plane of the X axis and the Z axis. In aspects, the at least one connection surface 272 as illustrated in FIG. 7 may define a partial circle having a circumference less than a quarter circle in the plane of the X axis and the Z axis.

In particular, FIG. 5 and FIG. 7 illustrate an exemplary implementation of the at least one IPD component 200 where the at least one IPD component 200 may include curved implementations of the at least one connection surface 272. Additionally, FIG. 5 and FIG. 7 illustrate that there are four implementations of the at least one connection surface 272 and four implementations of the sides 270.

However, there may be any number of implementations of the at least one connection surface 272 and the sides 270. Additionally, FIG. 5 illustrates an implementation of the at least one IPD component 200 that has symmetry about the X axis and symmetry about the Z axis. Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

In one aspect, the at least one IPD component 200 of the package 100 may implement a single one of at least one device 202. In one aspect, the at least one IPD component 200 of the package 100 may implement a plurality of the at least one device 202. The at least one IPD component 200 may be implemented as an RF device and the at least one IPD component 200 may connect the at least one device 202 to the package 100, to the one or more semiconductor devices 400, and/or the like. The at least one IPD component 200 may be implemented as a submount for the at least one device 202.

In particular aspects, FIG. 5 illustrates an exemplary implementation of a PCB-IPD or ceramic IPD component with irregular cut corners. This IPD has four SMD capacitors soldered on the top side, and has a top-side metallization for connecting the SMD capacitors and bond-pads. A solder-mask layer protects the bond pads from flux, solder or other materials that may contaminate the bond-pad surface and affect quality of wire-bonds. There are vias connecting one end of the SMD caps to the back side of the PCB. The four corners of the PCB-component show the drilled-out corners, that give it the non-rectangular shape.

In aspects, RF devices may be configured and implemented in the at least one IPD component 200. In particular, the RF devices may be configured and implemented in the at least one IPD component 200 and may include a GaN based HEMT die, a silicon-based LDMOS transistor die, and/or the like as described herein. The RF devices may include matching networks, harmonic termination circuitry, integrated passive devices (IPD), and the like as described herein.

In particular, the RF devices may be configured and implemented in the at least one IPD component 200 as matching networks, harmonic termination circuitry, integrated passive devices (IPD), and the like and may utilize less-expensive ceramic-based surface mount devices (SMDs) that are typically mounted directly to traces on the at least one IPD component 200 to replace the more expensive silicon-based capacitors. In various aspects, the disclosure is directed to mounting the surface mount discrete device(s) (SMDs) onto the at least one IPD component 200 implemented as a submount, which may be mounted on the support 102 such as the metal flange, the metal leadframe, the base, or the like. The submount may be wire bonded or the like to the RF devices such as the dies by input and/or output leads of the RF package, which may be metal based.

FIG. 5 further illustrates that the at least one IPD component 200 may include the plurality interconnect pads 206 and one or more may be configured as an interconnect bond pad. The one or more interconnects 104 may connect to the plurality interconnect pads 206 as illustrated in FIG. 2 and FIG. 4. The one or more interconnects 104 may be implemented as one or more wires, wire bonds, leads, vias, edge platings, circuit traces, tracks, clips, and/or the like. In one aspect, the one or more interconnects 104 may utilize the same type of connection. In one aspect, the one or more interconnects 104 may utilize different types of connections.

The one or more interconnects 104 may utilize ball bonding, wedge bonding, compliant bonding, ribbon bonding, metal clip attach, and/or the like. In one aspect, the one or more interconnects 104 may utilize the same type of connection. In one aspect, the one or more interconnects 104 may utilize different types of connections.

The one or more interconnects 104 may be include various metal materials including one or more of aluminum, copper, silver, gold, and/or the like. In one aspect, the one or more interconnects 104 may utilize the same type of metal. In one aspect, the one or more interconnects 104 may utilize different types of metal. The one or more interconnects 104 may connect to the plurality interconnect pads 206 by an adhesive, soldering, sintering, eutectic bonding, thermal compression bonding, ultrasonic bonding/welding, a clip component, and/or the like as described herein.

With reference to FIG. 5, the at least one IPD component 200 may include the substrate 204. The substrate 204 may include polymers, polyamide, thermoset resin, FR-4 woven fiberglass, dielectric composite materials, Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or the like. The substrate 204 implementing Alumina, Aluminum Nitride (AlN), Beryllium oxide (BeO), Titanium Oxide (TiO), metal-oxide substrates, high dielectric metal-oxide substrates, high dielectric substrates, thermally conductive high dielectric materials/substrates, and/or other similar thermal conductivity performance dielectric material may result in the IPD components of the at least one IPD component 200, such as the at least one device 202, being able to operate with a lower temperature thus increasing reliability.

The at least one device 202 may be one or more of a surface mount device (SMD) component, a surface mount device (SMD) capacitor, a ceramic capacitor, a surface mount device (SMD) oscillator, a surface mount device (SMD) ceramic capacitor, an inductor, a surface mount device (SMD) inductor, a resistor, a surface mount device (SMD) resistor, a power divider, a surface mount device (SMD) power divider, a power splitter, a surface mount device (SMD) power splitter, an amplifier, a balanced amplifier, a surface mount device (SMD) amplifier, a surface mount device (SMD) balanced amplifier, a combiner, a surface mount device (SMD) combiner, and/or the like. The at least one device 202 may be implemented as a radio frequency device, a radio frequency circuit device, a radio frequency component device, or the like. The at least one device 202 may be implemented as a radio frequency device, a radio frequency circuit device, a radio frequency component device, or the like may be one or more of a surface mount device (SMD) radio frequency component, a surface mount device (SMD) radio frequency capacitor, a radio frequency ceramic capacitor, a surface mount device (SMD) oscillator, a surface mount device (SMD) radio frequency ceramic capacitor, a radio frequency inductor, a surface mount device (SMD) radio frequency inductor, a radio frequency resistor, a surface mount device (SMD) radio frequency resistor, a radio frequency power divider, a surface mount device (SMD) radio frequency power divider, a radio frequency power splitter, a surface mount device (SMD) radio frequency power splitter, a radio frequency amplifier, a balanced radio frequency amplifier, a surface mount device (SMD) radio frequency amplifier, a surface mount device (SMD) radio frequency balanced amplifier, a radio frequency combiner, a surface mount device (SMD) radio frequency combiner, a surface mount device (SMD) resistor, a surface mount device (SMD) resistor providing tuning, stability, and baseband impedance, and/or the like.

The package 100 may be implemented as an RF package and the at least one device 202 may be implemented as a radio frequency device may include, connect, support, or the like a transmitter, transmitter functions, a receiver, receiver functions, a transceiver, transceiver functions, matching network functions, harmonic termination circuitry, integrated passive devices (IPD), and the like. The at least one device 202 implemented as a radio frequency device may be configured to, may support, or the like transmitting a radio wave and modulating that wave to carry data with allowable transmitter power output, harmonics, and/or band edge requirements. The at least one device 202 implemented as a radio frequency device may be configured to, may support, or the like receiving a radio wave and demodulating the radio wave. The at least one device 202 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

With reference to FIG. 6, the substrate 204 may include the upper surface 222. The upper surface 222 may be located in a plane generally parallel to the x-axis or a plane generally parallel to the upper surface of the support 102. In this regard, generally may be defined to be within 0°-15°, 0°-2°, 2°-4°, 4°-6°, 6°-8°, 8°-10°, 10°-12°, or 12°-15°. The upper surface 222 may support the plurality interconnect pads 206. The plurality interconnect pads 206 may include multiple bond pad areas. The plurality interconnect pads 206 may be formed by a metal surface on the upper surface 222 of the substrate 204 and may comprise a metallic material such as copper, gold, nickel, palladium, silver, and the like, and combinations thereof.

In some aspects, the at least one device 202 may include terminals arranged on a bottom surface. Accordingly, directly mounting a device such as the at least one device 202 to the support 102 of the package 100 would result in a short. For example, the at least one device 202 implemented as a surface mount device (SMD) component, such as a surface mount device (SMD) ceramic capacitor, may include one or more terminals arranged on a bottom surface of the surface mount device (SMD) component. Accordingly, mounting the at least one device 202 configured as a surface mount device (SMD) component to the support 102 of the package 100 would result in a short.

Accordingly, the disclosure utilizes the substrate 204 of the at least one IPD component 200 to support the at least one device 202. The substrate 204 may be mounted on an upper surface of the support 102. The substrate 204 may be mounted on the upper surface of the support 102 by an adhesive, soldering, sintering, eutectic bonding, ultrasonically welding, and/or the like as described herein. In one aspect, the substrate 204 may be directly mounted on the upper surface of the support 102. In one aspect, the substrate 204 may be mounted on the upper surface of the support 102 with intervening structures, components, and/or the like. The upper surface of the support 102 may be parallel to an x-axis; and the substrate 204 may be arranged vertically above the support 102 along a y-axis as illustrated in FIG. 6. In one aspect, the substrate 204 may be at least partially insulating. More specifically, the substrate 204 may at least partially insulate the at least one device 202 from the support 102.

Referring back to FIG. 5, one or more of the plurality interconnect pads 206 may be surfaces for bonding to the one or more interconnects 104. Accordingly, it may be beneficial to ensure that the surfaces of the plurality interconnect pads 206 remain clean. In particular, attachment of the at least one device 202 to the plurality interconnect pads 206 may result in solder transferring to other surfaces of the plurality interconnect pads 206. Accordingly, as shown in FIG. 5, the plurality interconnect pads 206 may include the solder barrier 216 arranged between various bond areas of the one or more interconnects 104 and the bond areas of the at least one device 202 to the plurality interconnect pads 206.

With reference to FIG. 5 and FIG. 6, the upper surface 222 may further implement the plurality interconnect pads 206 as a first terminal bond pad. The first terminal bond pad may be located in a plane generally parallel to the x-axis or a plane generally parallel to the upper surface 222. The first terminal bond pad may connect to a first terminal of the at least one device 202. In this regard, a first connection 220 may be formed between the first terminal bond pad and the first terminal. The first connection 220 may include an adhesive, soldering, sintering, eutectic bonding, ultrasonically welding, and/or the like as described herein. The first terminal bond pad may be formed by a metal surface on the upper surface 222 of the substrate 204 and may comprise a metallic material such as copper, gold, nickel, palladium, silver, and the like, and combinations thereof.

The upper surface 222 may further implement another one of the plurality interconnect pads 206 as a second terminal bond pad. The second terminal bond pad may be located in a plane generally parallel to the x-axis or a plane generally parallel to the upper surface 222. The second terminal bond pad may connect to a second terminal of the at least one device 202. In this regard, a second connection 218 may be formed between the second terminal bond pad and the second terminal. The second terminal bond pad may be electrically connected in part to the plurality interconnect pads 206. The second connection 218 may include an adhesive, soldering, sintering, eutectic bonding, ultrasonically welding, and/or the like as described herein. The second terminal bond pad may be formed by a metal surface on the upper surface 222 of the substrate 204 and may comprise a metallic material such as copper, gold, nickel, palladium, silver, and the like, and combinations thereof. Additionally, the upper surface 222 of the substrate 204 may include additional terminals for the at least one device 202 as needed.

As shown in FIG. 6, the at least one IPD component 200 may include a metallization layer 240 located on a lower surface of the substrate 204 opposite the upper surface 222. The metallization layer 240 may be located in a plane generally parallel to the x-axis or a plane generally parallel to the upper surface 222. In one aspect, the metallization layer 240 may be implemented as a full face metallic layer on the lower surface of the substrate 204 opposite the upper surface 222. Additionally or alternatively, the at least one IPD component 200 may be single-sided having one metallic layer; the at least one IPD component 200 may be double-sided having two metallic layers on both sides of one substrate layer of the substrate 204; and/or the at least one IPD component 200 may be multi-layer having outer and inner layers of aluminum, copper, silver, gold, and/or the like, alternating with layers of substrate. The at least one IPD component 200 may include separate conducting lines, tracks, circuit traces, pads for connections, vias to pass connections between layers of aluminum, copper, silver, gold, and/or the like, and features such as solid conductive areas for EM shielding or other purposes.

Additionally or alternatively the at least one IPD component 200 may include conductors on different layers that may be connected with vias, which may be metallic plated holes, such as copper-plated holes, aluminum-plated holes, silver-plated holes, gold-plated holes, and/or the like, that may function as electrical tunnels through the dielectric substrate. The at least one IPD component 200 may include "Through hole" components that may be mounted by their wire leads passing through the substrate 204 and soldered to traces on the other side. The at least one IPD component 200 may include "Surface mount" components that may be attached by their leads and/or terminals.

The at least one IPD component 200 and/or the metallization layer 240 may be manufactured utilizing one or more manufacturing techniques including print screening or dispensing for solder paste, print screening or dispensing for epoxy, silk screen printing processes, photoengraving processes, print onto transparent film processes, photo mask processes, photo-sensitized board processes, laser resist ablation processes, milling processes, laser etching processes, and/or like processes. In one or more aspects, the at least one IPD component 200 may be configured to mechanically support and electrically connect the at least one device 202 to the at least one IPD component 200 and other electronic components.

Additionally, the at least one IPD component 200 may include vias 228. The vias 228 may extend from the plurality interconnect pads 206 to the metallization layer 240. Accordingly, a terminal of the at least one device 202 may connect through the first connection 220 to the first terminal bond pad through the vias 228 at least to the metallization layer 240 to make an electrical connection and/or electrical contact with the support 102. The vias 228 may also extend through the metallization layer 240 to the support 102 to make an electrical connection and/or electrical contact with the support 102. In other aspects, the vias 228 may only be implemented as partial vias. The vias 228 may be metallic plated holes or metallic filled holes that may function as electrical tunnels through the substrate 204. The vias 228 may comprise a metallic material such as copper, gold, nickel, palladium, silver, and the like, and combinations thereof. The vias 228 may have an axis that may be located in a plane generally perpendicular to the x-axis, a plane generally parallel to the x-axis, and/or a plane generally perpendicular to the upper surface 222.

Figure 8:
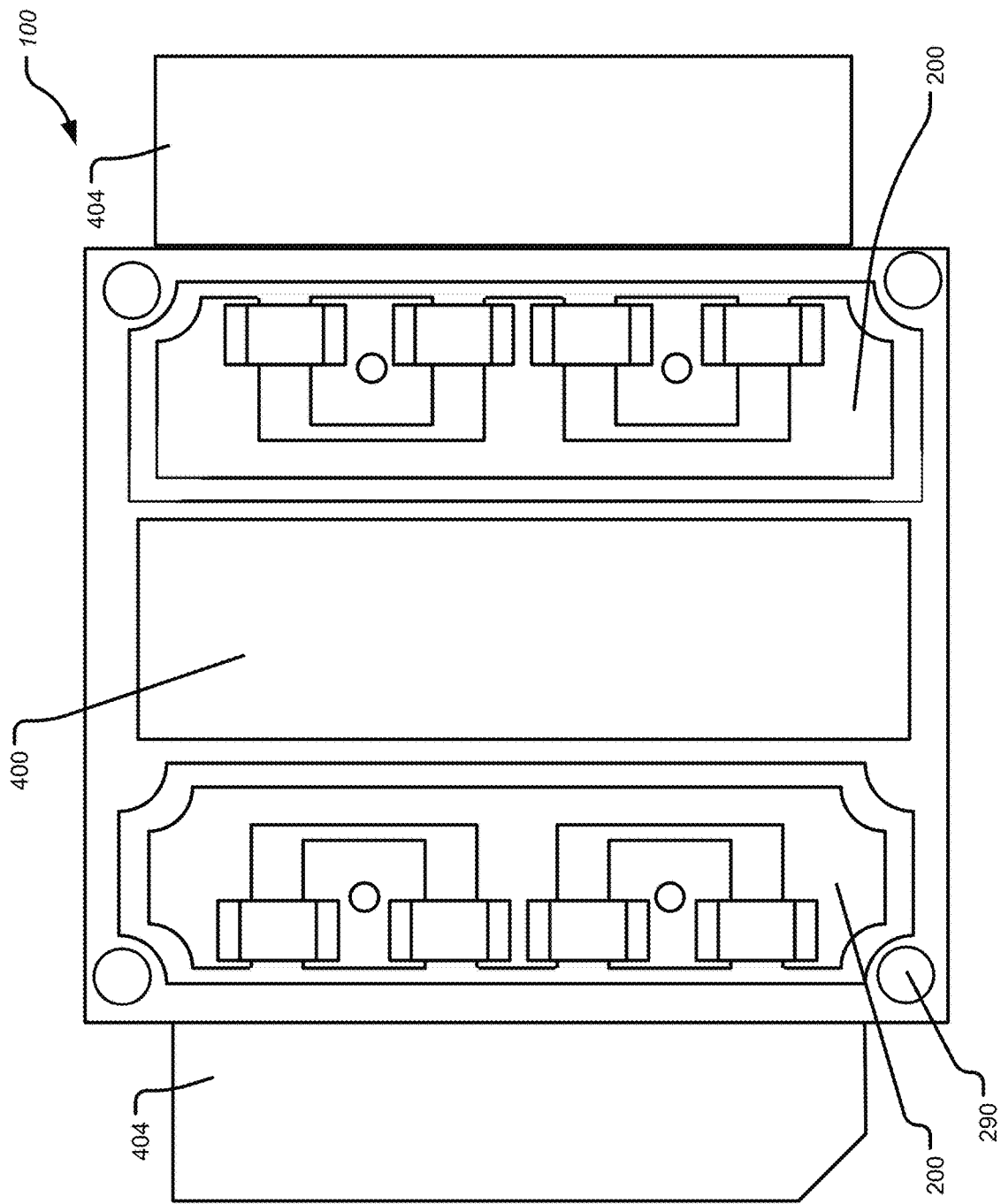
FIG. 8 illustrates a top view of a package according to the disclosure.

FIG. 8 illustrates a top view of a package according to the disclosure.

Figure 9:
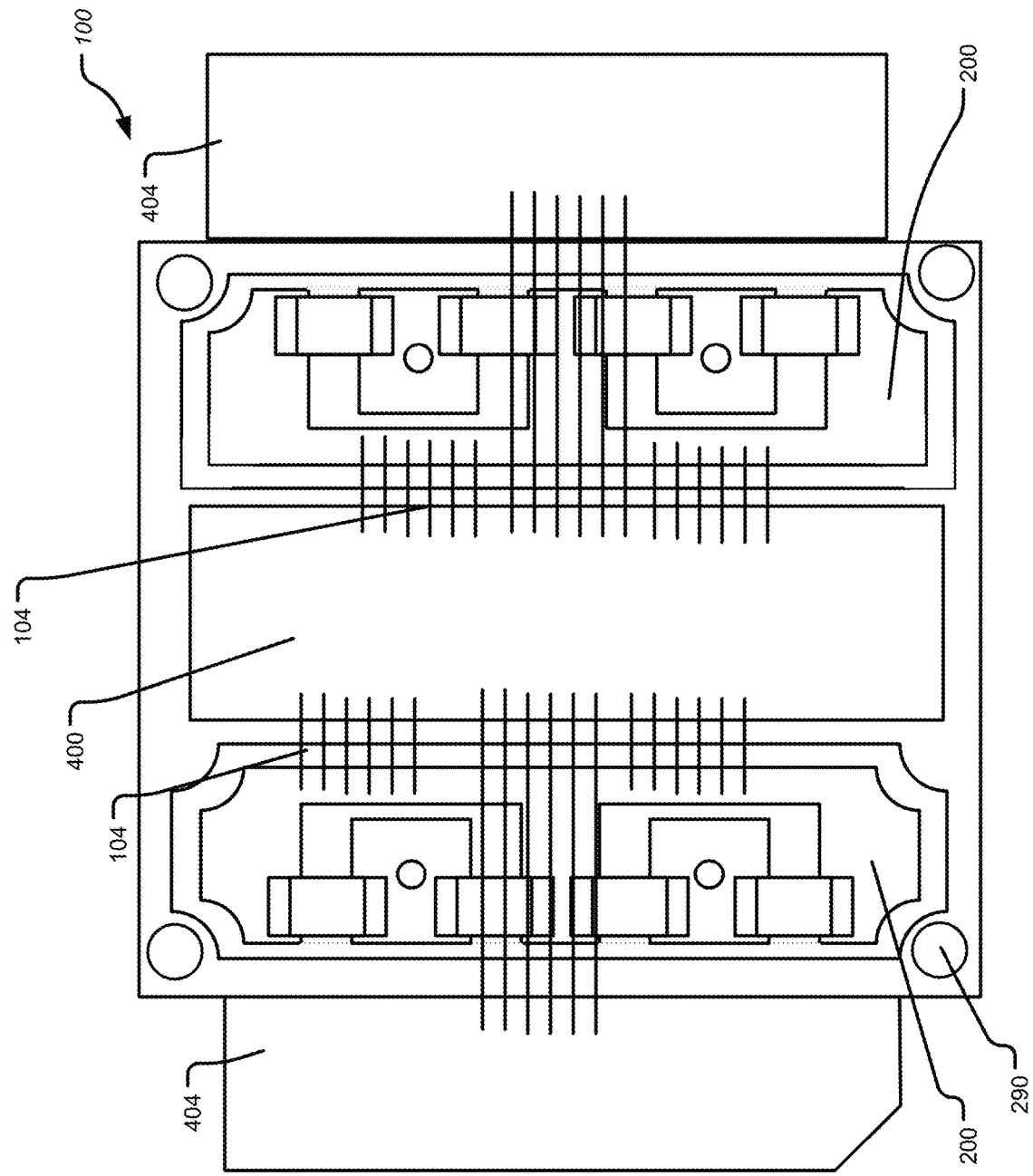
FIG. 9 illustrates a top view of a package according to FIG. 8.

FIG. 9 illustrates a top view of a package according to FIG. 8.

Figure 10:
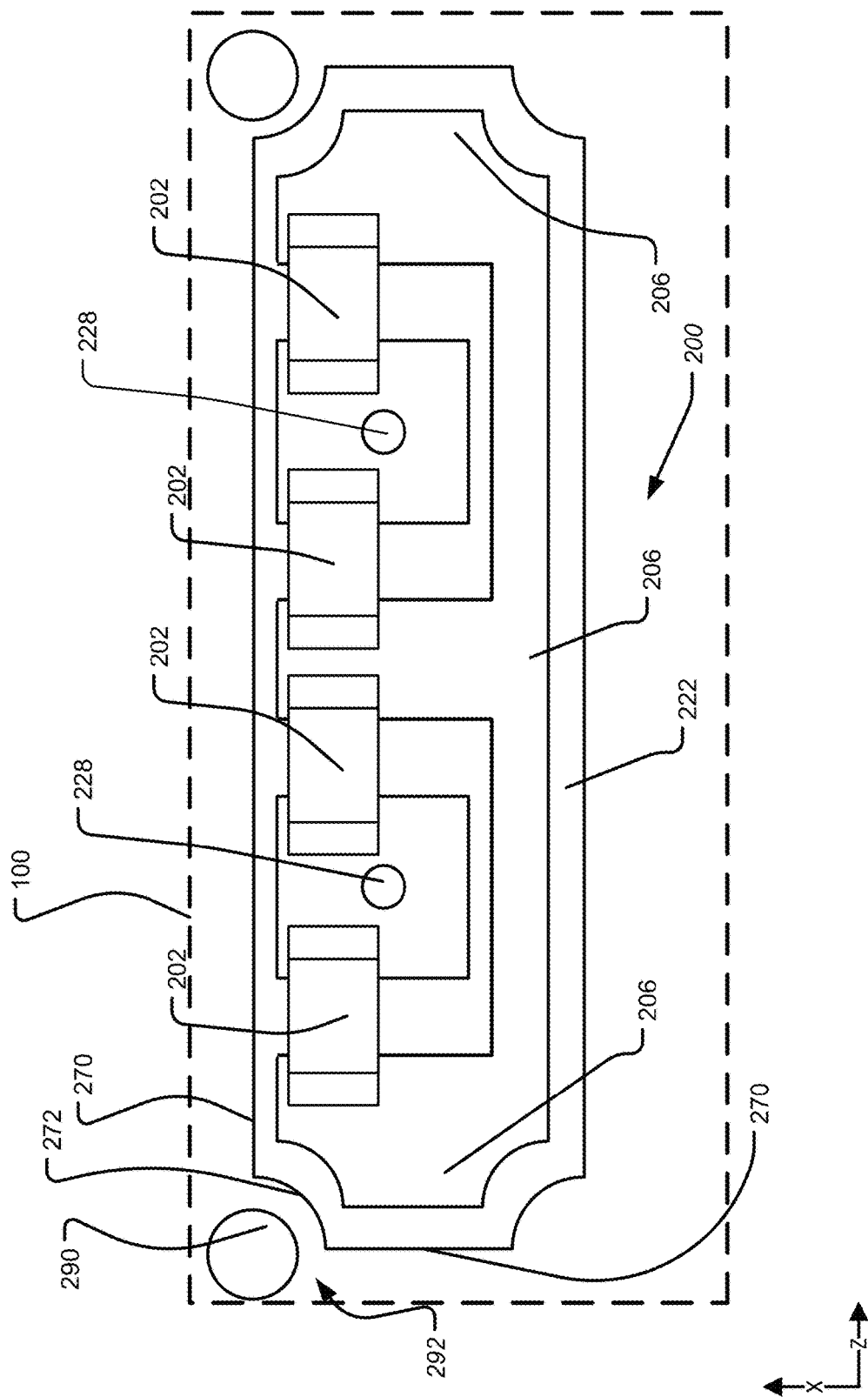
FIG. 10 illustrates a partial top view of a package according to FIG. 8.

FIG. 10 illustrates a partial top view of a package according to FIG. 8.

In particular, FIG. 8 illustrates an arrangement of the at least one IPD component 200, the one or more semiconductor devices 400, and/or the like without an illustration of the one or more interconnects 104 to provide clarity of understanding. FIG. 9 shows the one or more interconnects 104 in an exemplary arrangement between the one or more semiconductor devices 400, the at least one IPD component 200, and/or the one or more metal contacts 404. Additionally, FIG. 8 and FIG. 10 illustrate that the package 100 may include at least one structural feature 290. In this regard, the package 100 may require the at least one structural feature 290 that may include one or more fasteners, terminals, housing structures, and/or the like. For example, the at least one structural feature 290 may be located in and/or on the support 102. As a further example, the at least one structural feature 290 may include one or more fasteners implemented as rivets, rivets located on the support 102, and/or the like. The at least one structural feature 290 of the package 100 may reduce the usable space.

The at least one structural feature would typically prevent a square or rectangular substrate from being able to fit into the package 100. However, the disclosed implementation of the at least one IPD component 200 provides a modified shape to allow the at least one IPD component 200 to fit within the package 100. In particular, the various components of the package 100 including the at least one IPD component 200, the one or more semiconductor devices 400, and/or the like may fit into the package 100 like pieces in a jigsaw puzzle.

With reference to FIG. 10, the at least one IPD component 200 implementing the at least one connection surface 272 may be configured to provide clearance as indicated by arrow 292 between the at least one structural feature 290 and the at least one connection surface 272, the at least one IPD component 200, and/or the like. Accordingly, the clearance between the at least one structural feature 290 and the at least one IPD component 200 and/or the at least one connection surface 272 as indicated by the arrow 292 improves performance and reliability as described herein.

In particular exemplary aspects, FIG. 8 illustrates an exemplary RF packaged device flange, with irregular-cut PCB-IPD components attached on the four extreme corners of the flange. It can be seen here that both the corner cut (or drill-cut) component as well as a spread out epoxy pattern arranged thereunder (further described below) avoids contact with the corner rivets.

Figure 11:
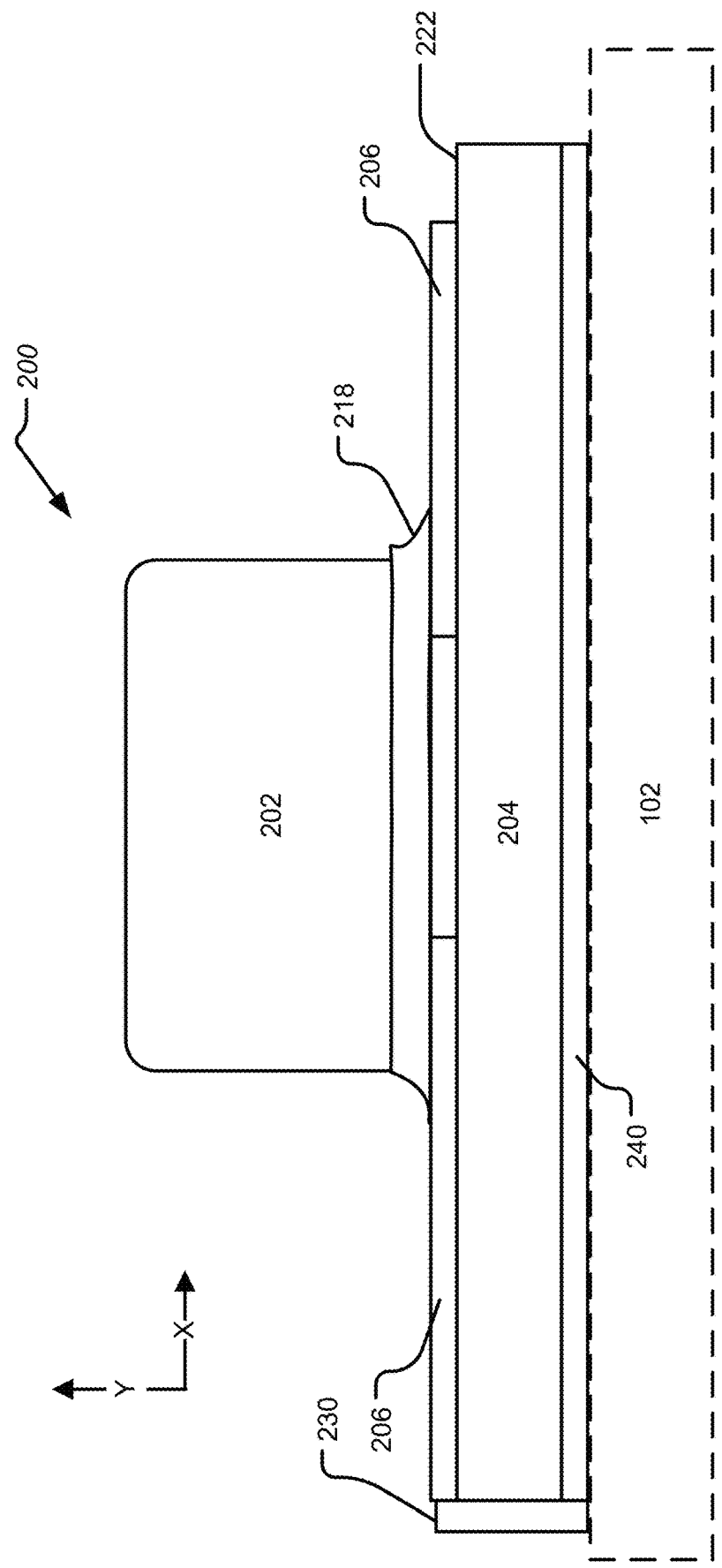
FIG. 11 illustrates a side view of another IPD component according to the disclosure.

FIG. 11 illustrates a side view of another IPD component according to the disclosure.

In particular, FIG. 11 illustrates the at least one IPD component 200 that may include any and all features, configurations, arrangements, implementations, aspects and/or the like as described herein. Additionally, FIG. 9 illustrates that the at least one IPD component 200 may include edge plating 230. The edge plating 230 may extend from the upper surface 222 and/or the plurality interconnect pads 206 to the metallization layer 240. The edge plating 230 may be located in a plane generally perpendicular to the x-axis or a plane generally perpendicular to the upper surface 222. Accordingly, a terminal of the at least one device 202 may connect through the first connection 220 through the edge plating 230 to the at least to the metallization layer 240 to make an electrical connection and/or electrical contact with the support 102. The edge plating 230 may also extend to the metallization layer 240 to the support 102 to make an electrical connection and/or electrical contact with the support 102. The edge plating 230 may include a metallic material such as copper, gold, nickel, palladium, silver, and the like, and combinations thereof. In one or more aspects, the edge plating 230 may include routing and plated constellation configurations and/or long-hole configurations also called castellation or edge plating. In one or more aspects, the edge plating 230 may further reduce cost in comparison to utilizing vias as vias may at times become plugged.

Figure 12:
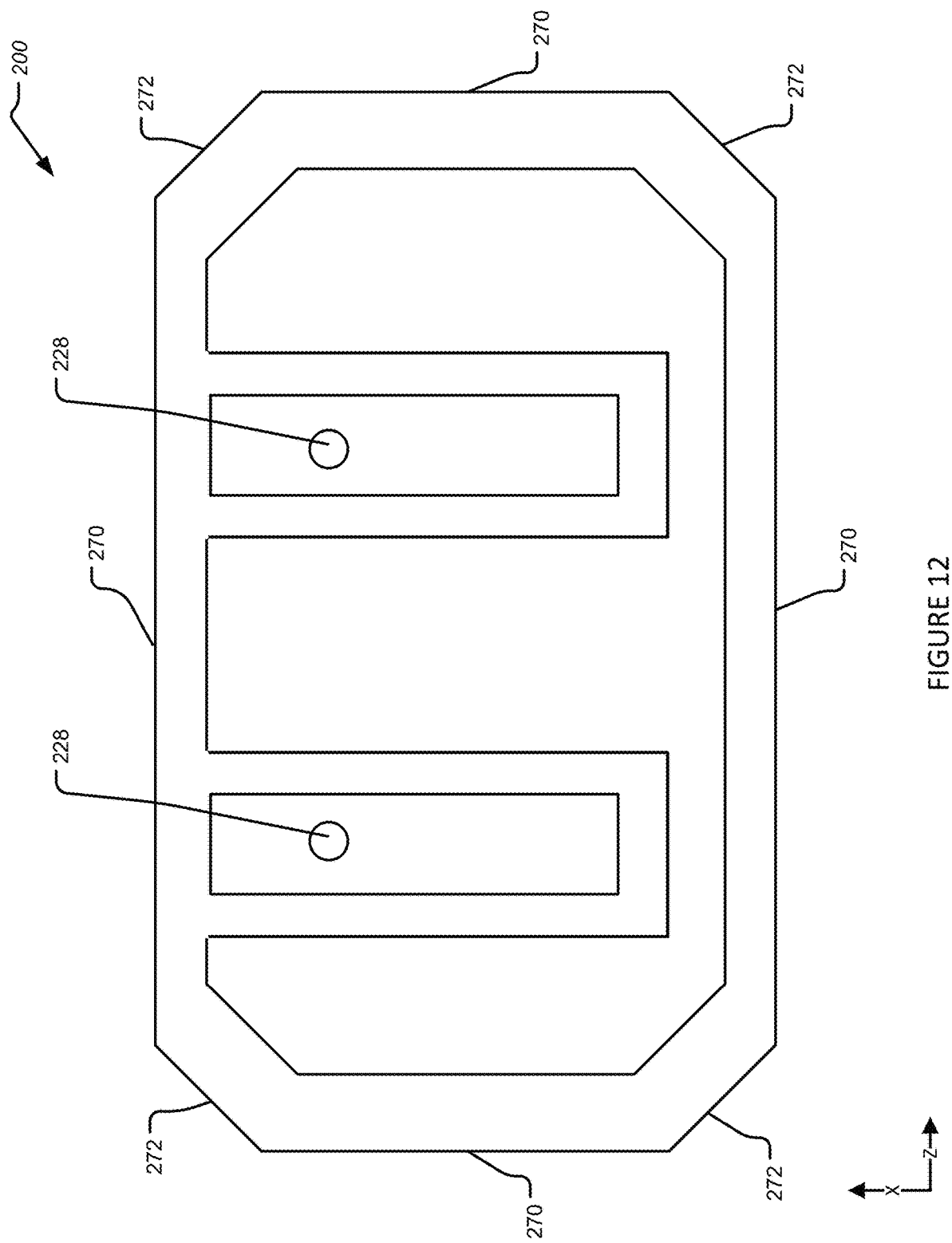
FIG. 12 is a top view of another exemplary implementation of an integrated passive device (IPD) according to aspects of the disclosure.

FIG. 12 is a top view of another exemplary implementation of an integrated passive device (IPD) according to aspects of the disclosure.

In particular, FIG. 12 illustrates another exemplary implementation of the at least one IPD component 200 without various components, such as the at least one device 202 for ease of illustration and understanding. In this regard, the aspect of FIG. 12 illustrates that the at least one IPD component 200 may include straight implementations and/or flat implementations of the at least one connection surface 272. Additionally, FIG. 12 illustrates that there are four implementations of the at least one connection surface 272 and four implementations of the sides 270. However, there may be any number of implementation to the at least one connection surface 272 and the sides 270. Additionally, FIG. 12 illustrates an implementation of the at least one IPD component 200 that has symmetry about the X axis and symmetry about the Z axis.

Accordingly, the at least one IPD component 200 and/or the substrate 204 may implement the sides 270 and the at least one connection surface 272 as illustrated in FIG. 12 to structurally form a shape that may be configured to increase efficient use of space within the package 100, as well as improve performance, reliability, and/or the like.

Figure 13:
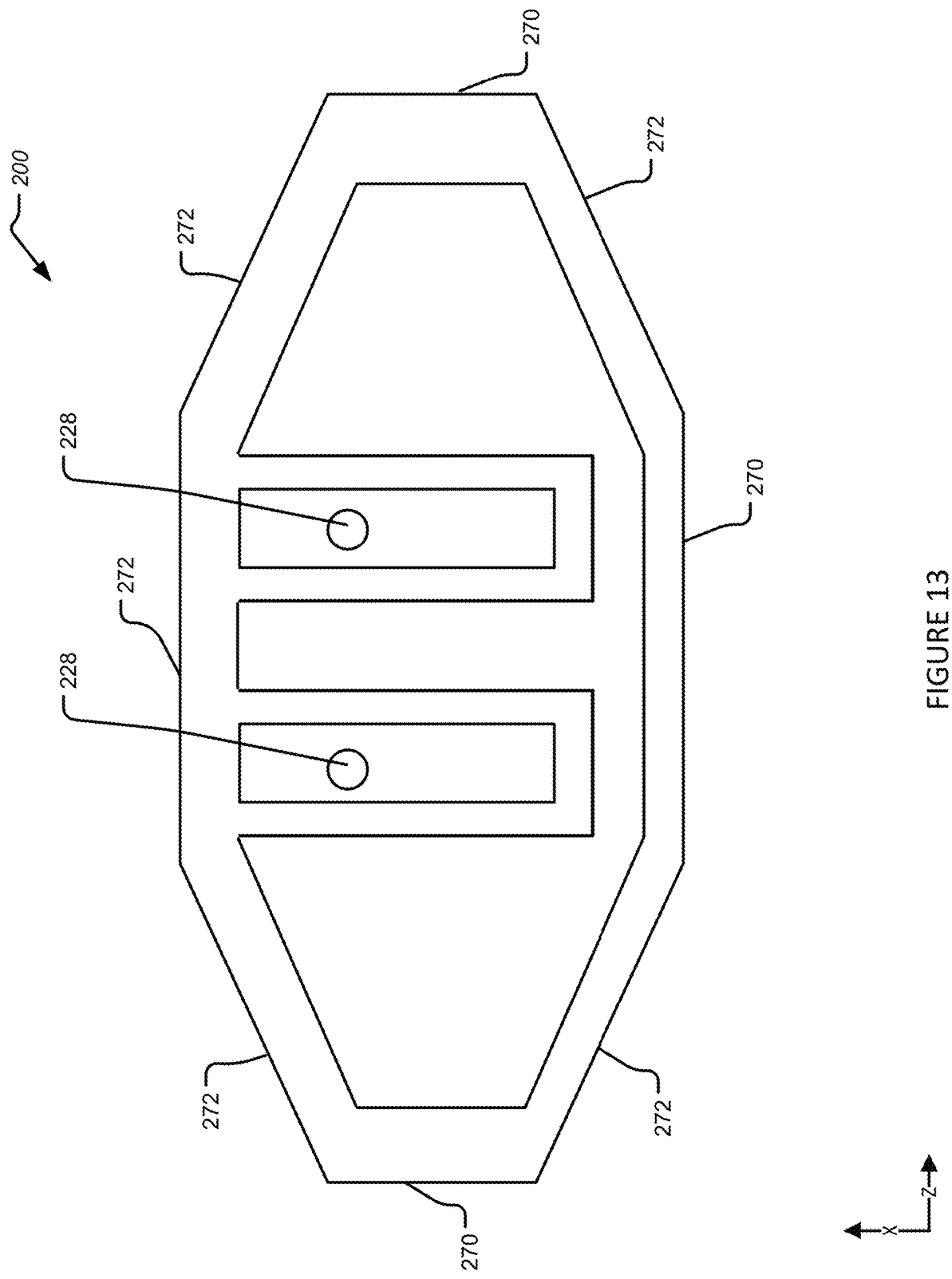
FIG. 13 is a top view of another exemplary implementation of an integrated passive device (IPD) according to aspects of the disclosure.

FIG. 13 is a top view of another exemplary implementation of an integrated passive device (IPD) according to aspects of the disclosure.

In particular, FIG. 13 illustrates another exemplary implementation of the at least one IPD component 200 without various components, such as the at least one device 202 for ease of illustration and understanding. In this regard, the aspect of FIG. 13 illustrates that the at least one IPD component 200 may include straight implementations and/or flat implementations of the at least one connection surface 272. Additionally, FIG. 13 illustrates that there are four implementations of the at least one connection surface 272 and four implementations of the sides 270. In this regard, a length of the at least one connection surface 272 may be greater than a length of one or more of the sides 270. Additionally, FIG. 13 illustrates an implementation of the at least one IPD component 200 that has symmetry about the X axis and symmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 14:
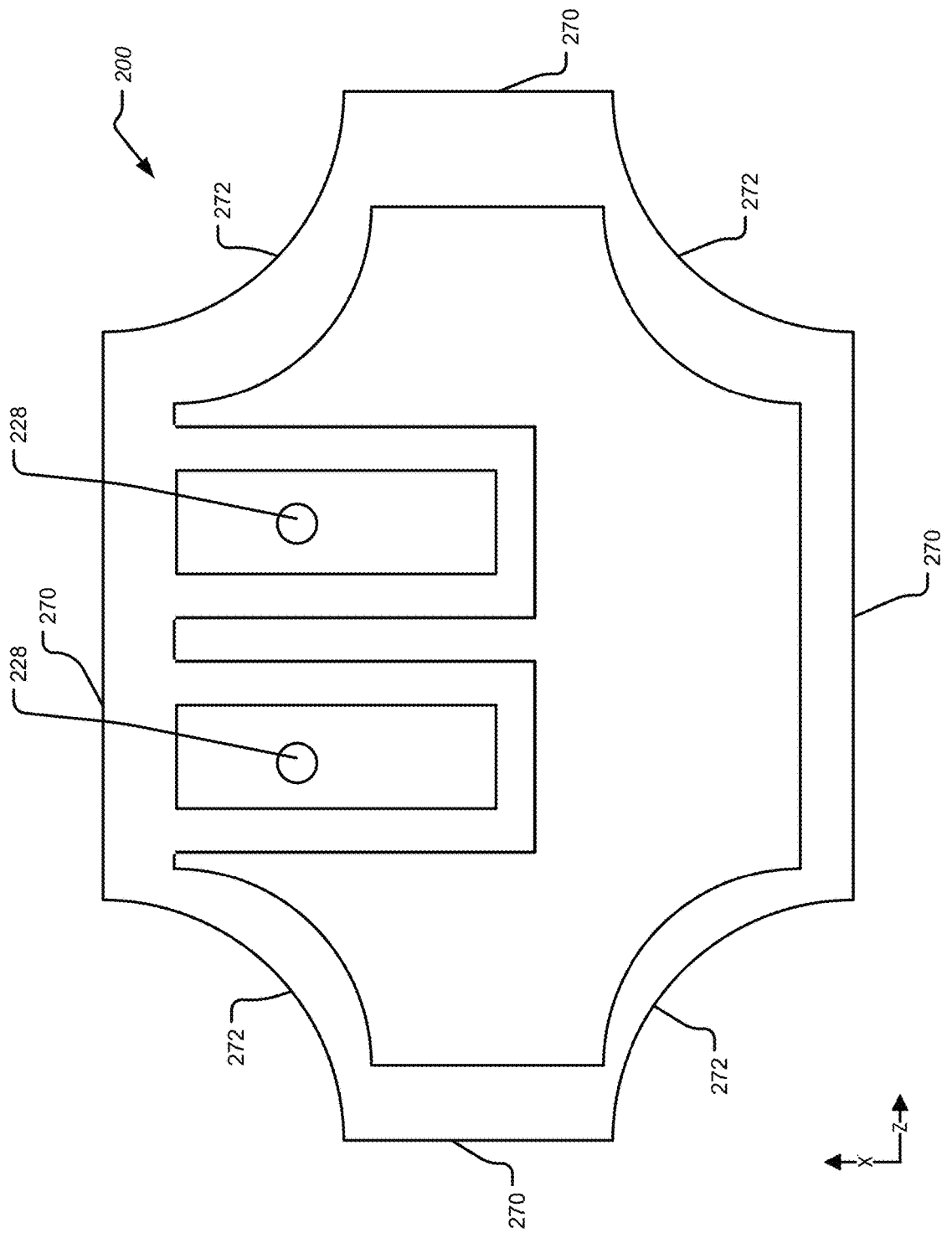
FIG. 14 is a top view of another exemplary implementation of an integrated passive device (IPD) according to aspects of the disclosure.

FIG. 14 is a top view of another exemplary implementation of an integrated passive device (IPD) according to aspects of the disclosure.

In particular, FIG. 14 illustrates another exemplary implementation of the at least one IPD component 200 without various components, such as the at least one device 202 for ease of illustration and understanding. In this regard, the aspect of FIG. 14 illustrates that the at least one IPD component 200 may include curved implementations of the at least one connection surface 272. Additionally, FIG. 14 illustrates that there are four implementations of the at least one connection surface 272 and four implementations of the sides 270. In this regard, a length of the at least one connection surface 272 may be greater than a length of one or more of the sides 270. Additionally, FIG. 14 illustrates an implementation of the at least one IPD component 200 that has symmetry about the X axis and symmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 15:
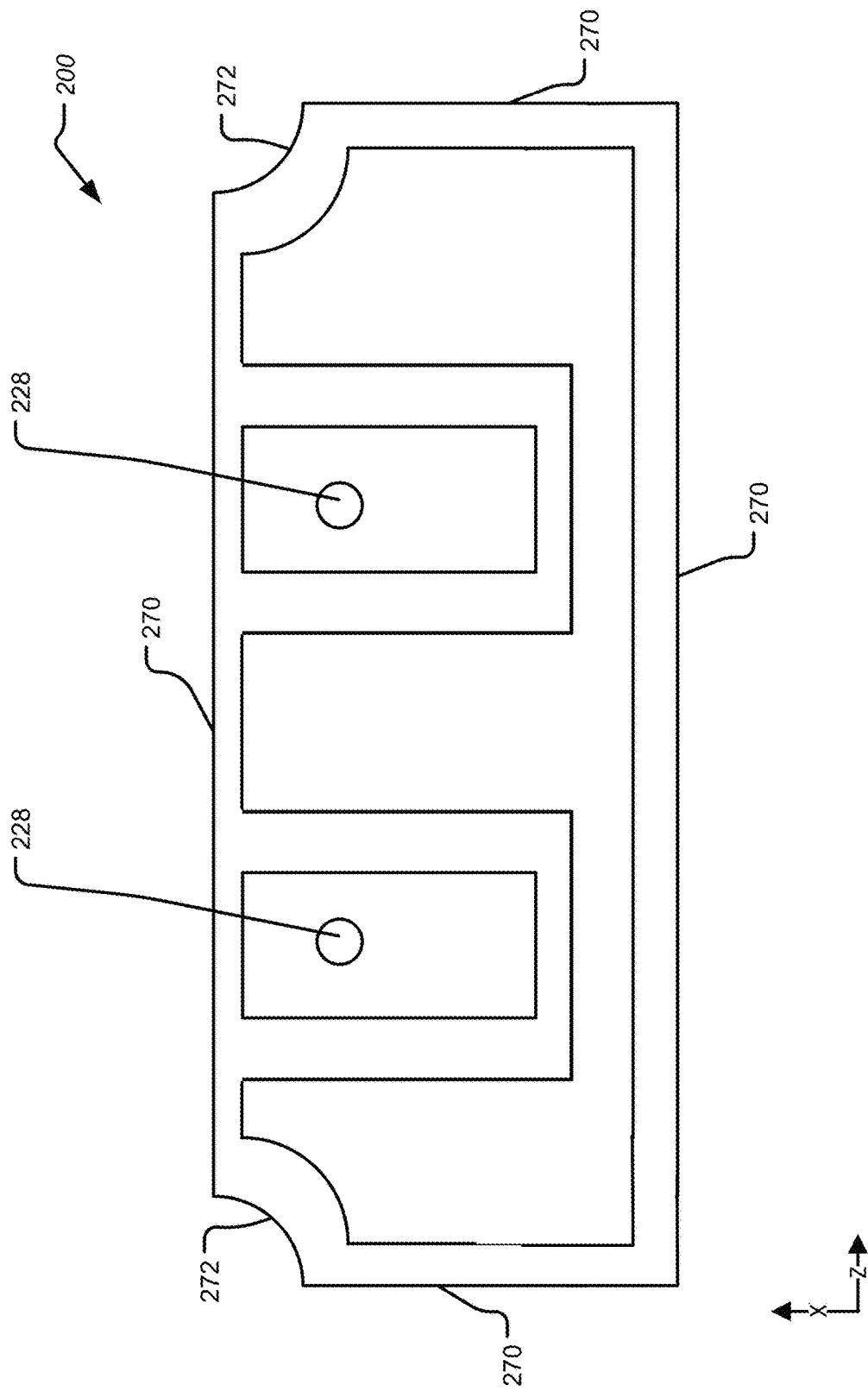
FIG. 15 is a top view of another exemplary implementation of an integrated passive device (IPD) according to aspects of the disclosure.

FIG. 15 is a top view of another exemplary implementation of an integrated passive device (IPD) according to aspects of the disclosure.

In particular, FIG. 15 illustrates another exemplary implementation of the at least one IPD component 200 without various components, such as the at least one device 202 for ease of illustration and understanding. In this regard, the aspect of FIG. 15 illustrates that the at least one IPD component 200 may include curved implementations of the at least one connection surface 272. Additionally, FIG. 15 illustrates that there are two implementations of the at least one connection surface 272 and four implementations of the sides 270. Additionally, FIG. 15 illustrates an implementation of the at least one IPD component 200 that has symmetry about the X axis and asymmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 16:
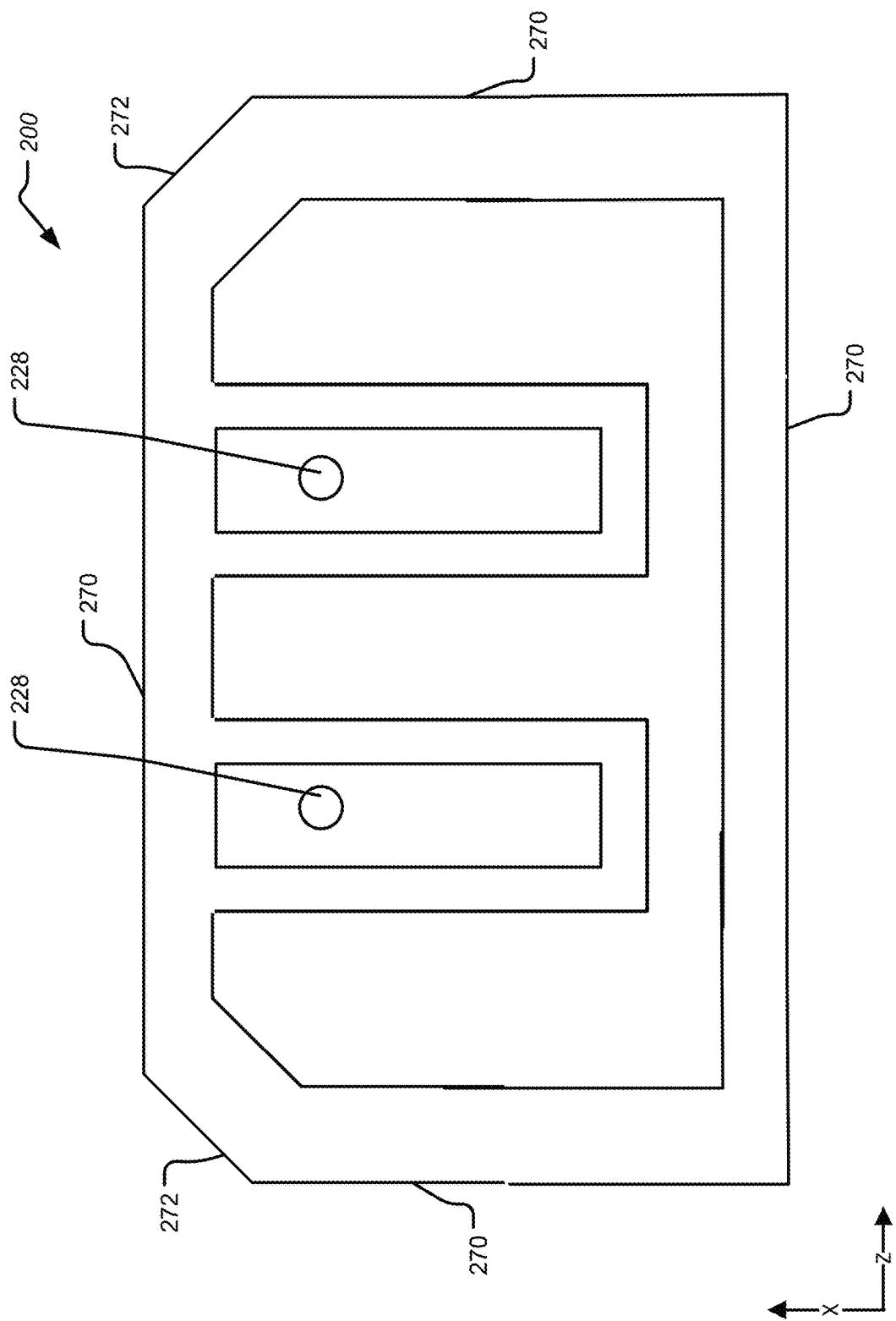
FIG. 16 is a top view of another exemplary implementation of an integrated passive device (IPD) according to aspects of the disclosure.

FIG. 16 is a top view of another exemplary implementation of an integrated passive device (IPD) according to aspects of the disclosure.

In particular, FIG. 16 illustrates another exemplary implementation of the at least one IPD component 200 without various components, such as the at least one device 202 for ease of illustration and understanding. In this regard, the aspect of FIG. 16 illustrates that the at least one IPD component 200 may include straight implementations of the at least one connection surface 272. Additionally, FIG. 16 illustrates that there are two implementations of the at least one connection surface 272 and four implementations of the sides 270. Additionally, FIG. 16 illustrates an implementation of the at least one IPD component 200 that has symmetry about the X axis and asymmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 17:
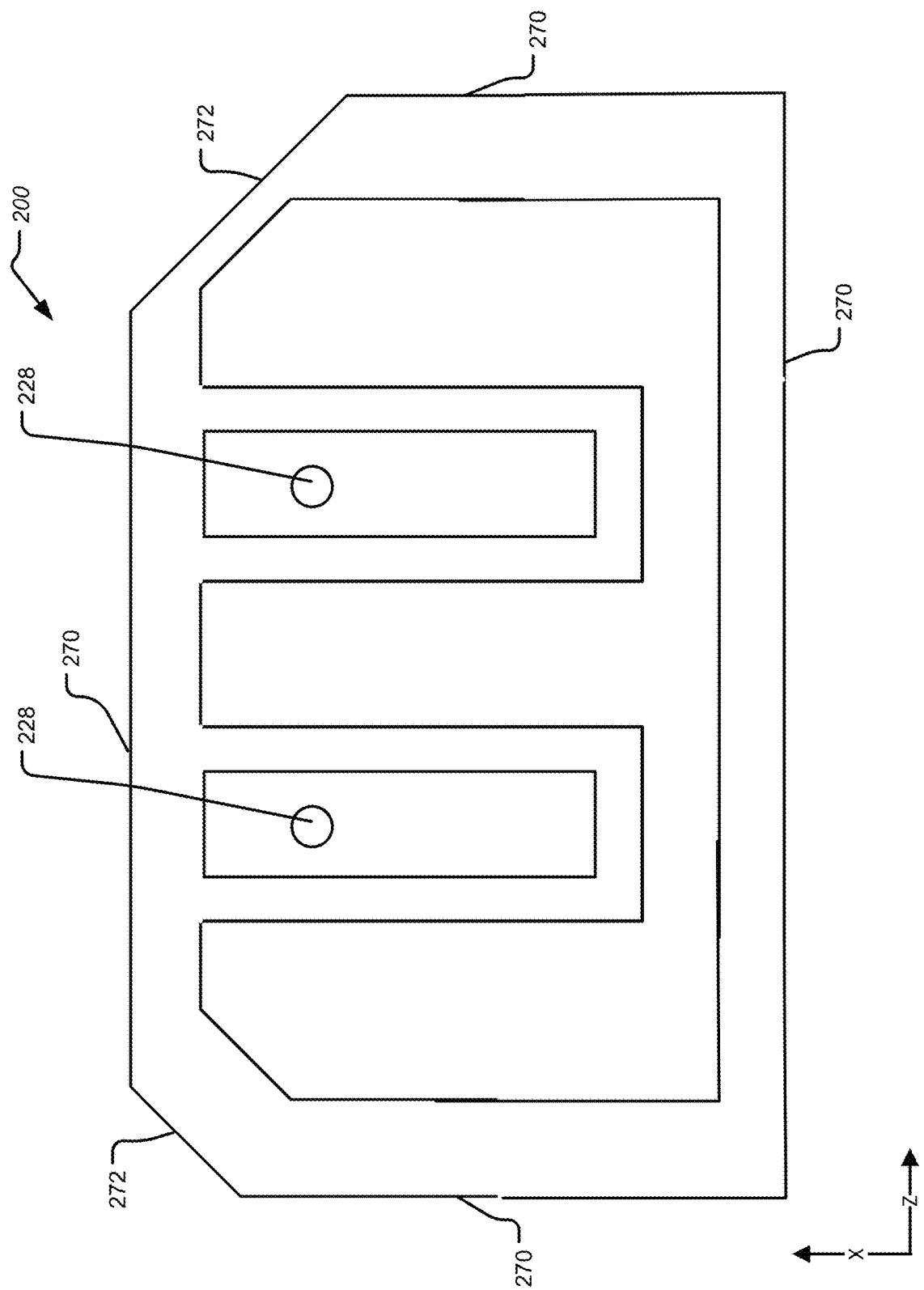
FIG. 17 is a top view of another exemplary implementation of an integrated passive device (IPD) according to aspects of the disclosure.

FIG. 17 is a top view of another exemplary implementation of an integrated passive device (IPD) according to aspects of the disclosure.

In particular, FIG. 17 illustrates another exemplary implementation of the at least one IPD component 200 without various components, such as the at least one device 202 for ease of illustration and understanding. In this regard, the aspect of FIG. 17 illustrates that the at least one IPD component 200 may include curved implementations of the at least one connection surface 272 with a greater length. Additionally, FIG. 17 illustrates that there are two implementations of the at least one connection surface 272 and four implementations of the sides 270. Additionally, FIG. 17 illustrates an implementation of the at least one IPD component 200 that has symmetry about the X axis and asymmetry about the Z axis.

Figure 18:
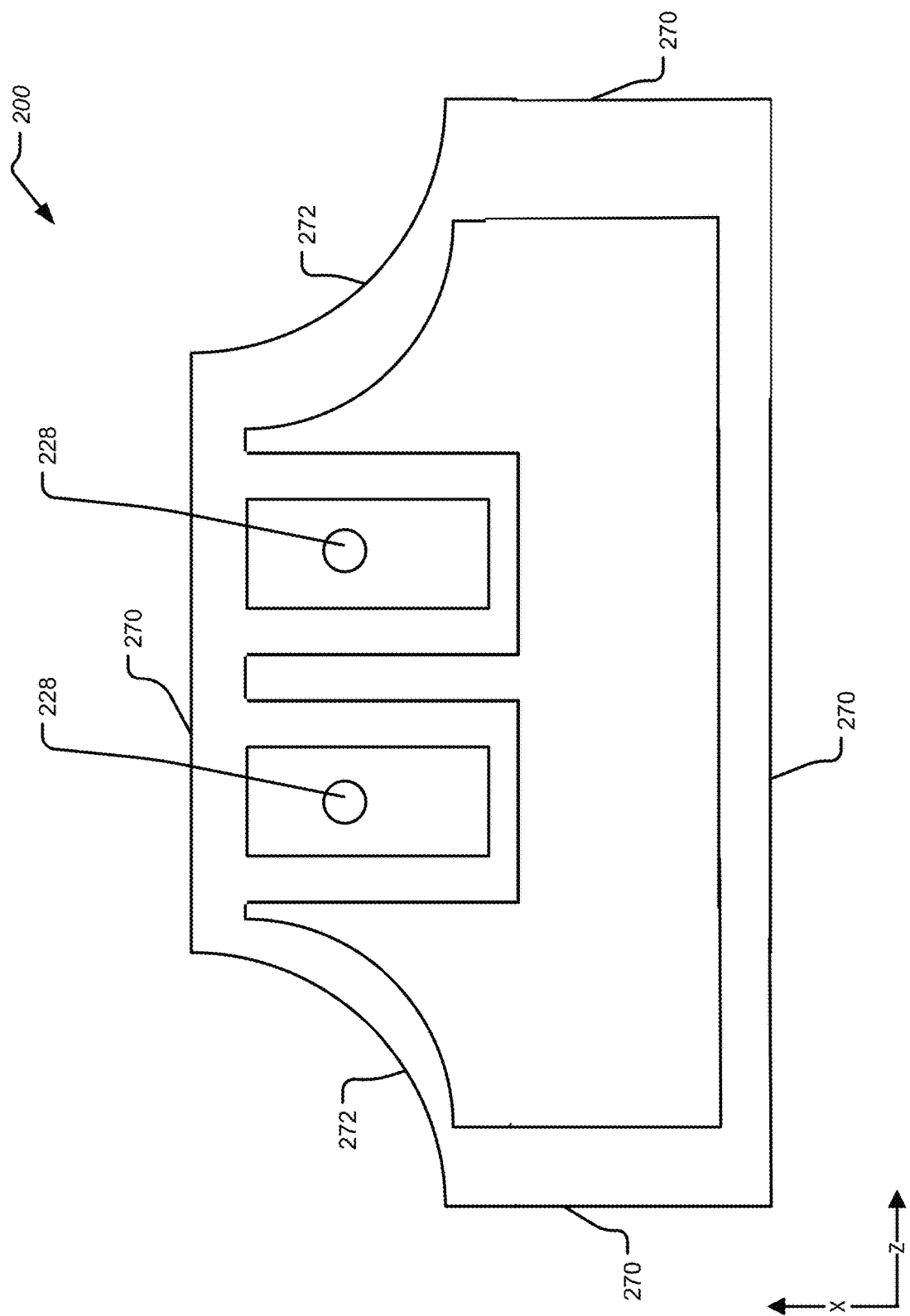
FIG. 18 is a top view of another exemplary implementation of an integrated passive device (IPD) according to aspects of the disclosure.

FIG. 18 is a top view of another exemplary implementation of an integrated passive device (IPD) according to aspects of the disclosure.

In particular, FIG. 18 illustrates another exemplary implementation of the at least one IPD component 200 without various components, such as the at least one device 202 for ease of illustration and understanding. In this regard, the aspect of FIG. 18 illustrates that the at least one IPD component 200 may include straight implementations of the at least one connection surface 272 of different lengths. Additionally, FIG. 18 illustrates that there are two implementations of the at least one connection surface 272 and four implementations of the sides 270. Additionally, FIG. 18 illustrates an implementation of the at least one IPD component 200 that has asymmetry about the X axis and asymmetry about the Z axis.

Figure 19:
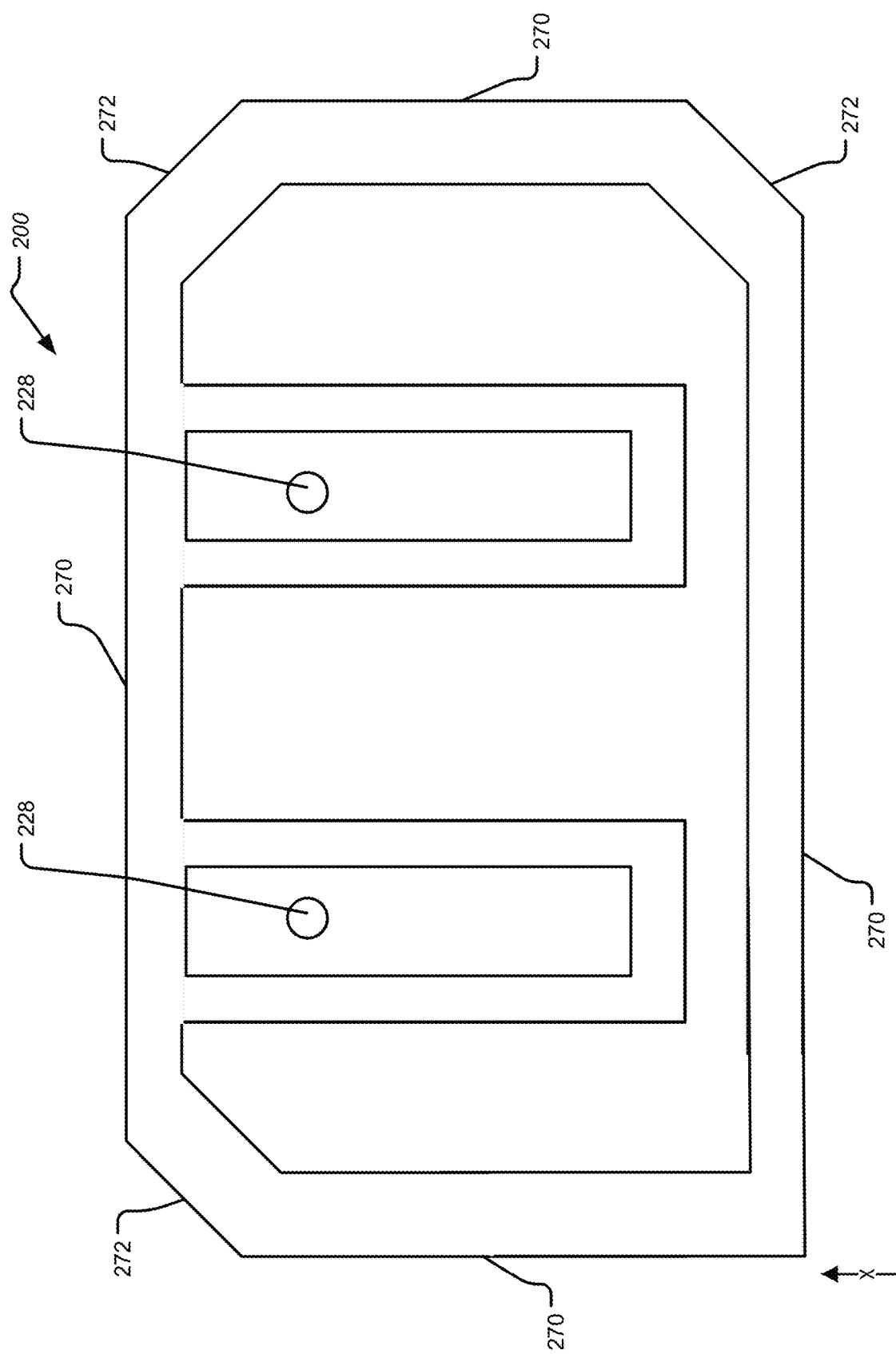
FIG. 19 is a top view of another exemplary implementation of an integrated passive device (IPD) according to aspects of the disclosure.

FIG. 19 is a top view of another exemplary implementation of an integrated passive device (IPD) according to aspects of the disclosure.

In particular, FIG. 19 illustrates another exemplary implementation of the at least one IPD component 200 without various components, such as the at least one device 202 for ease of illustration and understanding. In this regard, the aspect of FIG. 19 illustrates that the at least one IPD component 200 may include straight implementations of the at least one connection surface 272. Additionally, FIG. 19 illustrates that there are three implementations of the at least one connection surface 272 and four implementations of the sides 270. Additionally, FIG. 19 illustrates an implementation of the at least one IPD component 200 that has asymmetry about the X axis and asymmetry about the Z axis.

Figure 20:
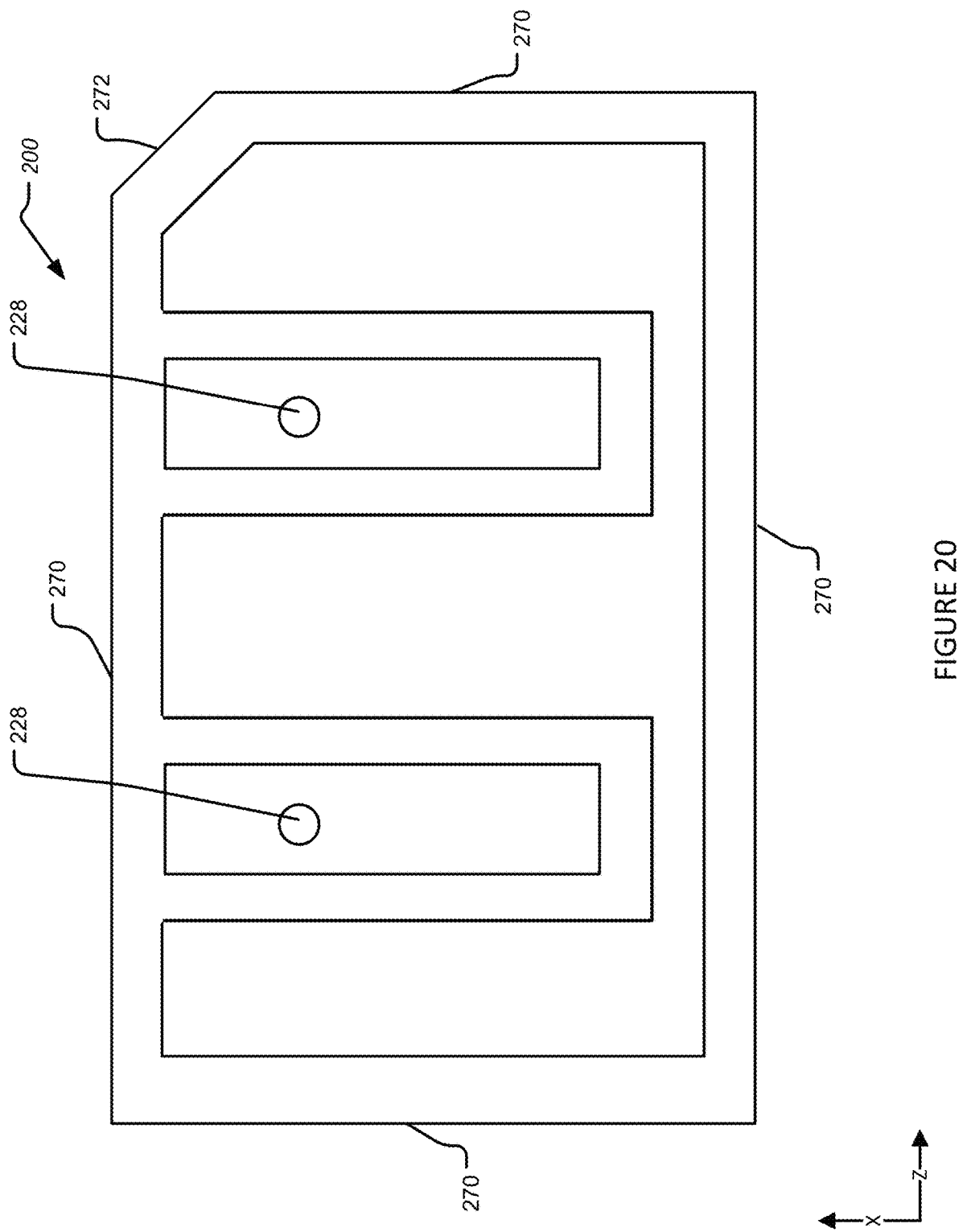
FIG. 20 is a top view of another exemplary implementation of an integrated passive device (IPD) according to aspects of the disclosure.

FIG. 20 is a top view of another exemplary implementation of an integrated passive device (IPD) according to aspects of the disclosure.

In particular, FIG. 20 illustrates another exemplary implementation of the at least one IPD component 200 without various components, such as the at least one device 202 for ease of illustration and understanding. In this regard, the aspect of FIG. 20 illustrates that the at least one IPD component 200 may include straight implementations of the at least one connection surface 272. Additionally, FIG. 20 illustrates that there is a single implementation of the at least one connection surface 272 and four implementations of the sides 270. Additionally, FIG. 20 illustrates an implementation of the at least one IPD component 200 that has asymmetry about the X axis and asymmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 21:
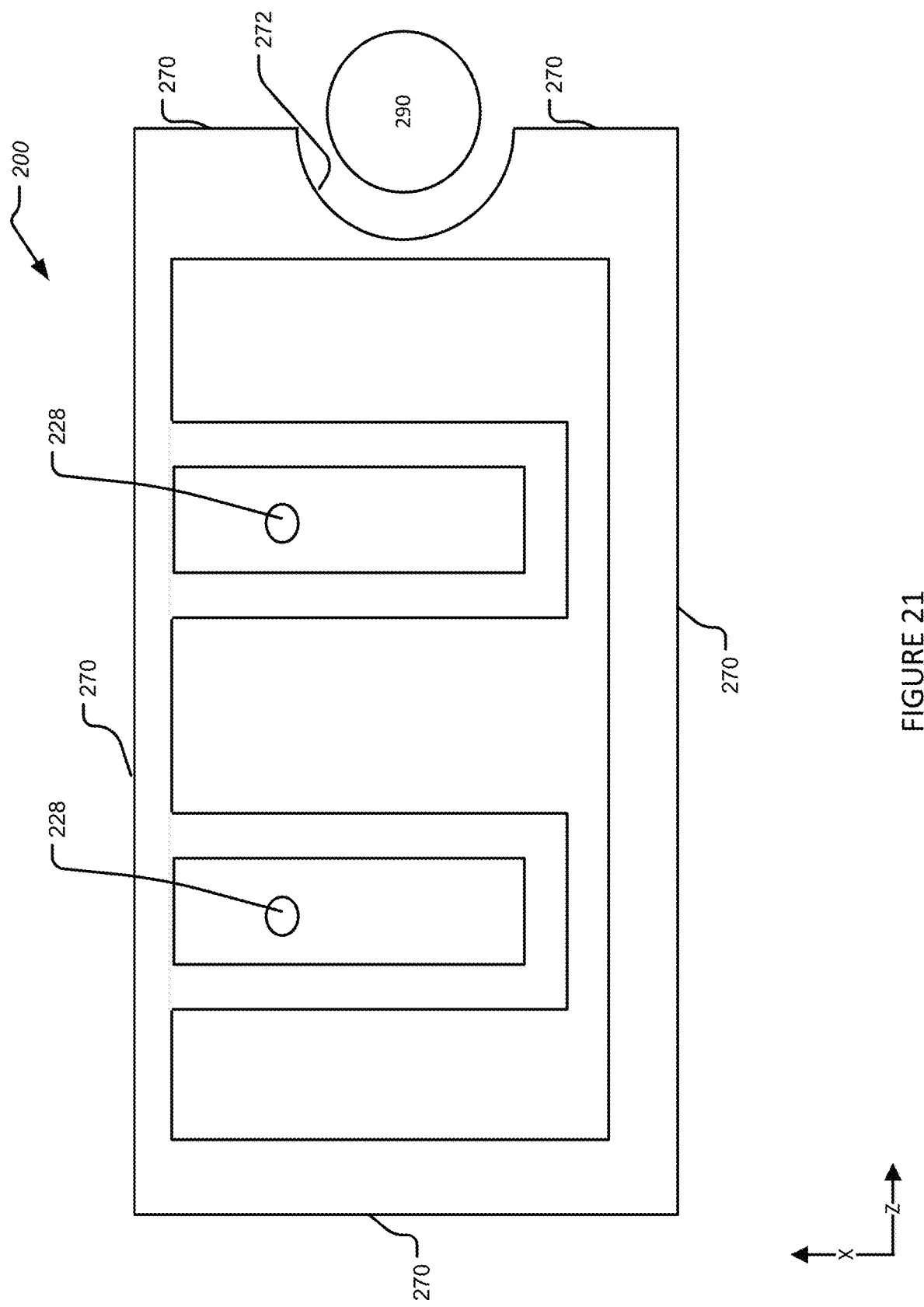
FIG. 21 is a top view of another exemplary implementation of an integrated passive device (IPD) according to aspects of the disclosure.

FIG. 21 is a top view of another exemplary implementation of an integrated passive device (IPD) according to aspects of the disclosure.

In particular, FIG. 21 illustrates another exemplary implementation of the at least one IPD component 200 without various components, such as the at least one device 202 for ease of illustration and understanding. In this regard, the aspect of FIG. 21 illustrates that the at least one IPD component 200 may include a curved implementation of the at least one connection surface 272. Additionally, FIG. 21 illustrates that there is a single implementation of the at least one connection surface 272 and five implementations of the sides 270. Additionally, FIG. 21 illustrates an implementation of the at least one IPD component 200 that has asymmetry about the X axis and symmetry about the Z axis.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

Figure 22:
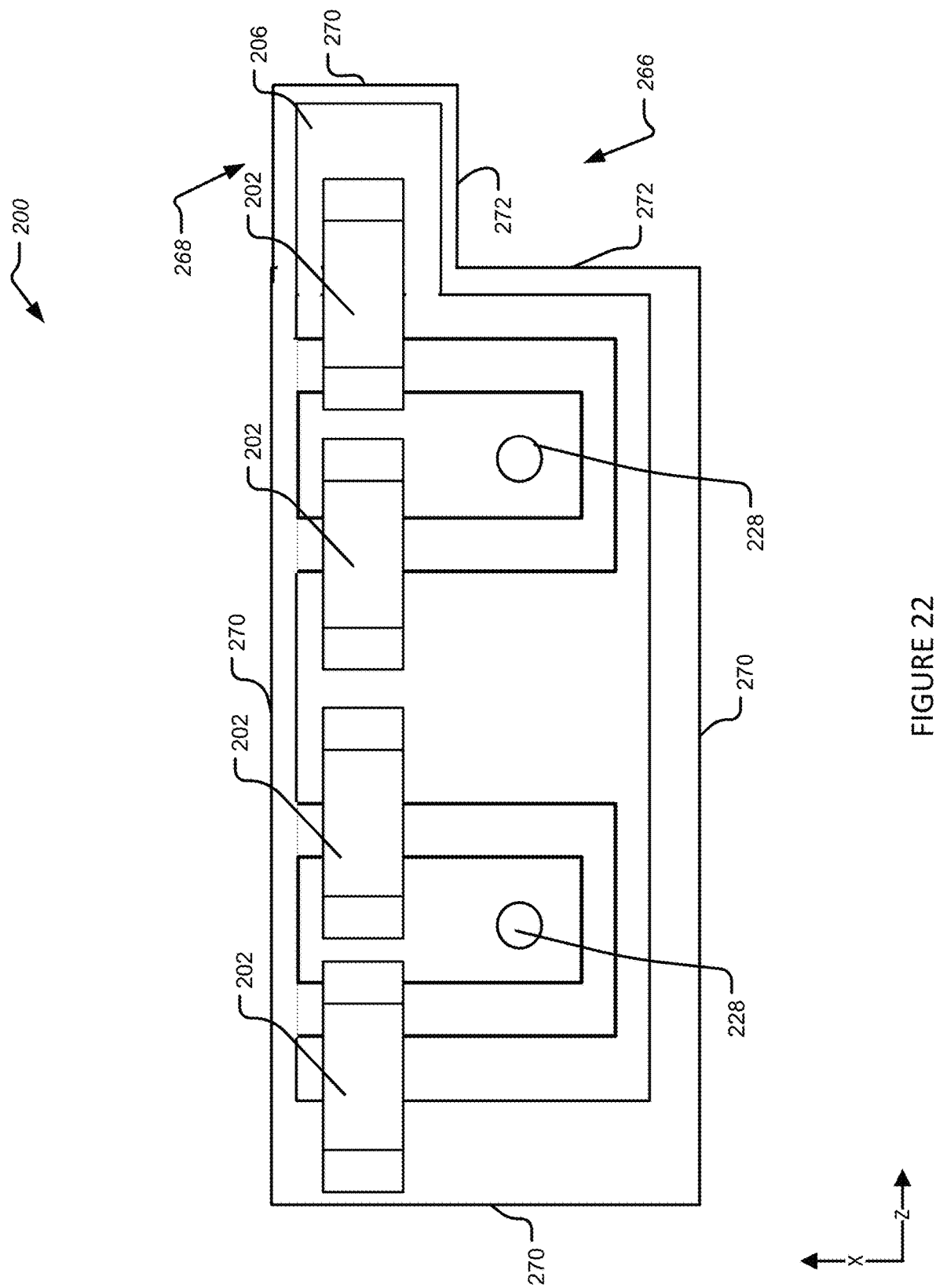
FIG. 22 is a top view of another exemplary implementation of an integrated passive device (IPD) according to aspects of the disclosure.

FIG. 22 is a top view of another exemplary implementation of an integrated passive device (IPD) according to aspects of the disclosure.

In particular, FIG. 22 illustrates another exemplary implementation of the at least one IPD component 200 without various components for ease of illustration and understanding. In this regard, the aspect of FIG. 22 illustrates that the at least one IPD component 200 may include straight implementations of the at least one connection surface 272. Additionally, FIG. 22 illustrates that there are two implementations of the at least one connection surface 272 and four implementations of the sides 270. Additionally, FIG. 22 illustrates an implementation of the at least one IPD component 200 that has asymmetry about the X axis and asymmetry about the Z axis.

FIG. 22 further illustrates that the at least one IPD component 200 may include implementations of the at least one connection surface 272 and implementations of the sides 270 that form an extension 268 and/or a notch 266. Moreover, FIG. 22 further illustrates that the extension 268 of the at least one IPD component 200 may include and/or support at least in part the at least one device 202 and/or may include at least in part a portion of an implementation of the plurality interconnect pads 206.

Figure 23A:
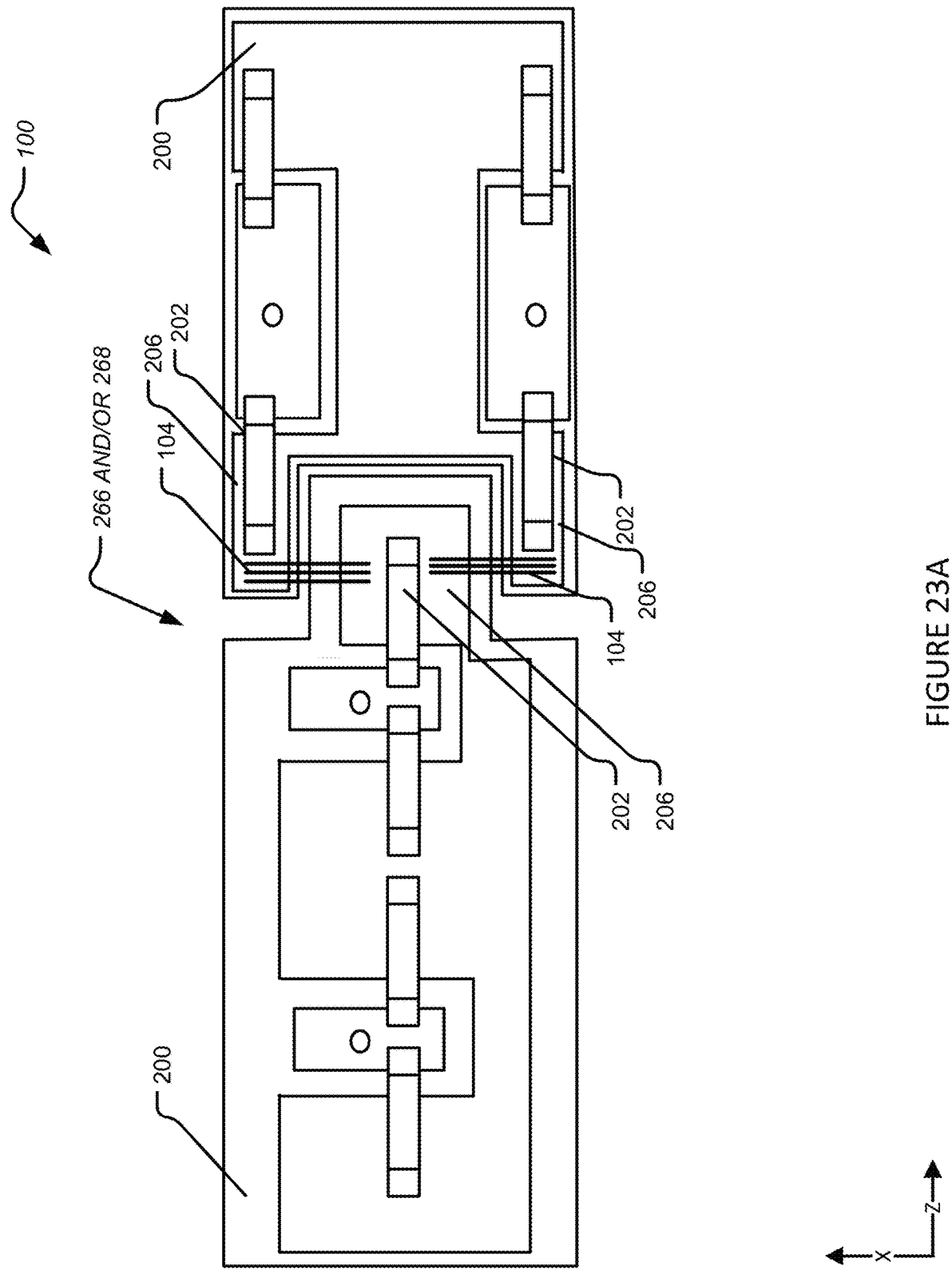
FIG. 23A is a top view of exemplary implementations of integrated passive devices (IPDs) according to aspects of the disclosure.
Figure 23B:
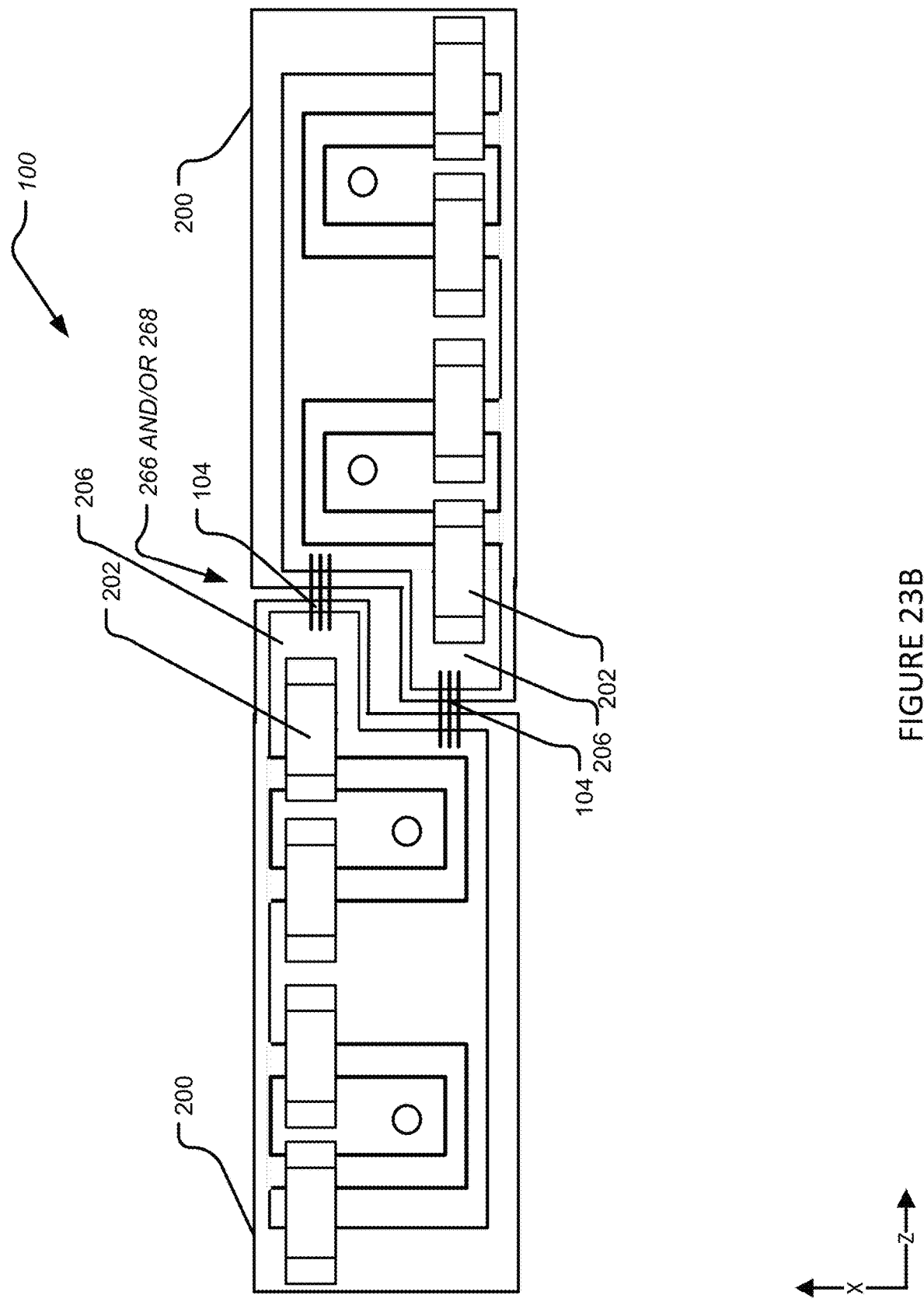
FIG. 23B is a top view of exemplary implementations of integrated passive devices (IPDs) according to aspects of the disclosure.

Accordingly, the plurality interconnect pads 206 may form a location for connection to an implementation of the one or more interconnects 104 that may connect to another implementation of the at least one IPD component 200 as illustrated in FIG. 23B. In this regard, the at least one IPD component 200 may support an implementation of the at least one device 202 and/or an implementation of the plurality interconnect pads 206 at least in part on the extension 268 such that connections, such as the one or more interconnects 104 or wire bonds may be shortened to provide better performance in addition to spatial efficiency.

Accordingly, the at least one IPD component 200 and/or the substrate 204 may implement the sides 270 and the at least one connection surface 272 to structurally form a shape that may be configured to increase efficient use of space within the package 100, as well as improve performance, reliability, and/or the like.

FIG. 23A is a top view of exemplary implementations of integrated passive devices (IPDs) according to aspects of the disclosure.

FIG. 23B is a top view of exemplary implementations of integrated passive devices (IPDs) according to aspects of the disclosure.

In particular, FIG. 23A and FIG. 23B illustrate exemplary implementations of the at least one IPD component 200 without various components for ease of illustration and understanding. In this regard, FIG. 23A and FIG. 23B illustrate a shape, arrangement and/or configuration of the at least one connection surface 272 and the sides 270 of two adjacent implementations of the at least one IPD component 200 that may fit together like a jigsaw puzzle to make for efficient use of space. In other words, a shape, arrangement and/or configuration of the at least one connection surface 272 and the sides 270 of two adjacent implementations of the at least one IPD component 200 may correspond, mirror, match, and/or the like.

FIG. 23A and FIG. 23B further illustrate implementations of the at least one IPD component 200 that may each include an extension 268 and/or a notch 266. Moreover, FIG. 23A and FIG. 23B further illustrate that the extension 268 may include at least a portion of an implementation of the plurality interconnect pads 206 with implementations of the one or more interconnects 104 that may connect between adjacent implementations of the at least one IPD component 200. Further, FIG. 23A and FIG. 23B further illustrate that the extension 268 may include and/or support at least in part implementations of the at least one device 202.

Additionally, a shape, arrangement and/or configuration of the at least one connection surface 272 and the sides 270 of two adjacent implementations of the at least one IPD component 200 that fit together may provide better performance due to arranging and/or locating components on the different implementations of the at least one IPD component 200 closer together. In this regard, the at least one IPD component 200 may support an implementation of the at least one device 202 and/or an implementation of the plurality interconnect pads 206 at least in part on the extension 268 such that connections, such as the one or more interconnects 104 or wire bonds may be shortened to provide better performance in addition to spatial efficiency.

It should be noted that the arrangement of the at least one connection surface 272 and the sides 270 illustrated in FIG. 23A and FIG. 23B are merely exemplary and any other shapes that fit together are contemplated by this disclosure. In other words, other shapes of the at least one IPD component 200 that fit together to make for efficient use of space are contemplated as well. Moreover, other shapes of the at least one IPD component 200 that do not fit together are additionally contemplated, which may or may not more efficiently utilize space.

Figure 24A:
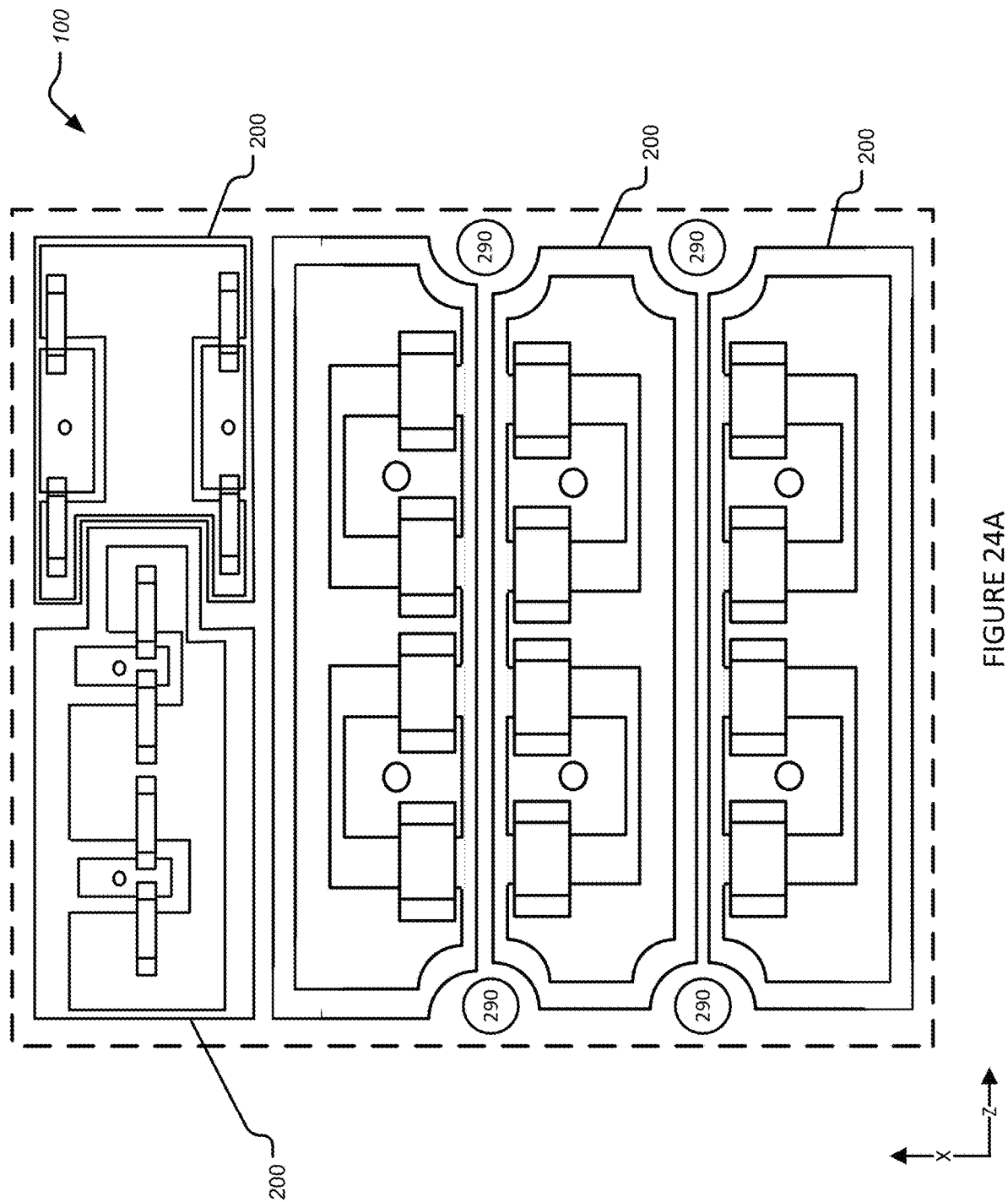
FIG. 24A illustrates a top view of a package according to the disclosure.

FIG. 24A illustrates a top view of a package according to the disclosure.

In particular, FIG. 24A illustrates an arrangement of the at least one IPD component 200, and/or the like without various components to provide clarity of understanding. Additionally, FIG. 24A illustrates that the package 100 may include at least one structural feature 290. In this regard, the package 100 may require the at least one structural feature 290 that may include one or more fasteners, terminals, housing structures, and/or the like. For example, the at least one structural feature 290 may be located in and/or on the support 102. As a further example, the at least one structural feature 290 may include one or more fasteners implemented as rivets, rivets located on the support 102, and/or the like. The at least one structural feature 290 of the package 100 may reduce the usable space.

The at least one structural feature 290 would typically prevent a square or rectangular substrate from being able to fit into the package 100. However, the disclosed implementation of the at least one IPD component 200 provides a modified shape to allow the at least one IPD component 200 to fit within the package 100. In particular, the various components of the package 100 including the at least one IPD component 200, the one or more semiconductor devices 400, and/or the like may fit into the package 100 like pieces in a jigsaw puzzle.

Figure 24B:
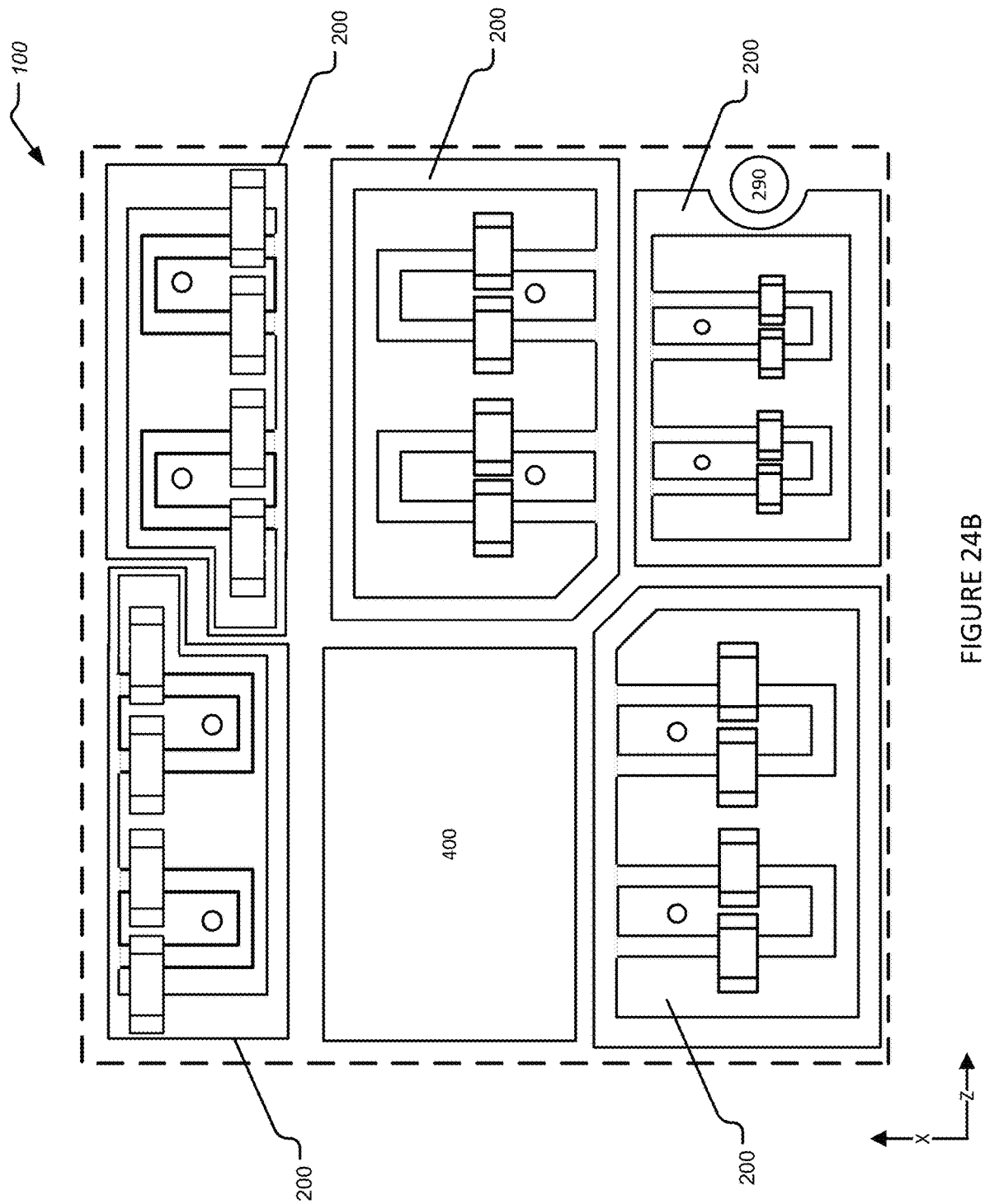
FIG. 24B illustrates a top view of a package according to the disclosure.

FIG. 24B illustrates a top view of a package according to the disclosure.

In particular, FIG. 24B illustrates an arrangement of the at least one IPD component 200, the one or more semiconductor devices 400, and/or the like without various components to provide clarity of understanding. Additionally, FIG. 24B illustrates that the package 100 may include at least one structural feature 290. In this regard, the package 100 may require the at least one structural feature 290 that may include one or more fasteners, terminals, housing structures, and/or the like. For example, the at least one structural feature 290 may be located in and/or on the support 102. As a further example, the at least one structural feature 290 may include one or more fasteners implemented as rivets, rivets located on the support 102, and/or the like. The at least one structural feature 290 of the package 100 may reduce the usable space.

The at least one structural feature 290 would typically prevent a square or rectangular substrate from being able to fit into the package 100. However, the disclosed implementation of the at least one IPD component 200 provides a modified shape to allow the at least one IPD component 200 to fit within the package 100. In particular, the various components of the package 100 including the at least one IPD component 200, the one or more semiconductor devices 400, and/or the like may fit into the package 100 like pieces in a jigsaw puzzle.

In this regard, FIG. 24A and FIG. 24B illustrate a shape, arrangement and/or configuration of the at least one connection surface 272 and the sides 270 of adjacent implementations of the at least one IPD component 200 that may fit together like a jigsaw puzzle to make for efficient use of space. In other words, a shape, arrangement and/or configuration of the at least one connection surface 272 and the sides 270 of adjacent implementations of the at least one IPD component 200 may correspond, mirror, match, and/or the like. Additionally, a shape, arrangement and/or configuration of the at least one connection surface 272 and the sides 270 of adjacent implementations of the at least one IPD component 200 that fit together may provide better performance due to arranging and/or locating components on the different implementations of the at least one IPD component 200 closer together.

It should be noted that the arrangement of the at least one connection surface 272 and the sides 270 illustrated in FIG. 24A and FIG. 24B are merely exemplary and any other shapes that fit together are contemplated by this disclosure. In other words, other shapes of the at least one IPD component 200 that fit together to make for efficient use of space are contemplated as well. Moreover, other shapes of the at least one IPD component 200 that do not fit together are additionally contemplated, which may or may not more efficiently utilize space.

Figure 25:
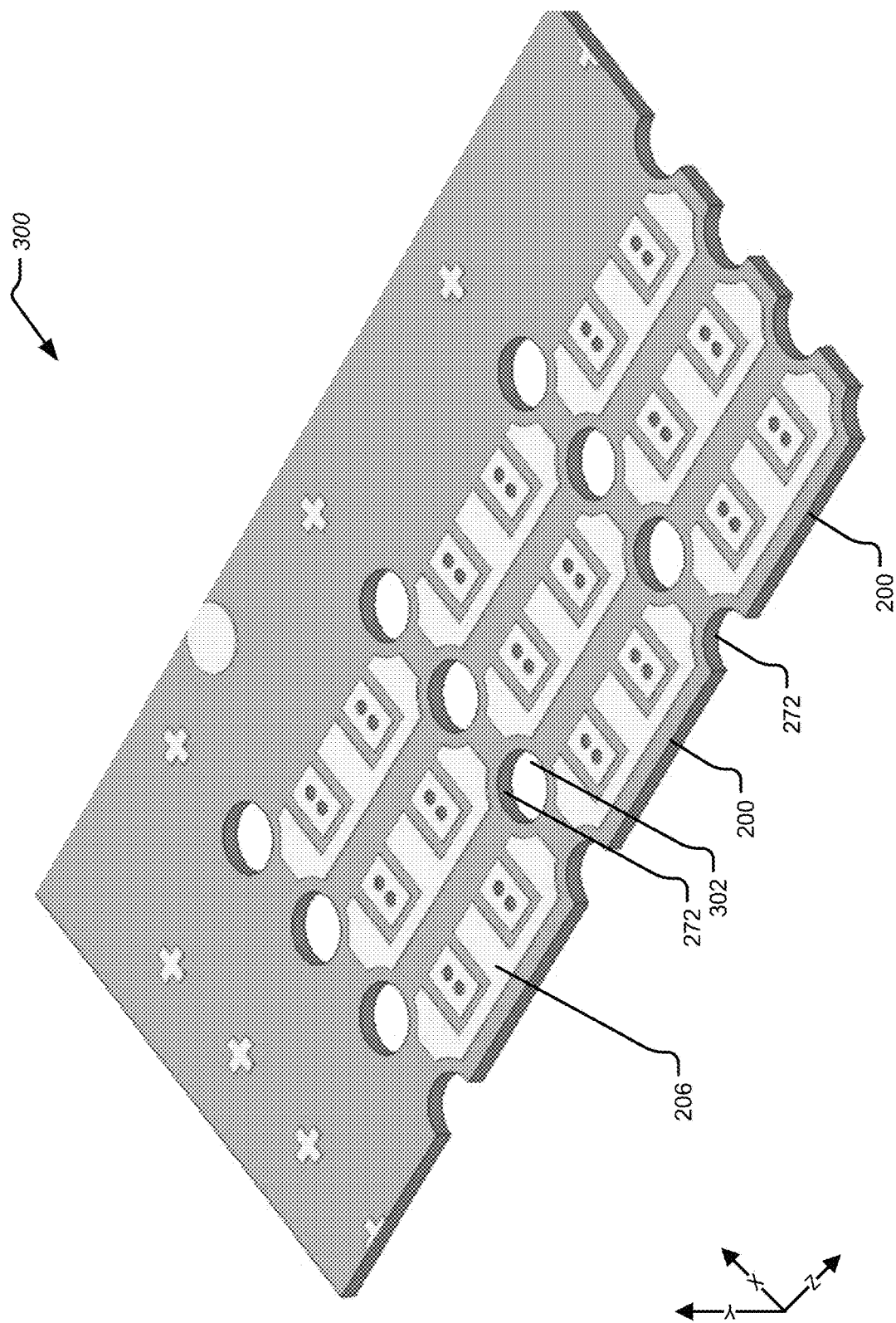
FIG. 25 illustrates an intermediate configuration of a plurality of the integrated passive device (IPD) according to the disclosure.

FIG. 25 illustrates an intermediate configuration of a plurality of the integrated passive device (IPD) according to the disclosure.

In particular, FIG. 25 illustrates a parent PCB panel 300 for a plurality of the at least one IPD component 200 with the plurality interconnect pads 206 arranged on an upper surface of the parent PCB panel 300. Additionally, FIG. 25 illustrates modifications 302 to the parent PCB panel 300 in order to form the at least one connection surface 272. In this regard, the irregular shape or modified shape of the at least one IPD component 200 may be implemented utilizing a number of different approaches, such as any one or more of a drill hole, a combination of drill holes, a combination of drill holes of different sizes, a saw pattern, a dice pattern, and/or the like on the parent PCB panel 300. As illustrated in FIG. 25, the modifications 302 to the parent PCB panel 300 in order to form the at least one connection surface 272 may include appropriate sized drill holes, routed openings, and/or the like. Additionally, the parent PCB panel 300 may include alignment marks, fiducials, cross marks, and/or the like that may be placed on an upper surface of the parent PCB panel 300 to provide visual guidance during the process of modifying, sawing, dicing, and/or the like the parent PCB panel 300.

In particular exemplary aspects, FIG. 25 illustrates the PCB panel before the SMD components are attached and before the panel is sawn/diced into individual components. Large drill openings (or routed openings) have been made in the PCB panel strip at the four corners of each component. Alignment marks and fiducials (crosses) are also placed on the PCB strip as visual guidance during saw/dicing.

Figure 26:
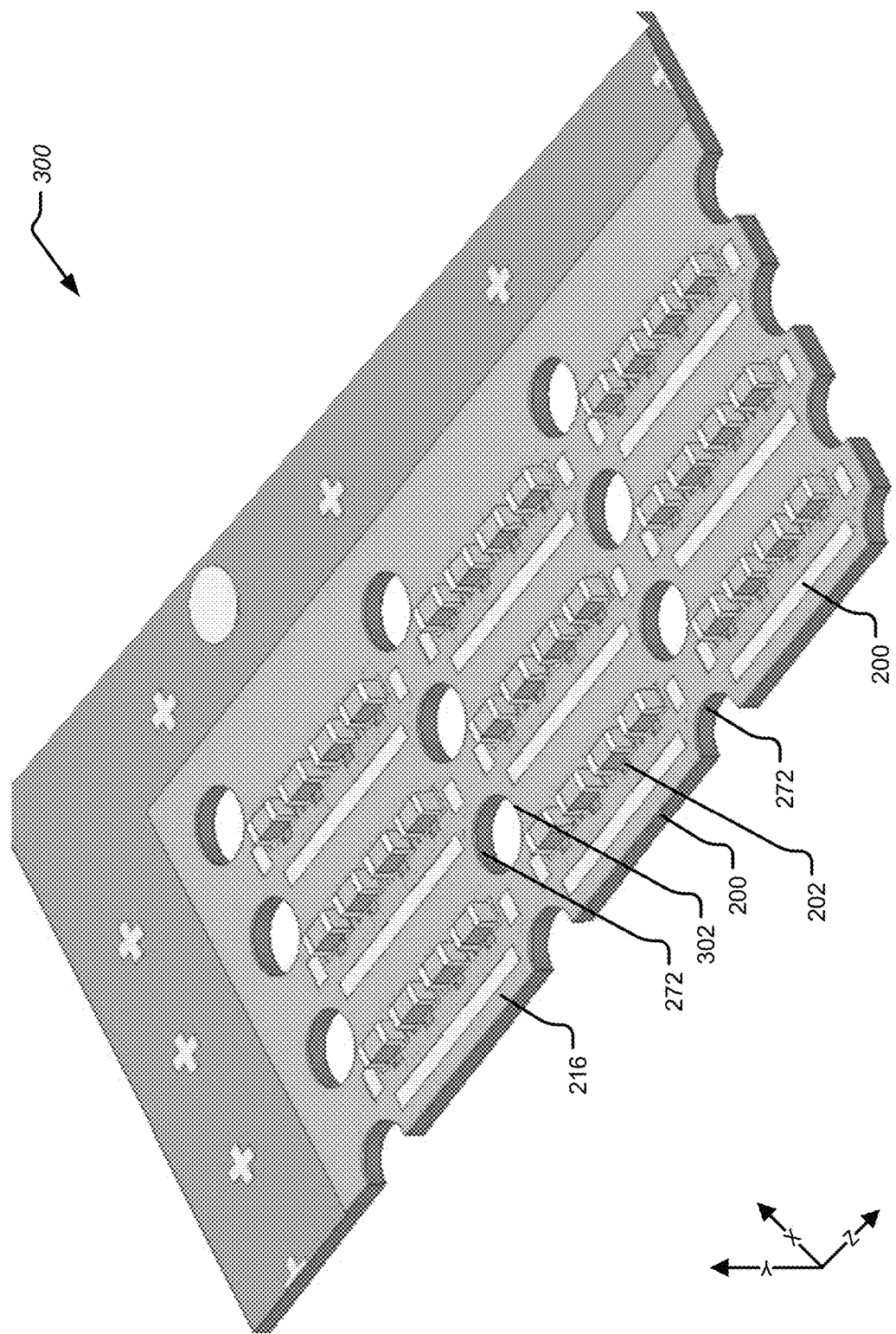
FIG. 26 illustrates a further intermediate configuration of a plurality of the integrated passive device (IPD) according to the disclosure.

FIG. 26 illustrates a further intermediate configuration of a plurality of the integrated passive device (IPD) according to the disclosure.

In particular, FIG. 26 may be a next configuration of the parent PCB panel 300 in manufacture of the at least one IPD component 200. More specifically, FIG. 26 shows the parent PCB panel 300 that has been modified to include the at least one device 202 and the solder barrier 216.

In particular aspects, FIG. 26 illustrates the PCB panel after the SMD components are attached onto the PCB. The solder mask for protecting the bond-pads is also seen in this figure. The dicing process happens after the SMD components are soldered onto the PCB.

Figure 27:
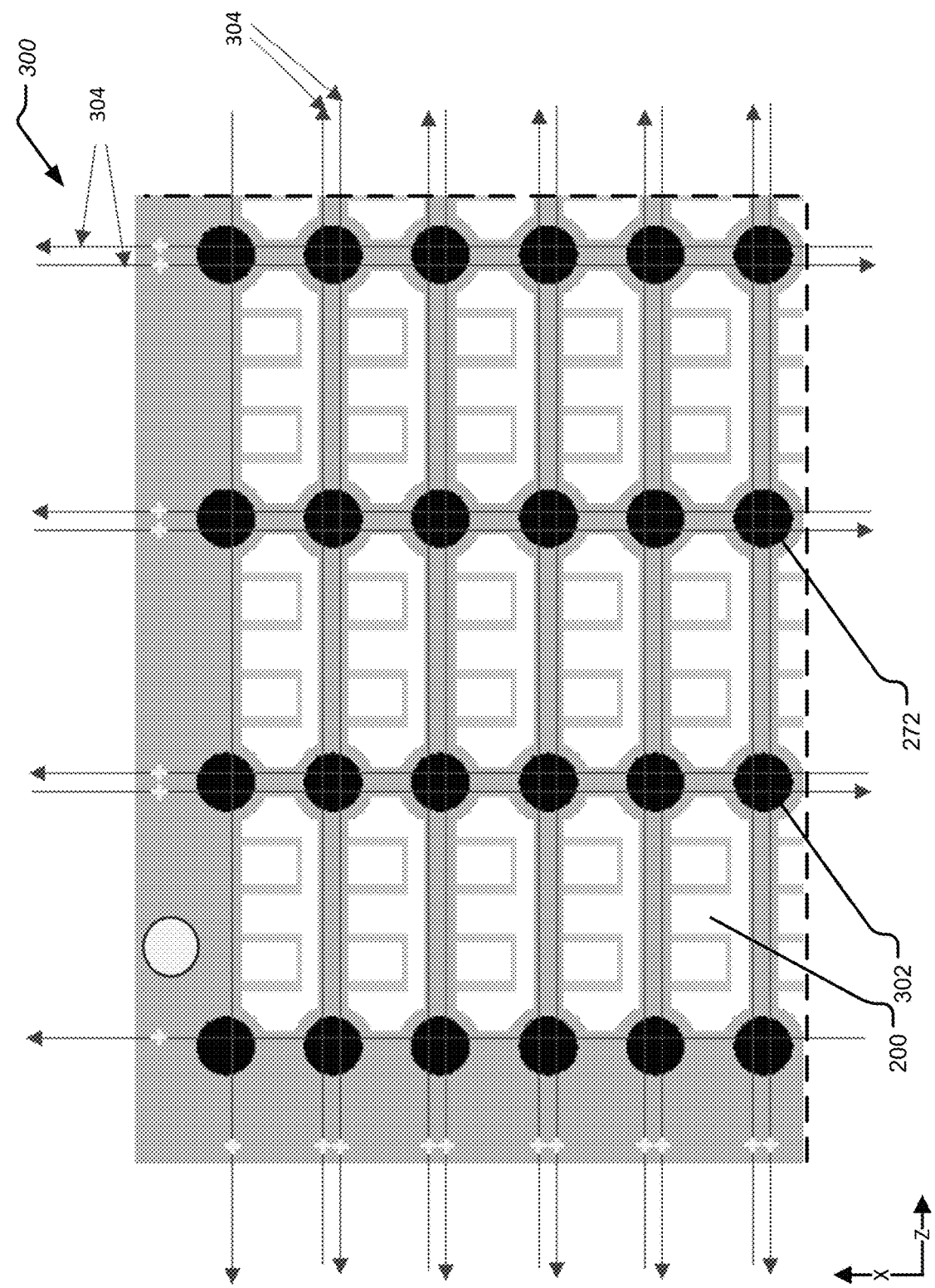
FIG. 27 illustrates a further intermediate configuration of a plurality of the integrated passive device (IPD) according to the disclosure.

FIG. 27 illustrates a further intermediate configuration of a plurality of the integrated passive device (IPD) according to the disclosure.

In particular, FIG. 27 illustrates lines 304 where the parent PCB panel 300 may diced, sawn, and/or the like along a trajectory that cuts through the modifications 302 to form the at least one connection surface 272 of the at least one IPD component 200. In particular, the lines 304 may relate to a double cut with a thin saw blade.

In particular exemplary aspects, FIG. 27 shows a pattern for the saw blade. A thin saw blade may be used and the saw blade may have to make two passes on each of the streets (left and right side) in between the components. This method has additional advantage in that an arbitrary width for saw street can be chosen, thus making possible different possible radii for the drilled out corners. This can be done with the same (thin) saw blade.

Figure 28:
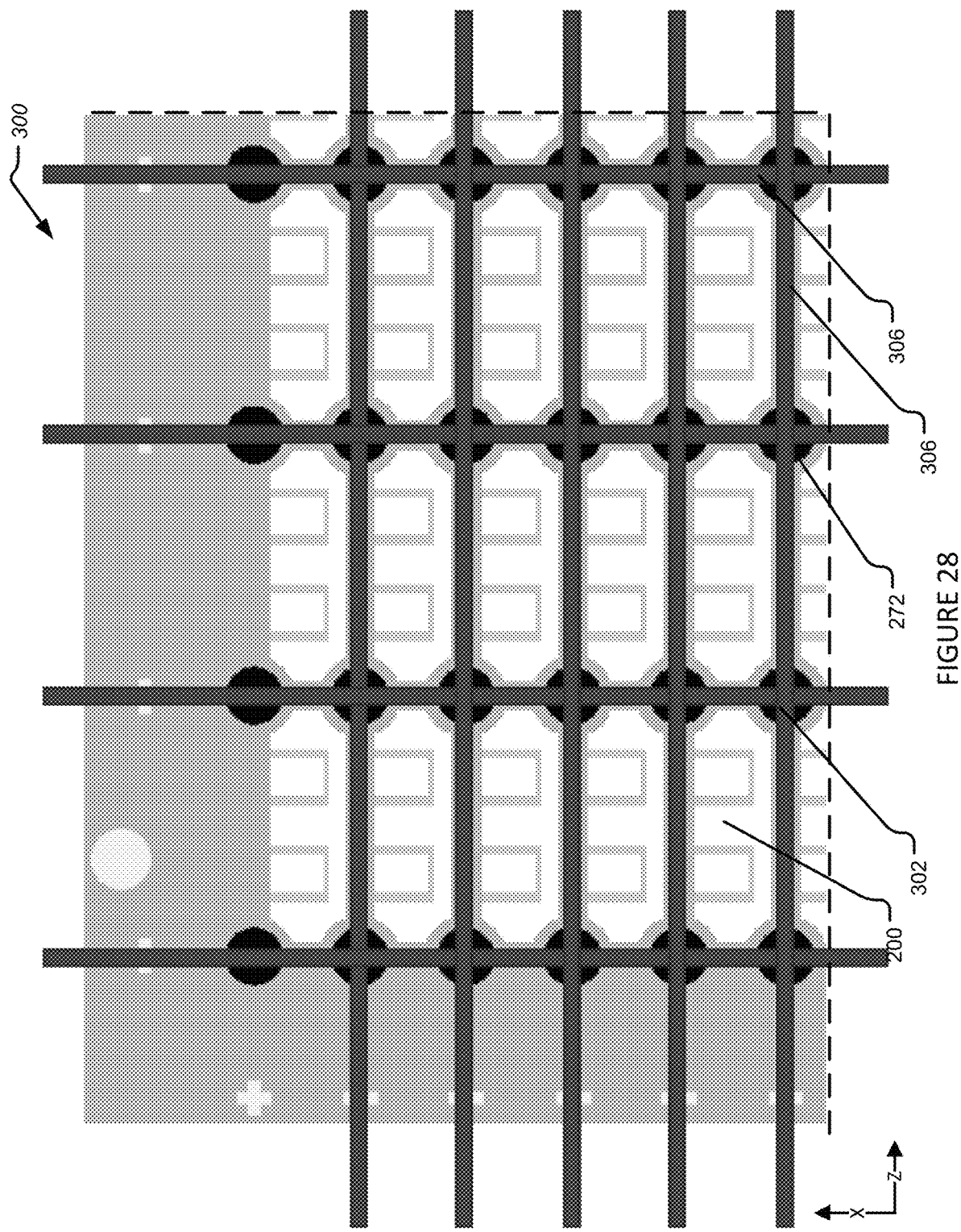
FIG. 28 illustrates a further intermediate configuration of a plurality of the integrated passive device (IPD) according to the disclosure.

FIG. 28 illustrates a further intermediate configuration of a plurality of the integrated passive device (IPD) according to the disclosure.

In particular, FIG. 28 illustrates lines 306 where the parent PCB panel 300 may diced, sawn, and/or the like along a trajectory that cuts through the modifications 302 to form the at least one connection surface 272 of the at least one IPD component 200. In particular, the lines 306 may relate to a single cut with a wide saw blade.

In particular exemplary aspects, FIG. 28 illustrates the PCB panel with one possible option for saw/dice pattern superimposed on the image. In this case, a wide saw blade is used, and the saw passes once in between the vertical and horizontal spaces between the PCB components. The saw blade is wide enough to chew out the PCB material in between each component, leaving only the minimum clearance needed from edge of the component to start of the metal traces.

Figure 29:
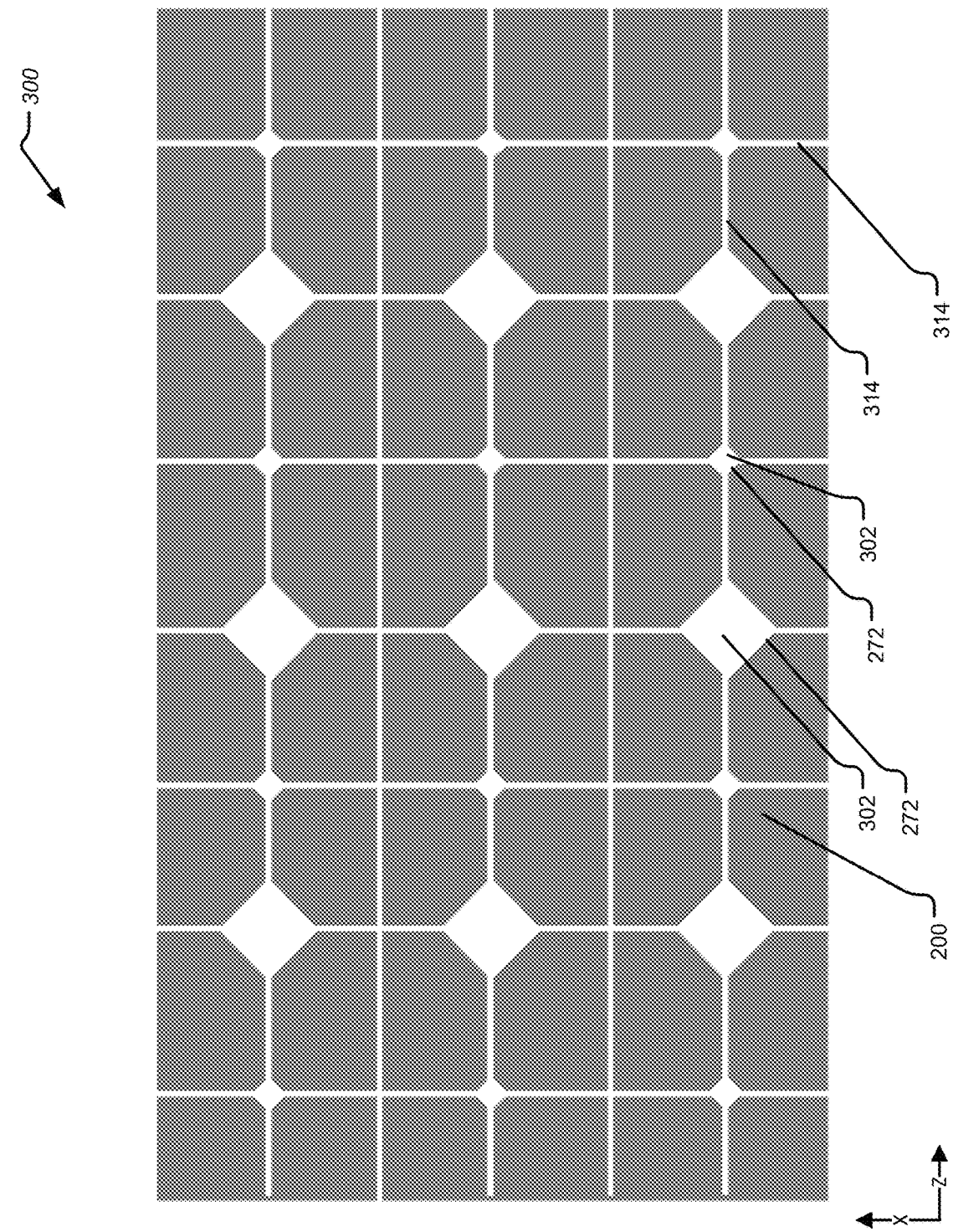
FIG. 29 illustrates a further intermediate configuration of a plurality of the integrated passive device (IPD) according to the disclosure.

FIG. 29 illustrates a further intermediate configuration of a plurality of the integrated passive device (IPD) according to the disclosure.

In particular, FIG. 29 illustrates lines 314 where the parent PCB panel 300 may diced, sawn, and/or the like along a trajectory that cuts through the modifications 302 to form the at least one connection surface 272 of the at least one IPD component 200.

In particular, the lines 314 where the parent PCB panel 300 may diced, sawn, and/or the like as illustrated in FIG. 29 may relate to the implementations of the at least one connection surface 272 illustrated in FIGS. 12, 13, 16, 18, 19, 20, and 22. In this regard, the at least one connection surface 272 may be implemented with a straight edge and a corresponding implementation of the modifications 302 may be a cut-out initially having a diamond shape in the parent PCB panel 300 as illustrated in FIG. 29. In particular aspects, the diamond shape may be formed with a small drill, a precise drill, a laser cut, a router, a saw, and/or the like. Alternatively, the diamond shape may be formed after separation of the at least one IPD component 200 from the parent PCB panel 300.

In particular aspects as illustrated in FIG. 29, alternate large size diamond-shaped cutouts and small sized diamond cutouts may be implemented. More specifically, alternate large size diamond-shaped cutouts and small sized diamond cutouts may be implemented on every other row of the at least one IPD component 200.

Figure 30:
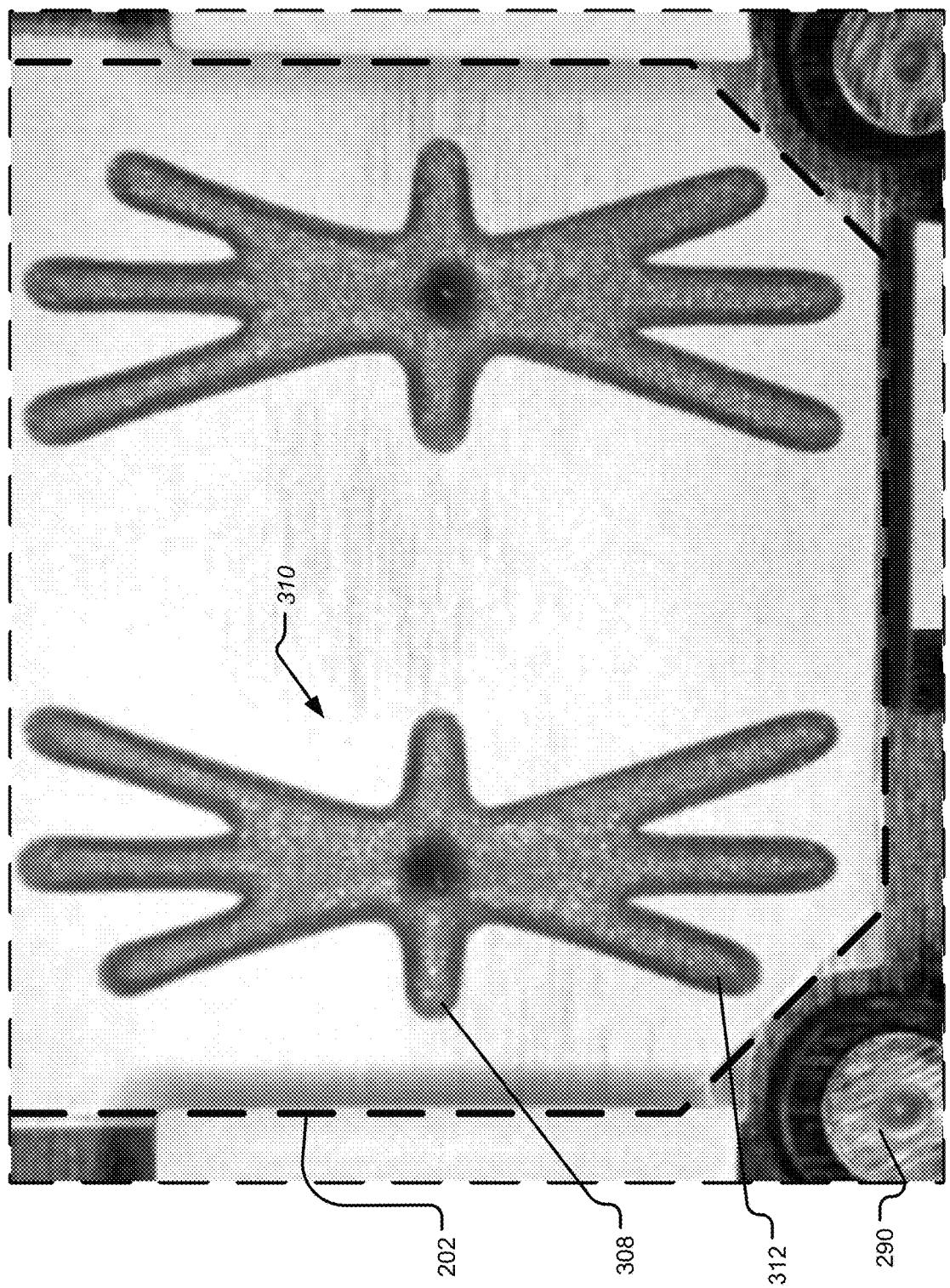
FIG. 30 illustrates a top view of an exemplary adhesive pattern according to the disclosure.

FIG. 30 illustrates a top view of an exemplary adhesive pattern according to the disclosure.

In particular, FIG. 30 illustrates an exemplary adhesive pattern 310 that may be applied to the support 102 of the package 100 for attachment of the at least one IPD component 200 to the support 102. In this regard, the at least one IPD component 200 may be attached to the support 102 with an appropriate die-attach material. However, the shape of the at least one IPD component 200, as described herein, requires modification to the adhesive pattern. Accordingly, FIG. 30 illustrates the exemplary adhesive pattern 310.

The exemplary adhesive pattern 310 as illustrated in FIG. 30 may have symmetry about the z-axis and asymmetry about the X axis as illustrated. Additionally, the exemplary adhesive pattern 310 may have a particular pattern, for example a cross shape pattern, a star shape pattern, and/or the like that may be configured to match with the irregular shape of the at least one IPD component 200. In particular, the exemplary adhesive pattern 310 may have multiple points 308 of varying lengths to provide uniform adhesive application to the support 102 in order to provide secure attachment of the at least one IPD component 200 (shown with dashed lines) to the support 102. In particular, the exemplary adhesive pattern 310 may limit attachment material interaction with the structural features of the package 100 as shown by a shortened point 312 of the exemplary adhesive pattern 310 adjacent the at least one structural feature 290. Accordingly, the exemplary adhesive pattern 310 may ensure attachment of the at least one IPD component 200 to the support 102, may limit attachment material interaction with the structural features of the package 100 such as the at least one structural feature 290, and may limit voids in the attachment material.

It is noted that a prior epoxy dispense pattern that would typically be used for attaching a rectangular shaped IPD component might go past the flange outline and risk contacting the rivet (circular studs at the corners of the package). In an extreme case, the epoxy can travel up the rivet pillar to the top. This can cause reliability concerns and also non-planar surface (on top of the mold) after molding is done. In particular aspects, FIG. 30 illustrates a newly modified epoxy dispense pattern for an IPD component to be placed on the RF device package. The spokes of the star (or cross) pattern in this case have different lengths and extensions so as to avoid getting too close to the chamfered corner of the flange, and getting too close to the rivets. This dispense pattern will spread out evenly underneath the irregular cut IPD component without epoxy flowing out onto the corner rivets. This dispense pattern avoids crossing over the flange or shorting out to the rivets.

Figure 31:
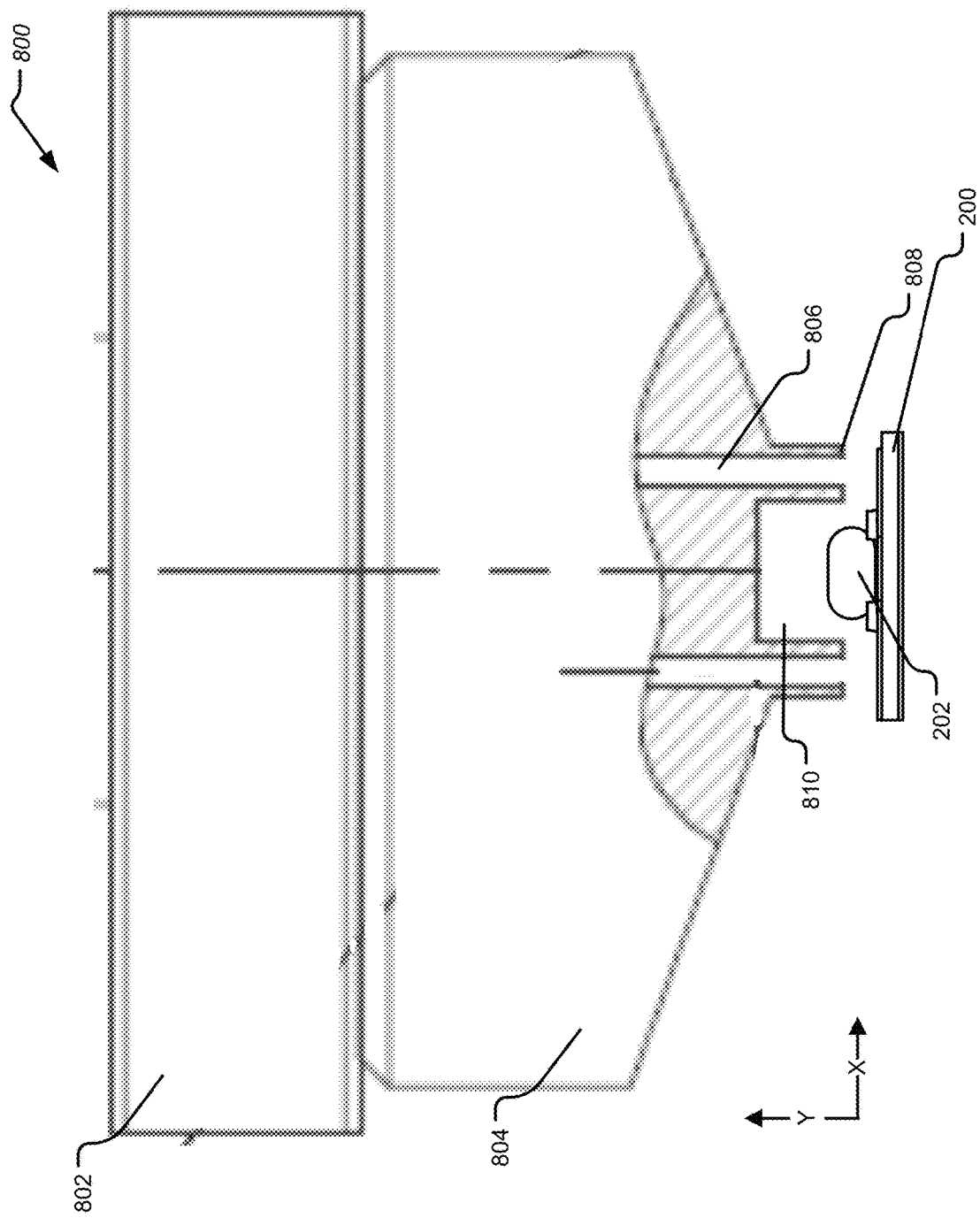
FIG. 31 illustrates a cross-sectional view of an exemplary pickup tool and an exemplary integrated passive device (IPD) according to aspects of the disclosure.

FIG. 31 illustrates a cross-sectional view of an exemplary pickup tool and an exemplary integrated passive device (IPD) according to aspects of the disclosure.

Figure 32:
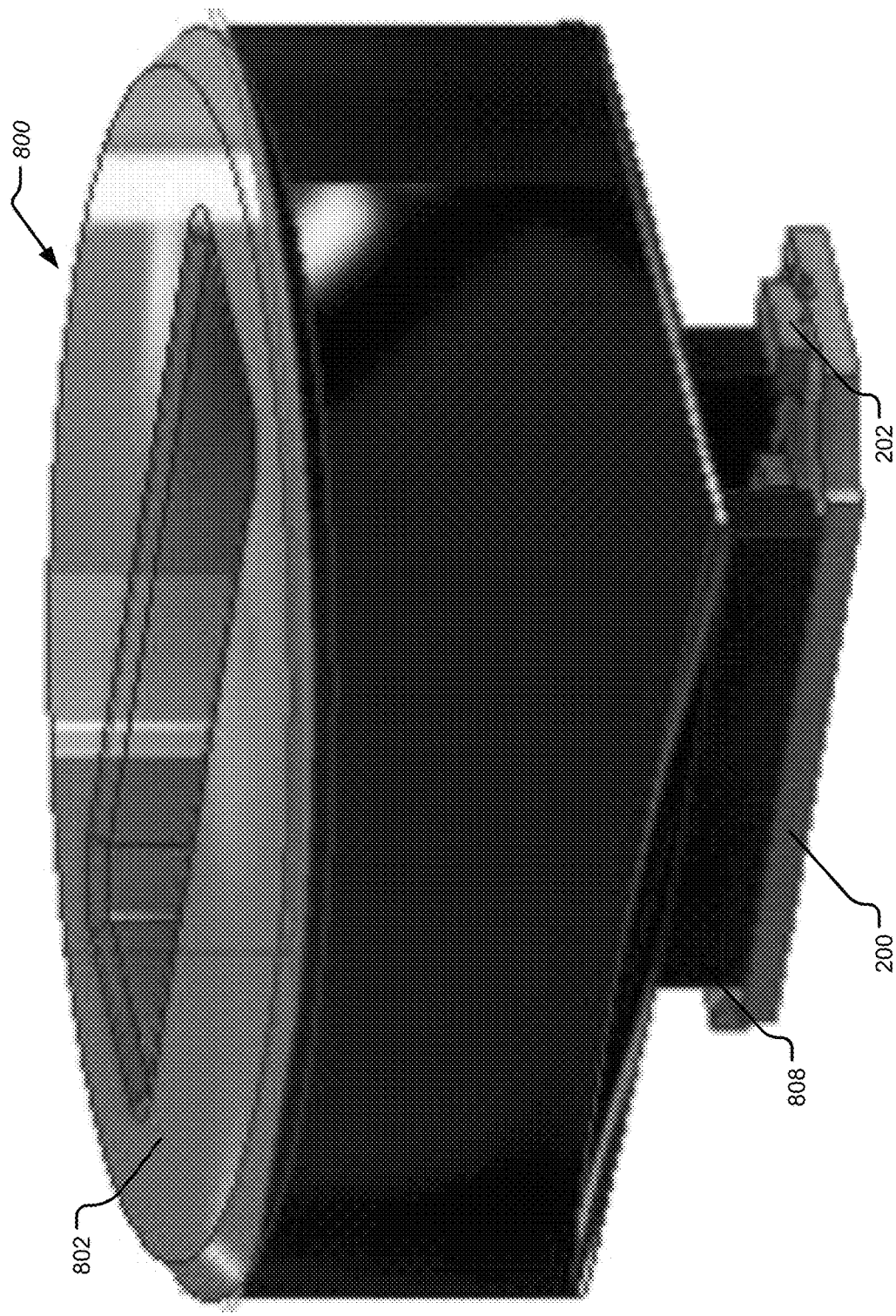
FIG. 32 illustrates a perspective view of an exemplary pickup tool and an exemplary integrated passive device (IPD) according to FIG. 31.

FIG. 32 illustrates a perspective view of an exemplary pickup tool and an exemplary integrated passive device (IPD) according to FIG. 31.

Figure 33:
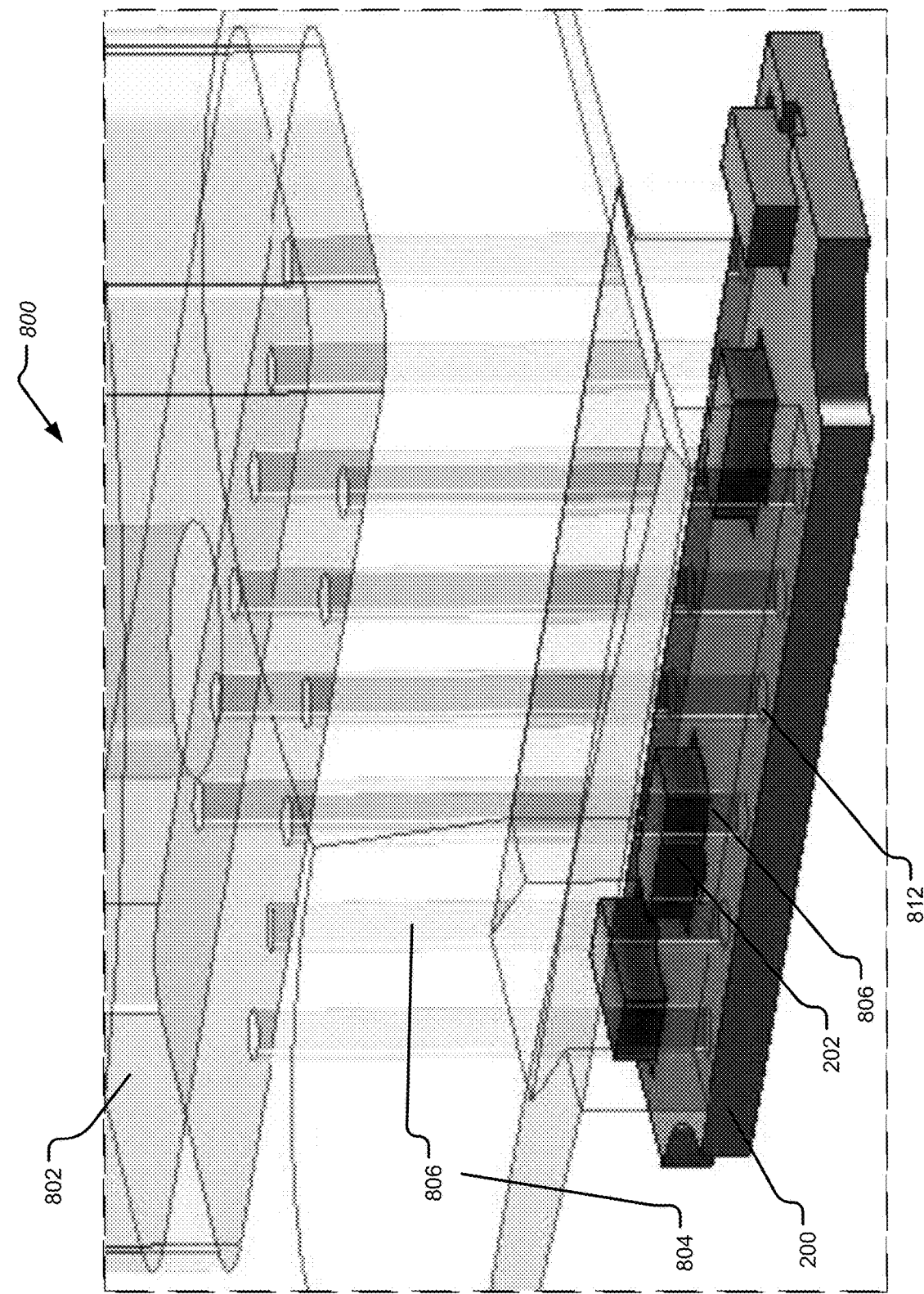
FIG. 33 illustrates a perspective transparent view of an exemplary pickup tool and an exemplary integrated passive device (IPD) according to FIG. 31.

FIG. 33 illustrates a perspective transparent view of an exemplary pickup tool and an exemplary integrated passive device (IPD) according to FIG. 31.

Figure 34:
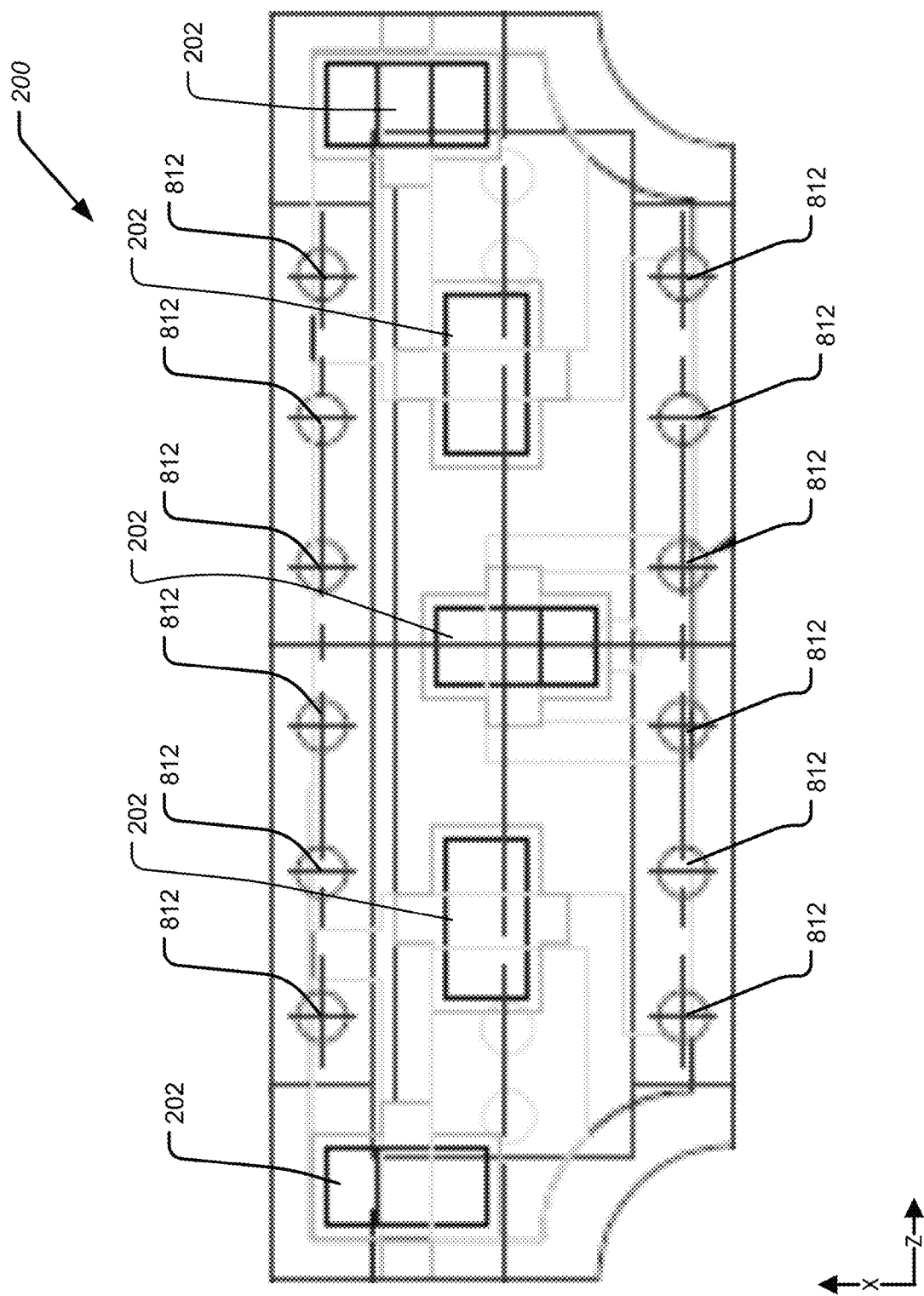
FIG. 34 illustrates a top view of an exemplary integrated passive device (IPD) with exemplary pickup locations.

FIG. 34 illustrates a top view of an exemplary integrated passive device (IPD) with exemplary pickup locations.

With reference to FIG. 31, FIG. 32, and FIG. 33, a pickup tool 800 is illustrated interacting with the at least one IPD component 200 that includes the at least one device 202. In particular, the pickup tool 800 may include a vacuum source 802 and a tool portion 804. The tool portion 804 may include a plurality of vacuum channels 806 and engagement portions 808. The vacuum source 802 may generate a vacuum and may be pneumatically connected to the plurality of vacuum channels 806. The plurality of vacuum channels 806 may extend into the engagement portions 808. The engagement portions 808 may arranged to engage the at least one IPD component 200. In particular, the engagement portions 808 may be structured and/or configured to attach to nonactive areas of the at least one IPD component 200. Additionally, the engagement portions 808 may be structured and/or configured with a receiving portion 810. The receiving portion may be structured and/or configured to allow portions of the at least one IPD component 200, such as the at least one device 202, to be received between the engagement portions 808.

In particular, the pickup tool 800 may be configured to enable proper assembly of the package 100 by being configured to interact, move, engage, and/or the like the at least one IPD component 200 having a modified shape as described herein. In particular, the pickup tool 800 may be configured and/or designed for the irregular shaped implementations of the at least one IPD component 200 in order to be able to pick and place the at least one IPD component 200 correctly in the package 100. In this regard, an outline and planarity of the pickup tool 800, the tool portion 804, the engagement portions 808, the receiving portion 810, and/or the like may be structured and/or configured to maintain a sufficient vacuum seal during pickup of the at least one IPD component 200. Additionally, the pickup tool 800 may be configured to maintain a sufficient vacuum seal during pickup of the at least one IPD component 200 based on an arrangement of the at least one device 202 that may be arranged on top of the at least one IPD component 200.

With reference to FIG. 34, an exemplary implementation of the at least one IPD component 200 is illustrated with an exemplary arrangement of the at least one device 202 thereon. Additionally, FIG. 34 illustrates exemplary pickup locations 812. The exemplary pickup locations 812 may be arranged on the upper surface 222 of the at least one IPD component 200 in locations that are spaced from the at least one device 202. In particular aspects, exemplary pickup locations 812 being arranged on the upper surface 222 of the at least one IPD component 200 in non-active areas of the at least one IPD component 200. Accordingly, the pickup tool 800 in conjunction with the tool portion 804, the engagement portions 808, the receiving portion 810, the exemplary pickup locations 812, and/or the like may be structured and/or configured to maintain a sufficient vacuum seal during pickup of the at least one IPD component 200 based on an arrangement of the at least one device 202 that may be arranged on top of the at least one IPD component 200.

In particular aspects, FIG. 31, FIG. 32, and FIG. 33 illustrates an example design of a pickup tool for an IPD component. The pickup tool is designed to make contact with the PCB carrier (or other ceramic substrate) whilst leaving sufficient clearance above the SMD components. Small vacuum holes in lips of the pick-up tool transfer the vacuum suction directly to the substrate. The lips of the pickup tool extend across the IPD, but do not overlap (or extend into) the dilled-corner cutouts, this way irregular cut shapes can still be picked up without losing vacuum suction. Different outlines/shapes of pickup tools can be designed to work best with each particular irregular shaped IPDs.

Figure 35:
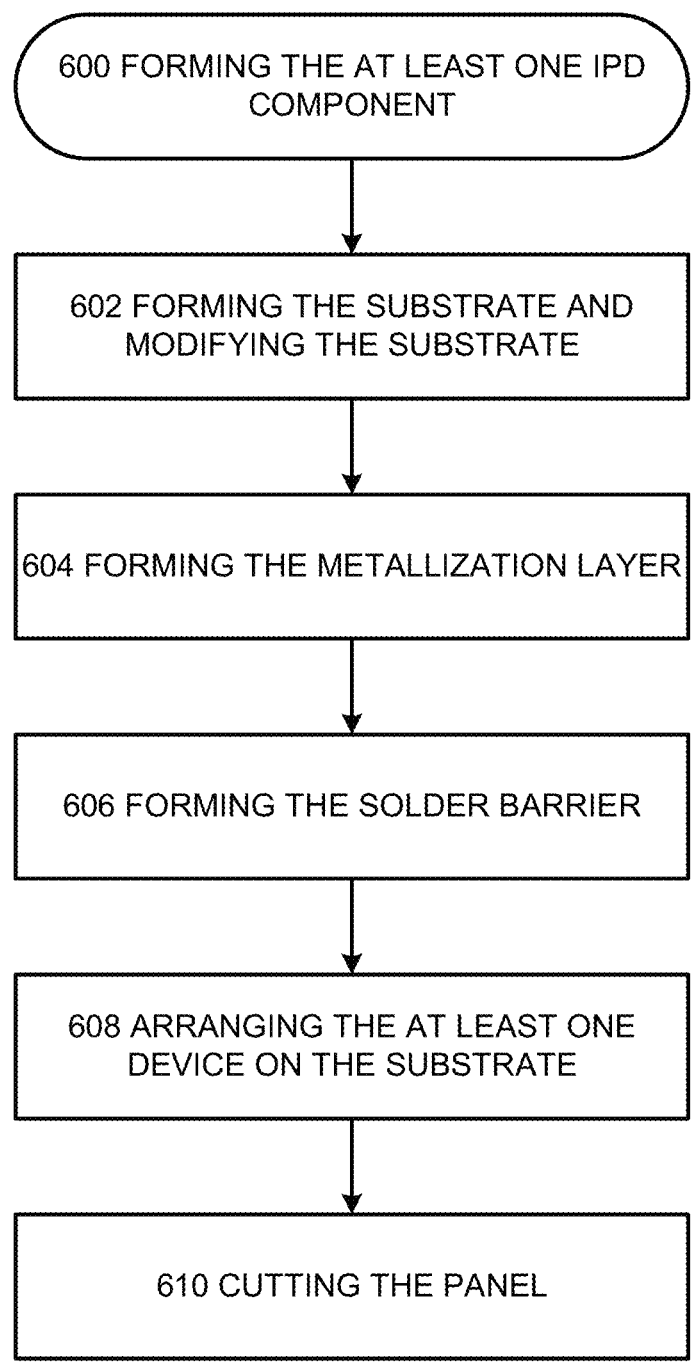
FIG. 35 shows a process of making a IPD component according to the disclosure.

FIG. 35 shows a process of making a IPD component according to the disclosure.

The process illustrated in FIG. 35 and described below may include any one or more other features, components, arrangements, and/or the like as described herein. In particular, FIG. 35 illustrates a process of forming an IPD component 600 that relates to the IPD component 200 as described herein. It should be noted that the aspects of the process of forming a IPD component 600 may be performed in a different order consistent with the aspects described herein. Additionally, it should be noted that portions of the process of forming a IPD component 600 may be performed in a different order consistent with the aspects described herein. Moreover, the process of forming a IPD component 600 may be modified to have more or fewer processes consistent with the various aspects disclosed herein.

Initially, the process of forming a IPD component 600 may include a process of forming the substrate 602. More specifically, the substrate 204 may be constructed, configured, and/or arranged as described herein. Additionally, the process of forming the substrate 602 may further include formation of the modifications 302 in the parent PCB panel 300. In this regard, the irregular shape or modified shape of the at least one IPD component 200 may be implemented utilizing a number of different approaches, such as any one or more of a drill hole, a combination of drill holes, a combination of drill holes of different sizes, a saw pattern, a dice pattern, and/or the like on the parent PCB panel 300 as described herein. In this regard, the irregular shape or modified shape of the at least one IPD component 200 may be implemented in any aspects of the disclosure as described herein utilizing a number of different tools including one or more of a drill, a saw, a dicing device, a laser cutting device, a router device, a trimming device, a cutting device, a milling device, a PCB cutting device, and/or the like. Additionally, the irregular shape or modified shape of the at least one IPD component 200 may be implemented in any aspects of the disclosure as described herein utilizing a number of different processes including one or more of a drilling process, a sawing process, a dicing process, a laser cutting process, a routing process, a trimming process, a cutting process, a milling process, a PCB cutting process, and/or the like. As illustrated in FIG. 26, the modifications 302 to the parent PCB panel 300 in order to form the at least one connection surface 272 may include appropriate sized drill holes, routed openings, and/or the like.

Further, the process of forming a IPD component 600 may include forming the metallization layer 604. More specifically, the metallization layer 240 may be constructed, configured, and/or arranged as described herein on at least a portion of the substrate 204. The process of forming the metallization layer 604 may include utilizing one or more manufacturing techniques including print screening for solder paste, print screening for epoxy, silk screen printing processes, photoengraving processes, print onto transparent film processes, photo mask processes in combination with etching processes, photo-sensitized board processes, laser resist ablation processes, milling processes, laser etching processes, direct metal printing processes, and/or like processes.

Additionally, the forming the metallization layer 604 may include forming the interconnect pad. More specifically, the plurality interconnect pads 206 may be constructed, configured, and/or arranged as described herein on the substrate 204. The process of forming the interconnect pad may include utilizing one or more manufacturing techniques including using print screening for solder past, print screening for epoxy, silk screen printing processes, photoengraving processes, print onto transparent film processes, photo mask processes in combination with etching processes, photosensitized board processes, laser resist ablation processes, milling processes, laser etching processes, direct metal printing processes, and/or like processes.

Additionally, the process of forming a IPD component 600 may include forming the solder barrier 606. In one or more aspects, the solder barrier 216 may be formed in select regions on the upper surface 222, the plurality interconnect pads 206, and/or the like of the at least one IPD component 200. In further aspects, the solder barrier 216 may be arranged over the entire surface of the at least one IPD component 200 and selectively etched and/or otherwise removed from select locations on the upper surface of the at least one IPD component 200.

Additionally, the process of forming a IPD component 600 may include arranging the at least one device on the substrate 608. More specifically, the at least one device 202 may be constructed, configured, and/or arranged as described herein on the substrate 204. In one aspect, the at least one device 202 may be arranged as described herein on the substrate 204 with an adhesive, soldering, sintering, eutectic bonding, ultrasonically welding, and/or the like as described herein.

The arranging the at least one device on the substrate 608 may include implementing a pick and place assembly to place the at least one device 202 on the at least one IPD component 200 of the parent PCB panel 300. The process of forming a IPD component 600 may include implementing a reflow process with the panel. In one aspect, the process of forming a IPD component 600 may include processing utilizing a surface mount technology (SMT) line. A surface mount technology (SMT) line may utilize numerous processes including solder printing, component placement, solder reflow, and/or the like.

The process of forming a IPD component 600 may include cutting the panel 610. For example, the cutting the panel 610 may be implemented utilizing cutting equipment such as wafer sawing equipment, circuit board sawing equipment, package sawing equipment, and/or the like to singulate the at least one IPD component 200 from the parent PCB panel 300 as described herein. This may have the advantage that the at least one IPD component 200 may be arranged on dicing tape on a ring frame, which can be directly loaded to the Die Attach equipment for subsequent assembly into the package 100.

In one aspect, the cutting the panel 610 may include with reference to FIG. 27 cutting the parent PCB panel 300 along the lines 304 with a trajectory that cuts through the modifications 302 to form the at least one connection surface 272 of the at least one IPD component 200. In particular, the lines 304 may relate to a double cut with a thin saw blade.

In one aspect, the cutting the panel 610 may include with reference to FIG. 28 cutting the parent PCB panel 300 along the lines 306 with a trajectory that cuts through the modifications 302 to form the at least one connection surface 272 of the at least one IPD component 200. In particular, the lines 306 may relate to a single cut with a wide saw blade.

Additional processes may include a flux cleaning step to remove all flux residues, wire bonding, dicing, mounting to dicing tape, dicing, either mechanical sawing or laser cutting, or a combination of both, and component testing. Additionally, the at least one IPD component 200 may be arranged on dicing tape that may then serve as input for the Die Attach equipment.

Figure 36:
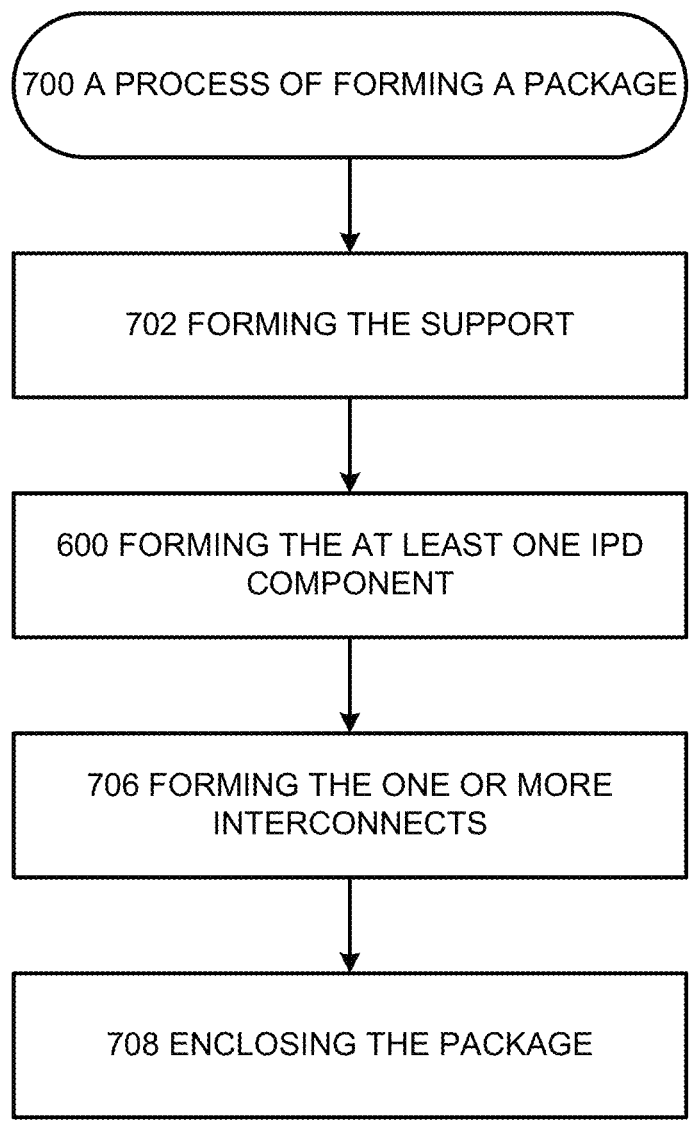
FIG. 36 shows a process of making a package according to the disclosure.

FIG. 36 shows a process of making a package according to the disclosure.

The process illustrated in FIG. 36 and described below may include any one or more other features, components, arrangements, and/or the like as described herein. In particular, FIG. 36 illustrates a process of forming a package 700 that relates to the package 100 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support 102 may be constructed, configured, and/or arranged as described herein. In one aspect, the process of forming the support 702 may include forming the support 102 as a support, a surface, a package support, a package surface, a package support surface, a flange, a heat sink, a common source heat sink, and/or the like.

The process of forming a package 700 may include a process of forming the IPD component 600. More specifically, the at least one IPD component 200 may be constructed, configured, and/or arranged as described herein with reference to FIG. 35 and the associated description thereof. Thereafter, the process of forming the IPD component 600 may further include attaching the at least one IPD component 200 to the support 102. In this regard, the at least one IPD component 200 and/or the substrate 204 may be mounted on the upper surface of the support 102 by an adhesive, soldering, sintering, eutectic bonding, ultrasonically welding, and/or the like as described herein.

The process of forming a package 700 may include a process of forming the one or more interconnects 706. More specifically, the one or more interconnects 104 may be constructed, configured, and/or arranged as described herein. In one aspect, the process of forming the one or more interconnects 706 may include forming the one or more interconnects 104 by forming one or more wires, leads, vias, edge platings, circuit traces, tracks, and/or the like. In one aspect, the process of forming the one or more interconnects 706 may include connecting the one or more interconnects 706 by an adhesive, soldering, sintering, eutectic bonding, ultrasonic welding, a clip component, and/or the like as described herein.

The process of forming a package 700 may include a process of enclosing the package 708. More specifically, the package 100 may be constructed, configured, and/or arranged as described herein. In one aspect, the process of enclosing the package 708 may include forming an open cavity configuration, an over-mold configuration, or the like.

Accordingly, the disclosure has provided a detailed implementation of the at least one IPD component 200 and/or the substrate 204 that may have a shape that may be configured to increase efficient use of space within the package 100, as well as improve performance, reliability, and/or the like. Additionally, the disclosure has provided a detailed implementation of the package 100 that may include the at least one IPD component 200 and/or the substrate 204 that may have a shape that may be configured to increase efficient use of space within the package 100, as well as improve performance, reliability, and/or the like.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a conductive mass of material by heat and/or pressure. The sintering process may operate without melting the material to the point of liquefaction. The sintering process may include sintering of metallic nano or hybrid powders in pastes or epoxies. The sintering process may include sintering in a vacuum. The sintering process may include sintering with the use of a protective gas.

The eutectic bonding of the disclosure may utilize a eutectic soldering process that may form a eutectic system. The eutectic system may be used between surfaces to be connected. The eutectic bonding may utilize metals that may be alloys and/or intermetallics that transition from solid to liquid state, or from liquid to solid state, at a specific composition and temperature. The eutectic alloys may be deposited by sputtering, evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

The package 100 may be implemented in any number of different applications. In this regard, the package 100 may be implemented in applications implementing high video bandwidth power amplifier transistors, a single path radio frequency power transistor, a single stage radio frequency power transistor, a multipath radio frequency power transistor, a Doherty configuration a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The package 100 may be implemented as a power package. The package 100 may be implemented as a power package and may implement applications and components as described herein.

The package 100 may be implemented as a radio frequency package. The package 100 may be implemented as a radio frequency package and may implement applications and components as described herein. The package 100 implemented as a radio frequency package may include, connect, support, or the like a transmitter, transmitter functions, a receiver, receiver functions, a transceiver, transceiver functions, and the like. The package 100 implemented as a radio frequency package may be configured to, may support, or the like transmitting a radio wave and modulating that wave to carry data with allowable transmitter power output, harmonics, and/or band edge requirements. The package 100 implemented as a radio frequency package may be configured to, may support, or the like receiving a radio wave and demodulating the radio wave. The package 100 implemented as a radio frequency package may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

The at least one IPD component 200 may be an active device, a passive device, an integrated passive device (IPD), a transistor device, or the like. The at least one IPD component 200 may include any electrical component for any application. In this regard, the at least one IPD component 200 may be high video bandwidth power amplifier transistors, a single path radio frequency power transistor, a single stage radio frequency power transistor, a multipath radio frequency power transistor, a multistage radio frequency power transistor, a GaN based radio frequency power amplifier module, a laterally-diffused metal-oxide semiconductor (LDMOS) device, a LDMOS radio frequency power amplifier module, a radio frequency power device, an ultra-wideband device, a GaN based device, a Metal Semiconductor Field-Effect Transistor (MESFET), a Metal Oxide Field Effect Transistor (MOSFET), a Junction Field Effect Transistor (JFET), a Bipolar Junction Transistor (BJT), an Insulated Gate Bipolar Transistor (IGBT), a high-electron-mobility transistor (HEMT), a Wide Band Gap (WBG) semiconductor, a power module, a gate driver, a component such as a General-Purpose Broadband component, a Telecom component, a L-Band component, a S-Band component, a X-Band component, a C-Band component, a Ku-Band component, a Satellite Communications component, and/or the like. The at least one IPD component 200 implemented as a radio frequency device may be configured to, may support, or the like transmitting a radio wave and modulating that wave to carry data with allowable transmitter power output, harmonics, and/or band edge requirements. The at least one IPD component 200 implemented as a radio frequency device may be configured to, may support, or the like receiving a radio wave and demodulating the radio wave. The at least one IPD component 200 implemented as a radio frequency device may be configured to, may support, or the like transmitting a radio wave and modulating that wave to carry data with allowable transmitter power output, harmonics, and/or band edge requirements; and may be configured to, may support, or the like receiving a radio wave and demodulating the radio wave.

In one aspect, the at least one IPD component 200 may be a high-electron mobility transistor (HEMT). In this regard, the HEMT may be Group III-Nitride based devices and such HEMTs may be implemented for high power Radio Frequency (RF) applications, for low frequency high power switching applications, as well as other applications. For example, the material properties of Group III-nitrides, such as GaN and its alloys, enable achievement of high voltage and high current, along with high RF gain and linearity for RF applications. A typical Group III-nitride HEMT relies on the formation of a two-dimensional electron gas (2DEG) at the interface between a higher band gap Group-III nitride (e.g., AlGaN) barrier layer and a lower band gap Group-III nitride material (e.g., GaN) buffer layer, where the smaller band gap material has a higher electron affinity. The 2DEG is an accumulation layer in the smaller band gap material and can contain a high electron concentration and high electron mobility.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An RF transistor package, comprising,
a metal submount;
a transistor die mounted on said metal submount;
a surface mount IPD component comprising a dielectric substrate;
the dielectric substrate mounted on said metal submount; and
the dielectric substrate comprising a nonrectangular shape.

2. The RF transistor package according to claim 1 wherein the dielectric substrate comprises a plurality of linear sides and a connection surface between at least two of the plurality of linear sides.

3. The RF transistor package according to claim 2 wherein the connection surface is defined by a cut out portion of the dielectric substrate.

4. The RF transistor package according to claim 2 wherein the connection surface comprises a curve shaped surface.

5. The RF transistor package according to claim 2 wherein the connection surface comprises a concave shaped surface.

6. The RF transistor package according to claim 2 wherein the connection surface comprises a partial circle shaped surface.

7. The RF transistor package according to claim 1 wherein the transistor die comprises an LDMOS transistor die.

8. The RF transistor package according to claim 1 wherein the transistor die comprises at least one GaN based HEMT.

9. The RF transistor package according to claim 1 wherein the surface mount IPD component comprises a surface mount device mounted to a top surface of said surface mount IPD component.

10. The RF transistor package according to claim 9 further comprising at least one wire bond configured to electrically couple the surface mount device to one or more metal contacts.

11. The RF transistor package according to claim 9 wherein the dielectric substrate comprises at least one via configured to make an electrical connection between the surface mount device and the metal submount.

12. The RF transistor package according to claim 1 further comprising:
at least one surface mount device comprising a first terminal and a second terminal, said first terminal of said surface mount device mounted to a first pad of the surface mount IPD component and said second terminal mounted to a second pad of the surface mount IPD component,
wherein the surface mount device comprises a ceramic capacitor.

13. The RF transistor package according to claim 2 wherein the connection surface comprises a linear surface.

14. The RF transistor package according to claim 1 wherein the RF transistor package comprises a plurality of the transistor die.

15. The RF transistor package according to claim 14 wherein the plurality of the transistor die are configured in a Doherty configuration.

16. The RF transistor package according to claim 9 wherein the dielectric substrate comprises at least one via configured to make an electrical connection between the surface mount device and a source of the transistor die.

17. The RF transistor package according to claim 1 further comprising:
at least one surface mount device comprising a first terminal and a second terminal, said first terminal of said surface mount device mounted to a first pad of the surface mount IPD component and said second terminal mounted to a second pad of the surface mount IPD component;
at least one of the first terminal and the second terminal being configured to be isolated from the metal submount by said dielectric substrate; and
at least one wire bond bonded to the at least one of the first pad and the second pad.

18. The RF transistor package according to claim 17 wherein the at least one wire bond is configured to electrically couple the surface mount device to the transistor die.

19. The RF transistor package according to claim 17 wherein the surface mount device comprises a resistor.

20. A device, comprising:
a surface mount IPD component comprising a dielectric substrate;
at least one surface mount device mounted to said surface mount IPD component; and
the dielectric substrate comprising a nonrectangular shape,
wherein the surface mount IPD component is configured to be mounted to a metal submount of a transistor package.

21. The device according to claim 20 wherein the dielectric substrate comprises a plurality of linear sides and a connection surface between at least two of the plurality of linear sides.

22. The device according to claim 21 wherein the connection surface is defined by a cut out portion of the dielectric substrate.

23. The device according to claim 21 wherein the connection surface comprises a curve shaped surface.

24. The device according to claim 21 wherein the connection surface comprises a concave shaped surface.

25. The device according to claim 21 wherein the connection surface comprises a partial circle shaped surface.

26. The device according to claim 21 wherein the connection surface comprises a linear surface.

27. The device according to claim 20 wherein the surface mount IPD component is configured to be implemented in a transistor package that comprises a transistor die.

28. The device according to claim 20 wherein the surface mount IPD component is configured to be implemented in an RF transistor package that comprises a GaN based HEMT.

29. The device according to claim 20 wherein the surface mount IPD component is configured to be implemented in an RF transistor package that comprises an LDMOS transistor die.

30. The device according to claim 20 wherein the surface mount IPD component is configured to be implemented in an RF transistor package that comprises a plurality of transistors.

31. The device according to claim 30 wherein the plurality of transistors are configured in a Doherty configuration.

32. The device according to claim 20 wherein the surface mount IPD component comprises a plurality of surface mount devices mounted to a top surface of said surface mount IPD component.

33. The device according to claim 20 wherein the dielectric substrate comprises at least one via configured to make an electrical connection between the surface mount device and the metal submount.

34. The device according to claim 20 wherein the dielectric substrate comprises at least one via configured to make an electrical connection between the surface mount device and a source of a transistor die.

35. The device according to claim 20 wherein the surface mount device comprises a ceramic capacitor.

36. The device according to claim 20 wherein the surface mount device comprises a resistor.

37. The device according to claim 20 wherein at least one wire bond is configured to electrically couple the surface mount device to a die implemented in an RF transistor package.

38. The device according to claim 20 wherein at least one wire bond is configured to electrically couple the surface mount device to one or more metal contacts.

39. A process for implementing an RF transistor package, comprising,
providing a metal submount;
mounting a transistor die on said metal submount;
configuring a surface mount IPD component with a dielectric substrate;
configuring the dielectric substrate with a nonrectangular shape; and
mounting the dielectric substrate to said metal submount.

40. The process according to claim 39 further comprising configuring the dielectric substrate with a plurality of linear sides and a connection surface between at least two of the plurality of linear sides.

41. The process according to claim 40 further comprising configuring the connection surface by cutting out a portion of the dielectric substrate.

42. The process according to claim 40 further comprising configuring the connection surface with a curve shaped surface.

43. The process according to claim 40 further comprising configuring the connection surface with a partial circle shaped surface.

44. The process according to claim 40 further comprising configuring the connection surface with a concave shaped surface.

45. The process according to claim 40 further comprising configuring the connection surface with a linear surface.

46. The process for implementing an RF transistor package according to claim 21 further comprising:
implementing the surface mount IPD component with a plurality of surface mount devices; and
mounting the plurality of surface mount devices to a top surface of said surface mount IPD component.

47. The process for implementing an RF transistor package according to claim 46 further comprising configuring the dielectric substrate to arrange at least one via to make an electrical connection between at least one of the plurality of surface mount devices and the metal submount.

48. The process for implementing an RF transistor package according to claim 46 further comprising configuring at least one wire bond to electrically couple at least one of the plurality of surface mount devices to the transistor die.

49. The process for implementing an RF transistor package according to claim 46 further comprising configuring the dielectric substrate to arrange at least one via configured to make an electrical connection between at least one of the plurality of surface mount devices and a source of the transistor die.

50. The process for implementing an RF transistor package according to claim 46 further comprising configuring a at least one wire bond to electrically couple at least one of the plurality of surface mount devices to one or more metal contacts.

51. The process for implementing an RF transistor package according to claim 46 wherein at least one of the plurality of surface mount devices comprises a ceramic capacitor.

52. The process for implementing an RF transistor package according to claim 46 wherein at least one of the plurality of surface mount devices comprises a resistor.

53. The process for implementing an RF transistor package according to claim 39 wherein the transistor die comprises an LDMOS transistor die.

54. The process for implementing an RF transistor package according to claim 39 wherein the transistor die comprises a GaN based HEMT.

55. The process for implementing an RF transistor package according to claim 39 further comprising implementing a plurality the transistor die.

56. The process for implementing an RF transistor package according to claim 55 further comprising implementing the plurality of the transistor die in a Doherty configuration.

* * * * *